US012676110B2

(12) United States Patent
Cao et al.

(10) Patent No.: US 12,676,110 B2
(45) Date of Patent: Jul. 7, 2026

(54) PIXEL DRIVING CIRCUIT, PIXEL DRIVING METHOD AND DISPLAY DEVICE

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Xilei Cao, Beijing (CN); Benlian Wang, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 349 days.

(21) Appl. No.: 18/548,734

(22) PCT Filed: Jul. 12, 2022

(86) PCT No.: PCT/CN2022/105232
§ 371 (c)(1),
(2) Date: Sep. 1, 2023

(87) PCT Pub. No.: WO2023/005660
PCT Pub. Date: Feb. 2, 2023

(65) Prior Publication Data
US 2024/0169905 A1    May 23, 2024

(30) Foreign Application Priority Data

Jul. 30, 2021 (WO) ................ PCT/CN2021/109890
Aug. 5, 2021 (CN) .......................... 202110897319.9

(51) Int. Cl.
*G09G 3/3233* (2016.01)
*G09G 3/3225* (2016.01)
(Continued)

(52) U.S. Cl.
CPC ......... *G09G 3/3233* (2013.01); *G09G 3/3225* (2013.01); *G09G 3/3266* (2013.01);
(Continued)

(58) Field of Classification Search
CPC .. G09G 3/3233; G09G 3/3225; G09G 3/3266; G09G 3/3275; G09G 3/3291;
(Continued)

(56) References Cited

U.S. PATENT DOCUMENTS 10,388,239 B2    8/2019  Lin et al.
10,395,589 B1    8/2019  Vahid Far et al.
(Continued)

FOREIGN PATENT DOCUMENTS

CN    102467876 A    5/2012
CN    103778889 A    5/2014
(Continued)

OTHER PUBLICATIONS

Non-Final Office Action for U.S. Appl. No. 18/270,094 dated Jun. 17, 2025. 24 pages.
(Continued)

*Primary Examiner* — Matthew A Eason
*Assistant Examiner* — Chayce R Bibbee
(74) *Attorney, Agent, or Firm* — BROOKS KUSHMAN P.C.

(57) ABSTRACT

A pixel driving circuit, a pixel driving method and a display device are provided. The pixel driving circuit is used for driving a light emitting element, the pixel driving circuit includes a driving circuit and a reset circuit; the reset circuit is electrically connected to a first terminal of the driving circuit or a second terminal of the driving circuit, and is configured to initialize a potential of the first terminal of the driving circuit or a potential of the second terminal of the driving circuit in an initialization phase; the driving circuit
(Continued)

is configured to control connection between the first terminal of the driving circuit and the second terminal of the driving circuit under the control of a potential of a control terminal of the driving circuit.

17 Claims, 37 Drawing Sheets

(51) Int. Cl.

| | |
|---|---|
| *G09G 3/3266* | (2016.01) |
| *G09G 3/3275* | (2016.01) |
| *G09G 3/3291* | (2016.01) |
| *H10K 59/121* | (2023.01) |
| *H10K 59/126* | (2023.01) |

(52) U.S. Cl.

CPC ......... *G09G 3/3275* (2013.01); *G09G 3/3291* (2013.01); *H10K 59/1213* (2023.02); *G09G 2300/0426* (2013.01); *G09G 2300/0452* (2013.01); *G09G 2300/0819* (2013.01); *G09G 2300/0842* (2013.01); *G09G 2300/0852* (2013.01); *G09G 2300/0861* (2013.01); *G09G 2310/0251* (2013.01); *G09G 2310/061* (2013.01); *G09G 2310/08* (2013.01); *G09G 2320/0233* (2013.01); *G09G 2320/0247* (2013.01); *G09G 2320/045* (2013.01); *G09G 2330/021* (2013.01); *H10K 59/1216* (2023.02); *H10K 59/126* (2023.02)

(58) Field of Classification Search

CPC ... G09G 2300/0426; G09G 2300/0452; G09G 2300/0819; G09G 2300/0842; G09G 2300/0852; G09G 2300/0861; G09G 2310/0251; G09G 2310/061; G09G 2310/08; G09G 2320/0233; G09G 2320/0247; G09G 2320/045; G09G 2330/021; G09G 3/3208; G09G 2310/0264; H10K 59/1213; H10K 59/1216; H10K 59/126

See application file for complete search history.

(56) References Cited

U.S. PATENT DOCUMENTS

| | | | |
|---|---|---|---|
| 2007/0132694 A1 | 6/2007 | Uchino et al. | |
| 2008/0150846 A1 | 6/2008 | Chung | |
| 2009/0231308 A1 | 9/2009 | Numao | |
| 2009/0289558 A1 | 11/2009 | Oku | |
| 2009/0289876 A1 | 11/2009 | Chun | |
| 2012/0105410 A1 | 5/2012 | Choi | |
| 2012/0147060 A1 | 6/2012 | Jeong | |
| 2013/0002632 A1 | 1/2013 | Choi | |
| 2015/0077412 A1* | 3/2015 | Nakamura | G09G 3/2007 |
| | | | 345/212 |
| 2015/0154906 A1 | 6/2015 | Chung | |
| 2015/0371587 A1 | 12/2015 | Chen et al. | |
| 2017/0124941 A1 | 5/2017 | Na et al. | |
| 2017/0193901 A1 | 7/2017 | Wang et al. | |
| 2018/0006099 A1 | 1/2018 | Ka et al. | |
| 2018/0047337 A1 | 2/2018 | Zhu et al. | |
| 2018/0130410 A1 | 5/2018 | Gao et al. | |
| 2018/0158407 A1 | 6/2018 | Chai et al. | |
| 2018/0301092 A1 | 10/2018 | Ma | |
| 2019/0057646 A1 | 2/2019 | Lin et al. | |
| 2019/0058029 A1 | 2/2019 | Woo et al. | |
| 2019/0228706 A1 | 7/2019 | Umeda et al. | |
| 2020/0142525 A1 | 5/2020 | Han et al. | |
| 2020/0160787 A1 | 5/2020 | Wang et al. | |
| 2020/0160788 A1 | 5/2020 | Son | |
| 2020/0184893 A1 | 6/2020 | Dong | |
| 2020/0226978 A1 | 7/2020 | Lin et al. | |
| 2020/0273411 A1 | 8/2020 | Gao et al. | |
| 2020/0286972 A1 | 9/2020 | Seo et al. | |
| 2020/0312223 A1 | 10/2020 | Yuan et al. | |
| 2020/0357872 A1 | 11/2020 | Kim | |
| 2020/0388229 A1 | 12/2020 | Zhang et al. | |
| 2020/0394961 A1 | 12/2020 | Kim et al. | |
| 2020/0410924 A1 | 12/2020 | Xiong et al. | |
| 2021/0005137 A1 | 1/2021 | Toyomura | |
| 2021/0027696 A1 | 1/2021 | Kim et al. | |
| 2021/0028313 A1 | 1/2021 | Yamazaki et al. | |
| 2021/0043138 A1 | 2/2021 | Lin et al. | |
| 2021/0118361 A1 | 4/2021 | Li | |
| 2021/0134224 A1 | 5/2021 | He et al. | |
| 2021/0174736 A1 | 6/2021 | Yang et al. | |
| 2021/0193049 A1 | 6/2021 | Lin et al. | |
| 2021/0217352 A1 | 7/2021 | Xuan et al. | |
| 2021/0225282 A1 | 7/2021 | Cho et al. | |
| 2021/0280130 A1 | 9/2021 | Wang et al. | |
| 2021/0287605 A1 | 9/2021 | Wang et al. | |
| 2021/0366363 A1 | 11/2021 | Lee et al. | |
| 2021/0366386 A1 | 11/2021 | Gao | |
| 2021/0366397 A1 | 11/2021 | Na | |
| 2021/0375193 A1 | 12/2021 | Son et al. | |
| 2021/0383752 A1 | 12/2021 | Yang | |
| 2021/0407383 A1 | 12/2021 | Lai et al. | |
| 2021/0407419 A1 | 12/2021 | Li et al. | |
| 2022/0005414 A1 | 1/2022 | Liu et al. | |
| 2022/0028338 A1 | 1/2022 | Yang et al. | |
| 2022/0130322 A1 | 4/2022 | Yuan et al. | |
| 2022/0139968 A1 | 5/2022 | Li et al. | |
| 2022/0157238 A1 | 5/2022 | Wang et al. | |
| 2022/0165213 A1 | 5/2022 | Huang et al. | |
| 2022/0165984 A1 | 5/2022 | Choi et al. | |
| 2022/0208932 A1 | 6/2022 | Yun | |
| 2022/0270552 A1 | 8/2022 | Roh et al. | |
| 2022/0310017 A1 | 9/2022 | Yang | |
| 2022/0358879 A1 | 11/2022 | Wang et al. | |
| 2022/0376024 A1 | 11/2022 | Zheng et al. | |
| 2023/0360600 A1 | 11/2023 | Wang et al. | |
| 2024/0013727 A1 | 1/2024 | Zhang et al. | |

FOREIGN PATENT DOCUMENTS

| | | |
|---|---|---|
| CN | 104091560 A | 10/2014 |
| CN | 102568374 B | 9/2015 |
| CN | 105427803 A | 3/2016 |
| CN | 105427806 A | 3/2016 |
| CN | 106384739 A | 2/2017 |
| CN | 205920745 U | 2/2017 |
| CN | 106910468 A | 6/2017 |
| CN | 107146577 A | 9/2017 |
| CN | 107256695 A | 10/2017 |
| CN | 107274830 A | 10/2017 |
| CN | 107358918 A | 11/2017 |
| CN | 107564468 A | 1/2018 |
| CN | 107610651 A | 1/2018 |
| CN | 107803636 A | 3/2018 |
| CN | 108133687 A | 6/2018 |
| CN | 108206008 A | 6/2018 |
| CN | 108777130 A | 11/2018 |
| CN | 109102778 A | 12/2018 |
| CN | 109215582 A | 1/2019 |
| CN | 109215585 A | 1/2019 |
| CN | 109285500 A | 1/2019 |
| CN | 109427293 A | 3/2019 |
| CN | 109509427 A | 3/2019 |
| CN | 109599062 A | 4/2019 |
| CN | 109817165 A | 5/2019 |
| CN | 110021273 A | 7/2019 |
| CN | 110033734 A | 7/2019 |
| CN | 110176213 A | 8/2019 |
| CN | 110226195 A | 9/2019 |
| CN | 110648629 A | 1/2020 |
| CN | 110660360 A | 1/2020 |
| CN | 110767163 A | 2/2020 |
| CN | 111158514 A | 5/2020 |
| CN | 111199711 A | 5/2020 |
| CN | 111354307 A | 6/2020 |

(56) References Cited

FOREIGN PATENT DOCUMENTS

| | | | |
|---|---|---|---|
| CN | 111354314 | A | 6/2020 |
| CN | 111402809 | A | 7/2020 |
| CN | 111435587 | A | 7/2020 |
| CN | 111445854 | A | 7/2020 |
| CN | 111489700 | A | 8/2020 |
| CN | 111508426 | A | 8/2020 |
| CN | 111583866 | A | 8/2020 |
| CN | 111710299 | A | 9/2020 |
| CN | 111724745 | A | 9/2020 |
| CN | 111754922 | A | 10/2020 |
| CN | 111754938 | A | 10/2020 |
| CN | 111798789 | A | 10/2020 |
| CN | 111883055 | A | 11/2020 |
| CN | 112053661 | A | 12/2020 |
| CN | 112086062 | A | 12/2020 |
| CN | 112116890 | A | 12/2020 |
| CN | 112133253 | A | 12/2020 |
| CN | 112233616 | A | 1/2021 |
| CN | 112289269 | A | 1/2021 |
| CN | 112331678 | A | 2/2021 |
| CN | 112365844 | A | 2/2021 |
| CN | 112382235 | A | 2/2021 |
| CN | 112397026 | A | 2/2021 |
| CN | 112397029 | A | 2/2021 |
| CN | 112397030 | A | 2/2021 |
| CN | 112397565 | A | 2/2021 |
| CN | 112420794 | A | 2/2021 |
| CN | 112435630 | A | 3/2021 |
| CN | 112599099 | A | 4/2021 |
| CN | 112753065 | A | 5/2021 |
| CN | 112767873 | A | 5/2021 |
| CN | 112909054 | A | 6/2021 |
| CN | 112992071 | A | 6/2021 |
| CN | 113097247 | A | 7/2021 |
| CN | 113140179 | A | 7/2021 |
| CN | 113224123 | A | 8/2021 |
| CN | 113450717 | A | 9/2021 |
| CN | 113838419 | A | 12/2021 |
| CN | 114627807 | A | 6/2022 |
| CN | 114694586 | A | 7/2022 |
| JP | 2007011214 | A | 1/2007 |
| JP | 2019128447 | A | 8/2019 |
| JP | WO2019163402 | A1 | 4/2021 |
| KR | 20090122119 | A | 11/2009 |
| KR | 20130007214 | A | 1/2013 |
| KR | 20130055450 | A | 5/2013 |
| KR | 20170049778 | A | 5/2017 |
| WO | 2020037767 | A1 | 2/2020 |

OTHER PUBLICATIONS

First Office Action for Chinese Application No. 202110897319.9, dated Dec. 13, 2024, 43 Pages.

First Office Action for Chinese Application No. 202110898683.7, dated Nov. 22, 2024, 26 Pages.

First Office Action for Chinese Application No. 202110898658.9, dated Mar. 2, 2022, 10 Pages.

First Office Action for Chinese Application No. 202110897272.6, dated Aug. 3, 2022, 16 Pages.

International Search Report and Written Opinion for Application No. PCT/CN2022/105232, dated Sep. 19, 2022, 10 Pages.

International Search Report and Written Opinion for Application No. PCT/CN2022/104828, dated Sep. 19, 2022, 11 Pages.

International Search Report and Written Opinion for Application No. PCT/CN2022/106018, dated Oct. 10, 2022, 8 Pages.

International Search Report and Written Opinion for Application No. PCT/CN2022/106020, dated Sep. 27, 2022, 11 Pages.

International Search Report and Written Opinion for Application No. PCT/CN2021/109890, dated Apr. 28, 2022, 10 Pages.

International Search Report and Written Opinion for Application No. PCT/CN2022/105233, dated Sep. 23, 2022, 11 Pages.

First Office Action for U.S. Appl. No. 17/788,727, dated Jun. 13, 2024, 47 Pages.

First Office Action for U.S. Appl. No. 18/270,094, dated Aug. 12, 2024, 42 Pages.

First Office Action for U.S. Appl. No. 18/279,621, dated Jun. 25, 2024, 40 Pages.

First Non Final Office Action for U.S. Appl. No. 18/273,695, dated Mar. 1, 2024, 21 Pages.

Non-Final Office Action for U.S. Appl. No. 19/030,630 dated Oct. 21, 2025. 49 pages.

* cited by examiner

I2-1

S1-2

G4-2

I2-2

I1-2

I1-3

PIXEL DRIVING CIRCUIT, PIXEL DRIVING METHOD AND DISPLAY DEVICE

CROSS-REFERENCE TO RELATED APPLICATIONS

This application is the U.S. national phase of PCT Application No. PCT/CN2022/105232 filed on Jul. 12, 2022, which claims priority to PCT Application No. PCT/CN2021/109890 filed on Jul. 30, 2021, and to Chinese Patent Application No. 202110897319.9 filed on Aug. 5, 2021, which are incorporated herein by reference in their entireties.

TECHNICAL FIELD

The present disclosure relates to the field of display technology, in particular to a pixel driving circuit, a pixel driving method and a display device.

BACKGROUND

When the related display panel is in operation, the magnetic hysteresis of the driving transistor in the driving circuit included in the pixel circuit will cause the characteristic response of the driving transistor to be slow, thereby affecting the display.

SUMMARY

An object of the present disclosure is to provide a pixel circuit, a driving method and a display device, to provide a new structure of Low temperature polysilicon oxide (LTPO) pixel circuit.

In order to achieve the above-mentioned object, the present disclosure provides a pixel driving circuit, for driving a light emitting element, wherein the pixel driving circuit includes a driving circuit and a reset circuit; the reset circuit is electrically connected to a first terminal of the driving circuit or a second terminal of the driving circuit, and is configured to initialize a potential of the first terminal of the driving circuit or a potential of the second terminal of the driving circuit in an initialization phase; the driving circuit is configured to control connection between the first terminal of the driving circuit and the second terminal of the driving circuit under the control of a potential of a control terminal of the driving circuit.

Optionally, the pixel driving circuit further includes a first light emitting control circuit and a second light emitting control circuit; wherein the first light emitting control circuit is electrically connected to a first light emitting control line, the first terminal of the driving circuit and a first voltage line respectively, and is configured to control to connect the first terminal of the driving circuit and the first voltage line under the control of a first light emitting control signal provided by the first light emitting control line; the second light emitting control circuit is electrically connected to a second light emitting control line, the second terminal of the driving circuit and a first electrode of the light emitting element, is configured to control to connect the second terminal of the driving circuit and the first electrode of the light emitting element under the control of a second light emitting control signal provided by the second light emitting control line; a second electrode of the light emitting element is electrically connected to a second voltage line.

Optionally, the reset circuit comprises a first capacitor; the first light emitting control line and the second light emitting control line are a same light emitting control line; a first electrode plate of the first capacitor is electrically connected to the light emitting control line, and a second electrode plate of the first capacitor is electrically connected to the first terminal of the driving circuit or the second terminal of the driving circuit.

Optionally, the first capacitor is a capacitor formed between the light emitting control line and a conductive pattern; the light emitting control line is formed by a metal layer, and the conductive pattern is formed by another metal layer included in the pixel driving circuit; the conductive pattern is electrically connected to the first terminal of the driving circuit or the second terminal of the driving circuit.

Optionally, the reset circuit comprises a first transistor; a control electrode of the first transistor is electrically connected to a reset control line, a first electrode of the first transistor is electrically connected to a reset voltage line, and a second electrode of the first transistor is connected to the first terminal of the driving circuit or the second terminal of the driving circuit.

Optionally, the reset circuit comprises a first transistor; a control electrode of the first transistor is electrically connected to a reset control line, a first electrode of the first transistor is electrically connected to a first connection point, and a second electrode of the first transistor is electrically connected to a second connection point, the first connection point is a connection point on a first connection line between the first light emitting control circuit and the first terminal of the driving circuit, and the second connection point is another connection point on the first connection line; or, the control electrode of the first transistor is electrically connected to the reset control line, the first electrode of the first transistor is electrically connected to a third connection point, and the second electrode of the first transistor is electrically connected to a fourth connection point, the third connection point is a connection point on a second connection line between the second terminal of the driving circuit and the first electrode of the light emitting element, and the fourth connection point is another connection point on the second connection line.

Optionally, the pixel driving circuit further includes a light emitting element and a second light emitting control circuit; wherein the first terminal of the driving circuit is electrically connected to the first voltage line; the second light emitting control circuit is electrically connected to a second light emitting control line, and the second terminal of the driving circuit is electrically connected to a first electrode of the light emitting element, is configured to control the connection between the second terminal of the driving circuit and the first electrode of the light emitting element under the control of a second light emitting control signal provided by the second light emitting control line; a second electrode of the light emitting element is electrically connected to a second voltage line; the reset circuit is electrically connected to the second terminal of the driving circuit, and is configured to initialize the potential of the second terminal of the driving circuit in the initialization phase.

Optionally, the reset circuit includes a first capacitor, a first electrode plate of the first capacitor is electrically connected to the second light emitting control line, and the first capacitor is electrically connected to the second terminal of the driving circuit; or, the reset circuit includes a first transistor, a control electrode of the first transistor is electrically connected to a reset control line, the control electrode of the first transistor is electrically connected to a reset voltage line, and a second electrode of the first transistor is electrically connected to the second terminal of the driving circuit; or, the reset circuit includes the first transistor; the control electrode of the first transistor is electrically connected to the reset control line, the first electrode of the first transistor is electrically connected to a third connection point, and the second electrode of the first transistor is electrically connected to a fourth connection point, the third connection point is a connection point on a second connection line between the second terminal of the driving circuit and the first electrode of the light emitting element, the fourth connection point is another connection point on the second connection line.

Optionally, the reset circuit comprises a first capacitor; the first capacitor is a capacitor formed between the second light emitting control line and a conductive pattern; the second light emitting control line is formed by a metal layer, the conductive pattern is formed by another metal layer included in the pixel driving circuit.

Optionally, the pixel driving circuit further comprises an energy storage circuit, a data writing-in circuit, a compensation control circuit, an on-off control circuit, a first initialization circuit and a second initialization circuit; the energy storage circuit is electrically connected to the control terminal of the driving circuit and is configured to store electric energy; the data writing-in circuit is respectively electrically connected to a second scanning line, a data line and the first terminal of the driving circuit, and is configured to control to write a data voltage on the data line into the first terminal of the driving circuit under the control of a second scanning signal provided by the second scanning line; the on-off control circuit is electrically connected to a first scanning line, the control terminal of the driving circuit and a connection node, and is configured to control to connect the control terminal of the driving circuit and the connection node under the control of a first scanning signal; the compensation control circuit is electrically connected to the second scanning line, the connection node and the second terminal of the driving circuit, and is configured to control to connect the connection node and the second terminal of the driving circuit under the control of the second scanning signal provided by the second scanning line; the first initialization circuit is respectively electrically connected to a reset control line, a first initial voltage line and the connection node, and is configured to write a first initial voltage provided by the first initial voltage line into the connection node under the control of a reset control signal provided by the reset control line; the second initialization circuit is electrically connected to a third scanning line, a second initial voltage line and a first electrode of the light emitting element respectively, and is configured to write a second initial voltage provided by the second initial voltage line into the first electrode of the light emitting element under the control of a third scanning signal provided by the third scanning line.

Optionally, transistors included in the on-off control circuit are oxide thin film transistors.

Optionally, transistors included in the second initialization circuit are oxide thin film transistors, and the third scanning line is a first light emitting control line or a second light emitting control line.

Optionally, the pixel driving circuit further includes an energy storage circuit, a data writing-in circuit, a compensation control circuit, a first initialization circuit and a second initialization circuit; wherein the energy storage circuit is electrically connected to the control terminal of the driving circuit and is configured to store electric energy; the data writing-in circuit is electrically connected to a scanning line, a data line and the first terminal of the driving circuit,

4 and is configured to control to write a data voltage on the data line into the first terminal of the driving circuit under the control of a scanning signal provided by the scanning line; the compensation control circuit is electrically connected to the scanning line, the control terminal of the driving circuit, and the second terminal of the driving circuit, and is configured to control to connect the control terminal of the driving circuit and the second terminal of the driving circuit under the control of the scanning signal; the first initialization circuit is electrically connected to a first initial control line, a first initial voltage line, and the control terminal of the driving circuit, and is configured to write a first initial voltage provided by the first initial voltage line into the control terminal of the driving circuit under the control of a first initial control signal provided by the first initial control line; the second initialization circuit is electrically connected to a second initial control line, a second initial voltage line and the first electrode of the light emitting element respectively, and is configured to write a second initial voltage provided by the second initial voltage line into the first electrode of the light emitting element under the control of a second initial control signal provided by the second initial control line.

Optionally, the pixel driving circuit further includes a data writing-in circuit, an energy storage circuit, a compensation control circuit, a first initialization circuit, a second initialization circuit and a setting circuit; wherein the compensation control circuit is electrically connected to a first scanning line, the control terminal of the driving circuit and the second terminal of the driving circuit respectively, is configured to control to connect the control terminal of the driving circuit and the second terminal of the driving circuit under the control of a first scanning signal provided by the first scanning line; a first terminal of the energy storage circuit is electrically connected to the control terminal of the driving circuit, a second terminal of the energy storage circuit is electrically connected to a control node, and the energy storage circuit is configured to store electric energy; the data writing-in circuit is respectively electrically connected to a second scanning line, a data line and the control node, and is configured to write a data voltage on the data line into the control node under the control of a second scanning signal provided by the second scanning line; the first initialization circuit is electrically connected to a first initial control line, a first initial voltage line, and the control terminal of the driving circuit, and is configured to write a first initial voltage provided by the first initial voltage line into the control terminal of the driving circuit under the control of a first initial control signal provided by the first initial control line; the second initialization circuit is electrically connected to a second initial control line, a second initial voltage line and the control node respectively, and is configured to write a second initial voltage provided by the second initial voltage line into the control node under the control of a second initial control signal provided by the second initial control line; the setting circuit is respectively electrically connected to a second light emitting control line, the second initial voltage line and the control node, and is configured to write a second initial voltage into the control node under the control of a second light emitting control signal provided by the second light emitting control line.

Optionally, transistors included in the compensation control circuit and transistors included in the first initialization circuit are oxide thin film transistors.

Optionally, the pixel driving circuit further includes a data writing-in circuit, an energy storage circuit, a compensation control circuit, a first initialization circuit and a second initialization circuit; wherein the compensation control circuit is electrically connected to a first scanning line, the control terminal of the driving circuit, and the second terminal of the driving circuit, and is configured to control to connect the control terminal of the driving circuit and the second terminal of the driving circuit under the control of a first scanning signal provided by the first scanning line; the energy storage circuit is electrically connected to the control terminal of the driving circuit and is configured to store electric energy; the data writing-in circuit is electrically connected to a second scanning line, a data line and the first terminal of the driving circuit, and is configured to write a data voltage on the data line into the first terminal of the driving circuit under the control of a second scanning signal provided by the second scanning line; the first initialization circuit is electrically connected to a first initial control line, an initial voltage line, and the control terminal of the driving circuit, and is configured to write an initial voltage provided by the initial voltage line into the control terminal of the driving circuit under the control of a first initial control signal provided by the first initial control line; the second initialization circuit is electrically connected to a second initial control line, the initial voltage line and the first electrode of the light emitting element respectively, and is configured to write the initial voltage into the first electrode of the light emitting element under the control of a second initial control signal provided by the second initial control line.

Optionally, transistors included in the compensation control circuit and transistors included in the first initialization circuit are oxide thin film transistors.

Optionally, the pixel driving circuit further includes a data writing-in circuit, an energy storage circuit, a compensation control circuit and an initialization circuit; wherein the compensation control circuit is electrically connected to a first scanning line, the control terminal of the driving circuit, and the second terminal of the driving circuit, and is configured to control to connect the control terminal of the driving circuit and the second terminal of the driving circuit under the control of a first scanning signal provided by the first scanning line; the data writing-in circuit is electrically connected to a second scanning line, a data line and the first terminal of the driving circuit, and is configured to write a data voltage on the data line into the first terminal of the driving circuit under the control of a second scanning signal provided by the second scanning line; the energy storage circuit is electrically connected to the control terminal of the driving circuit and is configured to store electric energy; the initialization circuit is electrically connected to an initial control line, an initial voltage line, and a first electrode of the light emitting element, and is configured to provide an initial voltage provided by the initial voltage line to the first electrode of the light emitting element.

In a second aspect, an embodiment of the present disclosure provides a pixel driving method, applied to the pixel driving circuit, includes: initializing, by the reset circuit, the potential of the first terminal of the driving circuit or the potential of the second terminal of the driving circuit in the initialization phase.

Optionally, the pixel driving circuit further includes a first light emitting control circuit and a second light emitting control circuit; the reset circuit includes a first capacitor; the first light emitting control line and the second light emitting control line are a same light emitting control line; a first electrode plate of the first capacitor is electrically connected to the light emitting control line, and a second electrode plate of the first capacitor is connected to the first terminal of the driving circuit or the second terminal of the driving circuit electrical connection; the step of initializing, by the reset circuit, the potential of the first terminal of the driving circuit or the potential of the second terminal of the driving circuit in the initialization phase includes: in the initialization phase, the second electrode plate of the first capacitor being in a floating state, and a potential of the second electrode plate of the first capacitor changing with a potential of the light emitting control signal on the light emitting control line to initialize the potential of the first terminal of the driving circuit or the potential of the second terminal of the driving circuit.

Optionally, the pixel driving circuit further includes a first light emitting control circuit and a second light emitting control circuit; the reset circuit includes a first transistor; a control electrode of the first transistor is electrically connected to a reset control line, and a first electrode of the first transistor is electrically connected to a reset voltage line, and a second electrode of the first transistor is electrically connected to the first terminal of the driving circuit or the second terminal of the driving circuit; the step of initializing, by the reset circuit, the potential of the first terminal of the driving circuit or the potential of the second terminal of the driving circuit in the initialization phase includes: in the initialization phase, under the control of a reset control signal provided by the reset control line, the first transistor being turned on, to write a reset voltage provided by the reset voltage line into the first terminal of the driving circuit or the second terminal of the driving circuit.

Optionally, the pixel driving circuit further includes a first light emitting control circuit and a second light emitting control circuit; the reset circuit includes a first transistor; a control electrode of the first transistor is electrically connected to a reset control line, and a first electrode of the first transistor is electrically connected to a first connection point, a second electrode of the first transistor is electrically connected to a second connection point, and the first connection point is a connection point on a first connection line between the first light emitting control circuit and the first terminal of the driving circuit, the second connection point is another connection point on the first connection line; the step of initializing, by the reset circuit, the potential of the first terminal of the driving circuit or the potential of the second terminal of the driving circuit in the initialization phase includes: in the initialization phase, under the control of a reset control signal provided by the reset control line, the first transistor being turned on to serve as a capacitor, so as to control the potential of the first terminal of the driving circuit.

Optionally, the pixel driving circuit further includes a first light emitting control circuit and a second light emitting control circuit; the reset circuit includes a first transistor; a control electrode of the first transistor is electrically connected to a reset control line, and a first electrode of the first transistor is electrically connected to a third connection point, a second electrode of the first transistor is electrically connected to a fourth connection point, and the third connection point is a connection point on a second connection line between the second terminal of the driving circuit and a first electrode of the light emitting element, the fourth connection point is another connection point on the second connection line; the step of initializing, by the reset circuit, the potential of the first terminal of the driving circuit or the potential of the second terminal of the driving circuit in the initialization phase includes: in the initialization phase, under the control of a reset control signal provided by the reset control line, the first transistor being turned on to serve as a capacitor, so as to control the potential of the second terminal of the driving circuit.

Optionally, the display period further includes a data writing-in phase and a light emitting phase set after the initialization phase; the pixel driving method further includes: in the data writing-in phase and the light emitting phase, under the control of the reset control signal provided by the reset control line, the first transistor being turned off.

In a third aspect, an embodiment of the present disclosure provides a display device, including the pixel driving circuit.

DETAILED DESCRIPTION

The following will clearly and completely describe the technical solutions in the embodiments of the present disclosure with reference to the accompanying drawings in the embodiments of the present disclosure. Obviously, the described embodiments are only some of the embodiments of the present disclosure, not all of them. Based on the embodiments in the present disclosure, all other embodiments obtained by persons of ordinary skill in the art without making creative work belong to the protection scope of the present disclosure.

The transistors used in all the embodiments of the present disclosure may be triodes, thin film transistors or field effect transistors or other devices with the same characteristics. In the embodiments of the present disclosure, in order to distinguish the two electrodes of the transistor except the control electrode, one electrode is called the first electrode, and the other electrode is called the second electrode.

In actual operation, when the transistor is a thin film transistor or a field effect transistor, the first electrode may be a drain electrode, and the second electrode may be a source electrode; or, the first electrode may be a source electrode, the second electrode may be a drain electrode.

The pixel driving circuit described in the embodiment of the present disclosure is used to drive a light emitting element, and the pixel driving circuit includes a driving circuit and a reset circuit;

The reset circuit is electrically connected to a first terminal of the driving circuit or a second terminal of the driving circuit, and is configured to initialize a potential of the first terminal of the driving circuit or a potential of the second terminal of the driving circuit during the initialization phase;

The driving circuit is configured to control the connection between the first terminal of the driving circuit and the second terminal of the driving circuit under the control of a potential of a control terminal of the driving circuit.

When the pixel driving circuit described in the embodiments of the present disclosure is in operation, before the data voltage is written into the driving circuit, in the initialization phase, the reset circuit initializes the potential of the first terminal of the driving circuit or the potential of the second terminal of the driving circuit, to improve the hysteresis of the driving transistor, and solve phenomena such as afterimage and flicker caused by the hysteresis of the driving transistor in a low-frequency state.

Figure 1:
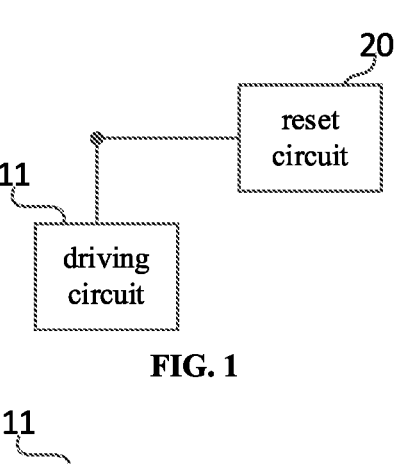
FIG. 1 is a structural diagram of a pixel driving circuit according to an embodiment of the present disclosure.

As shown in FIG. 1, the pixel driving circuit described in the embodiment of the present disclosure is used to drive the light emitting element, and the pixel driving circuit includes a driving circuit 11 and a reset circuit 20;

The reset circuit 20 is electrically connected to the first terminal of the driving circuit 11, and is used for initializing the potential of the first terminal of the driving circuit 11 during the initialization phase;

The driving circuit 11 is used to control the connection between the first terminal of the driving circuit 11 and the second terminal of the driving circuit 11 under the control of the potential of the control terminal thereof.

Figure 2:
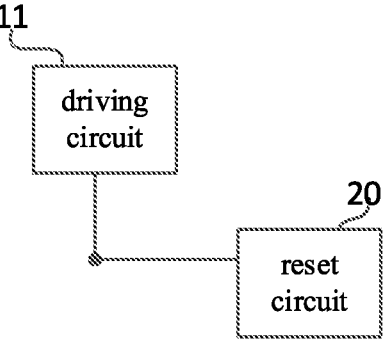
FIG. 2 is a structural diagram of a pixel driving circuit according to at least one embodiment of the present disclosure.

As shown in FIG. 2, the pixel driving circuit described in the embodiment of the present disclosure is used to drive the light emitting element, and the pixel driving circuit includes a driving circuit 11 and a reset circuit 20;

The reset circuit 20 is electrically connected to the second terminal of the driving circuit 11, and is used for initializing the potential of the second terminal of the driving circuit 11 during the initialization phase;

The driving circuit 11 is used to control the connection between the first terminal of the driving circuit 11 and the second terminal of the driving circuit 11 under the control of the potential of the control terminal thereof.

Optionally, the pixel driving circuit according to at least one embodiment of the present disclosure further includes a first light emitting control circuit and a second light emitting control circuit;

The first light emitting control circuit is electrically connected to a first light emitting control line, the first terminal of the driving circuit and a first voltage line respectively, and is configured to control to connect the first terminal of the driving circuit and the first voltage line under the control of a first light emitting control signal provided by the first light emitting control line;

The second light emitting control circuit is electrically connected to a second light emitting control line, the second terminal of the driving circuit and a first electrode of the light emitting element, is configured to control to connect the second terminal of the driving circuit and the first electrode of the light emitting element under the control of a second light emitting control signal provided by the second light emitting control line;

a second electrode of the light emitting element is electrically connected to the second voltage line.

In at least one embodiment of the present disclosure, the first voltage line may be a high voltage line, and the second voltage line may be a low voltage line.

Figure 3:
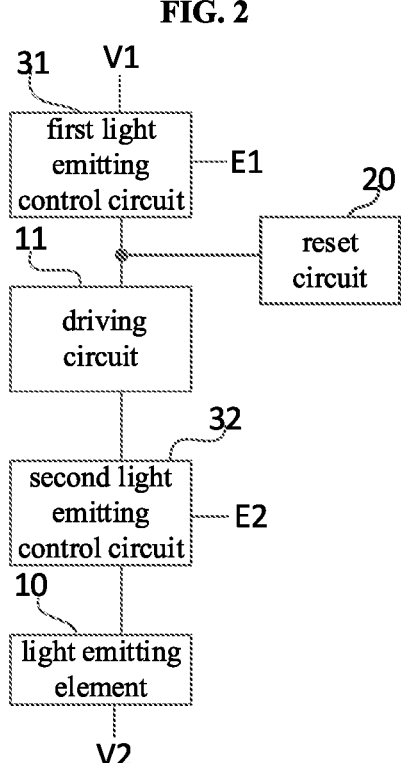
FIG. 3 is a structural diagram of a pixel driving circuit according to at least one embodiment of the present disclosure.

As shown in FIG. 3, on the basis of at least one embodiment of the pixel driving circuit shown in FIG. 1, the pixel driving circuit described in at least one embodiment of the present disclosure further includes a first light emitting control circuit 31 and a second light emitting control circuit 32;

The first light emitting control circuit 31 is electrically connected to the first light emitting control line E1, the first terminal of the driving circuit 11 and the first voltage line V1 respectively, and is used to control the connection between the first terminal of the driving circuit 11 and the first voltage line V1 under the control of the first light emitting control signal provided by the first light emitting control line E1;

The second light emitting control circuit 32 is electrically connected to the second light emitting control line 32, the second terminal of the driving circuit 11 and the first electrode of the light emitting element 10, is configured to control the connection between the second terminal of the driving circuit 11 and the first electrode of the light emitting element 10 under the control of the second light emitting control signal provided by the second light emitting control line E2;

The second electrode of the light emitting element 10 is electrically connected to the second voltage line V2.

When the pixel driving circuit as shown in FIG. 3 is working, in the light emitting phase, the first light emitting control circuit 31 controls to connect the first terminal of the driving circuit 11 and the first voltage line V1 under the control of the first light emitting control signal, and the second light emitting control circuit 32 controls the connection between the second terminal of the driving circuit 11 and the first electrode of the first light emitting element 10 under the control of the second light emitting control signal.

Figures 4, 5:
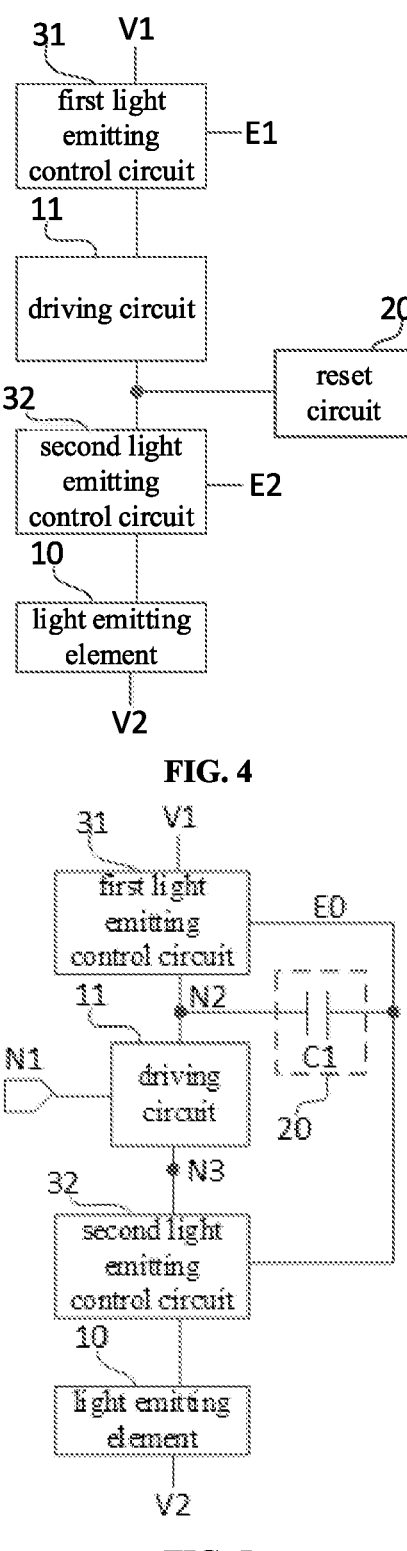
FIG. 4 is a structural diagram of a pixel driving circuit according to at least one embodiment of the present disclosure.
FIG. 5 is a structural diagram of a pixel driving circuit according to at least one embodiment of the present disclosure.

As shown in FIG. 4, on the basis of at least one embodiment of the pixel driving circuit shown in FIG. 2, the pixel driving circuit described in at least one embodiment of the present disclosure further includes a first light emitting control circuit 31 and a second light emitting control circuit 32;

The first light emitting control circuit 31 is electrically connected to the first light emitting control line E1, the first terminal of the driving circuit 11 and the first voltage line V1 respectively, and is configured to control to connect the first terminal of the driving circuit 11 and the first voltage line V1 under the control of the first light emitting control signal provided by the first light emitting control line E1;

The second light emitting control circuit 32 is electrically connected to the second light emitting control line 32, and the second terminal of the driving circuit 11 and the first electrode of the light emitting element 10, is configured to control the connection between the second terminal of the driving circuit 11 and the first electrode of the light emitting element 10 under the control of the second light emitting control signal provided by the second light emitting control line E2;

The second electrode of the light emitting element 10 is electrically connected to the second voltage line V2.

When the pixel driving circuit as shown in FIG. 4 is working, in the light emitting phase, the first light emitting control circuit 31 controls to connect the first terminal of the driving circuit 11 and the first voltage line V1 under the control of the first light emitting control signal, and the second light emitting control circuit 32 controls the connection between the second terminal of the driving circuit 11 and the first electrode of the first light emitting element 10 under the control of the second light emitting control signal.

Optionally, the reset circuit includes a first capacitor; the first light emitting control line and the second light emitting control line are a same light emitting control line;

A first electrode plate of the first capacitor is electrically connected to the light emitting control line, and a second electrode plate of the first capacitor is electrically connected to the first terminal of the driving circuit or the second terminal of the driving circuit.

In at least one embodiment of the present disclosure, the first capacitor is a capacitor formed between the light emitting control line and a conductive pattern; the light emitting control line is formed by a metal layer, and the conductive pattern is formed by at least one metal layer of the pixel driving circuit other than the metal layer; the conductive pattern is electrically connected to the first terminal of the driving circuit or the second terminal of the driving circuit.

In specific implementation, the first electrode plate of the first capacitor can be the light emitting control line, the light emitting control line can be formed by, for example, the first gate metal layer, and the conductive pattern can be formed by the second gate metal layer, the third gate metal layer, the source-drain metal layer, or the second semiconductor layer, or the conductive pattern may be formed by connection of at least two of the second gate metal layer, the third gate metal layer, the source-drain metal layer, and the second semiconductor layer. An insulating layer is provided between the first electrode plate of the first capacitor and the second electrode plate of the first capacitor. The capacitance value of the first capacitor is determined by an opposite area between the first electrode plate of the first capacitor and the second electrode plate of the first capacitor, and a relative distance between the first electrode plate of the first capacitor and the second electrode plate of the first capacitor.

The second semiconductor layer can be made of metal oxide, for example.

As shown in FIG. 5, on the basis of at least one embodiment of the pixel driving circuit shown in FIG. 3, the reset circuit 20 may include a first capacitor C1;

The first light emitting control line and the second light emitting control line are the same light emitting control line E0;

The first electrode plate of C1 is electrically connected to the light emitting control line E0, and the second electrode plate of C1 is electrically connected to the first terminal of the driving circuit 11.

In FIG. 5, the first node labeled N1 is electrically connected to the control terminal of the driving circuit 11, the second node labeled N2 is electrically connected to the first terminal of the driving circuit 11, and the third node labeled N3 is electrically connected to the second terminal of the driving circuit 11.

At least one embodiment of the pixel driving circuit shown in FIG. 5 of the present disclosure is in operation, in the initialization phase, the potential of the light emitting control signal provided by E0 changes from a low voltage Vgl to a high voltage Vgh, N2 is in a floating state, and the potential of N2 changes with the potential of the first electrode plate of C2, and the potential of N2 becomes V1+Vgh−Vgl. At this time, the gate-source voltage of the driving transistor in the driving circuit 11 is less than Vth (Vth is the threshold voltage of the driving transistor), the driving transistor is in the on-biased state, which reduces the hysteresis caused by N2 being floating.

At least one embodiment of the pixel driving circuit shown in FIG. 5 of the present disclosure is in operation, before data is written, the driving transistor is in a biased state to ensure that the driving transistor in each pixel driving circuit is charged and compensated from a turned-on and biased state, without being affected by the data voltage of the previous frame, which can eliminate the influence of the magnetic hysteresis of the driving transistor, and improve afterimage and response time.

Figure 6:
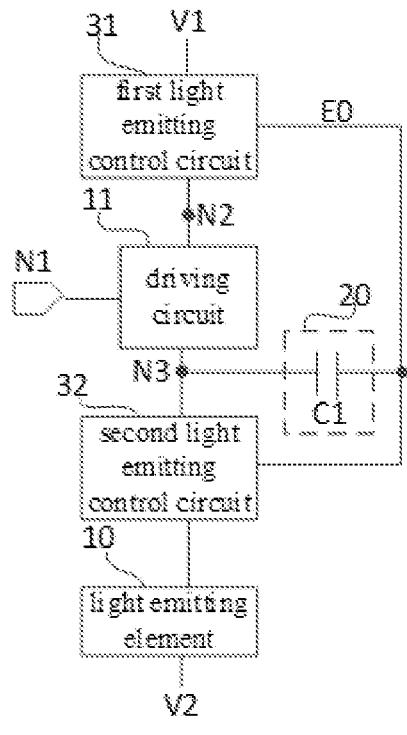
FIG. 6 is a structural diagram of a pixel driving circuit according to at least one embodiment of the present disclosure.

As shown in FIG. 6, on the basis of at least one embodiment of the pixel driving circuit shown in FIG. 4, the reset circuit 20 may include a first capacitor C1;

The first light emitting control line and the second light emitting control line are the same light emitting control line E0;

The first electrode plate of C1 is electrically connected to the light emitting control line E0, and the second electrode plate of C1 is electrically connected to the second terminal of the driving circuit 11.

In FIG. 6, the first node labeled N1 is electrically connected to the control terminal of the driving circuit 11, the second node labeled N2 is electrically connected to the first terminal of the driving circuit 11, and the third node labeled N3 is electrically connected to the second terminal of the driving circuit 11.

At least one embodiment of the pixel driving circuit shown in FIG. 6 of the present disclosure is in operation, in the initialization phase, the potential of the light emitting control signal provided by E0 changes from a low voltage Vgl to a high voltage Vgh, N3 is in a floating state, and the potential of N3 changes with the potential of the first electrode plate of C2, and the potential of N3 becomes V1+Vgh−Vgl. At this time, the gate-source voltage of the driving transistor in the driving circuit 11 is less than Vth, and the driving transistor is in a turned-on and biased state.

At least one embodiment of the pixel driving circuit shown in FIG. 6 of the present disclosure is in operation, and before data is written, the driving transistor is in a turned-on and biased state to ensure that the driving transistor in each pixel driving circuit is always charged and compensated from the turned-on and biased state, without being affected by the data voltage of the previous frame, which can eliminate the influence of the magnetic hysteresis of the driving transistor, and improve afterimage and response time.

The difference between at least one embodiment of the pixel driving circuit shown in FIG. 6 and at least one embodiment of the pixel driving circuit shown in FIG. 5 is that the second electrode plate of C1 is electrically connected to the second terminal of the driving circuit 11, so that the source electrode and drain electrode of the driving transistor in the driving circuit are interchanged. When the potential of the light emitting control signal provided by E0 changes from a low voltage to a high voltage, for the driving transistor, the source electrode and the drain electrode are interchanged. The conduction direction of the driving transistor is opposite, which weakens the trapping of electrons under defects and reduces the hysteresis of the driving transistor.

Optionally, the reset circuit includes a first transistor;

A control electrode of the first transistor is electrically connected to a reset control line, a first electrode of the first transistor is electrically connected to the reset voltage line, and a second electrode of the first transistor is connected to the first terminal of the driving circuit or the second terminal of the driving circuit.

Figure 7:
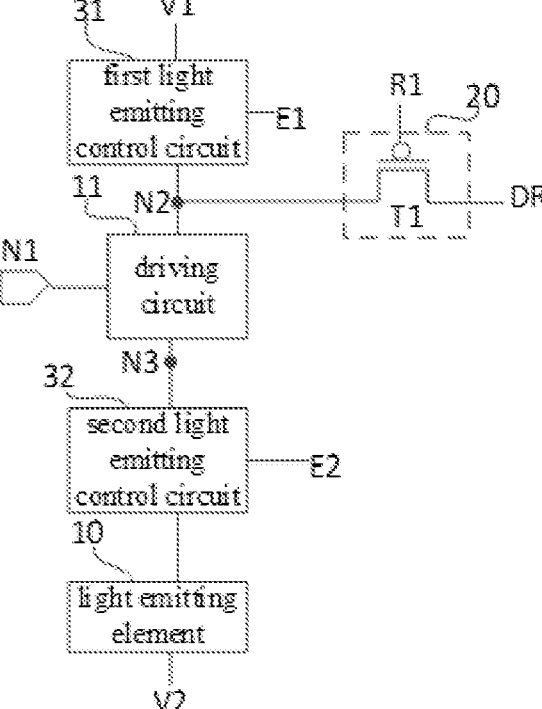
FIG. 7 is a structural diagram of a pixel driving circuit according to at least one embodiment of the present disclosure.

As shown in FIG. 7, on the basis of at least one embodiment of the pixel driving circuit shown in FIG. 3, the reset circuit 20 may include a first transistor T1;

The gate electrode of the first transistor T1 is electrically connected to the reset control line R1, the source electrode of the first transistor T1 is electrically connected to the reset voltage line DR, and the drain electrode of the first transistor T1 is electrically connected to the first terminal of the driving circuit 11.

In FIG. 7, the first node labeled N1 is electrically connected to the control terminal of the driving circuit 11, the second node labeled N2 is electrically connected to the first terminal of the driving circuit 11, and the third node labeled N3 is electrically connected to the second terminal of the driving circuit 11.

When at least one embodiment of the pixel driving circuit shown in FIG. 7 of the present disclosure is working, in the initialization phase, R1 provides a low voltage signal, and T1 is turned on, so as to write the reset voltage provided by DR into N2.

In at least one embodiment shown in FIG. 7, T1 may be a low temperature polysilicon thin film transistor, but not limited thereto.

In at least one embodiment of the pixel driving circuit shown in FIG. 7, the reset voltage may be a high voltage VDD, a first initial voltage Vi1, a second initial voltage Vi2 or a low voltage VSS. The reset voltage may be a constant voltage, or the reset voltage may also be variable. The direction in which the reset voltage fluctuates changes according to the potential of N1. For example, when a white picture is displayed, the reset voltage may be a low potential voltage; when a black picture is displayed, the reset voltage may be a high potential voltage.

At least one embodiment of the pixel driving circuit shown in FIG. 7 of the present disclosure is working, in the initialization phase, R1 provides a low voltage signal, and T1 is turned on to write the reset voltage into N2. When the reset voltage is a high voltage, the gate-source voltage of the driving transistor in the driving circuit is less than Vth, and the driving transistor is in the turned-on and biased state, which reduces the hysteresis caused by N2 being floating. At least one embodiment of the pixel driving circuit shown in FIG. 7 of the present disclosure is in operation, and before data is written, the driving transistor is in a turned-on and biased state to ensure that the driving transistor in each pixel driving circuit is always charged and compensated from the turned-on and biased state, without being affected by the data voltage of the previous frame, which can eliminate the influence of the magnetic hysteresis of the driving transistor, and improve afterimage and response time.

At least one embodiment of the pixel driving circuit shown in FIG. 7 of the present disclosure is working. In the initialization phase, R1 provides a low voltage signal, and T1 is turned on to write the reset voltage into N2. When the reset voltage is low voltage, the gate-source voltage of the driving transistor in the driving circuit is greater than Vth, and the driving transistor is in an off-biased state, which reduces the hysteresis caused by N2 being floating. At least one embodiment of the pixel driving circuit shown in FIG. 7 of the present disclosure is in operation. Before the data is written, the driving transistor is in the off-bias state to ensure that the driving transistor in each pixel driving circuit is turned off. The bias state starts to be charged and compensated, without being affected by the data voltage of previous frame, which can eliminate the influence of the magnetic hysteresis of the driving transistor, and improve afterimage and response time.

Figure 8:
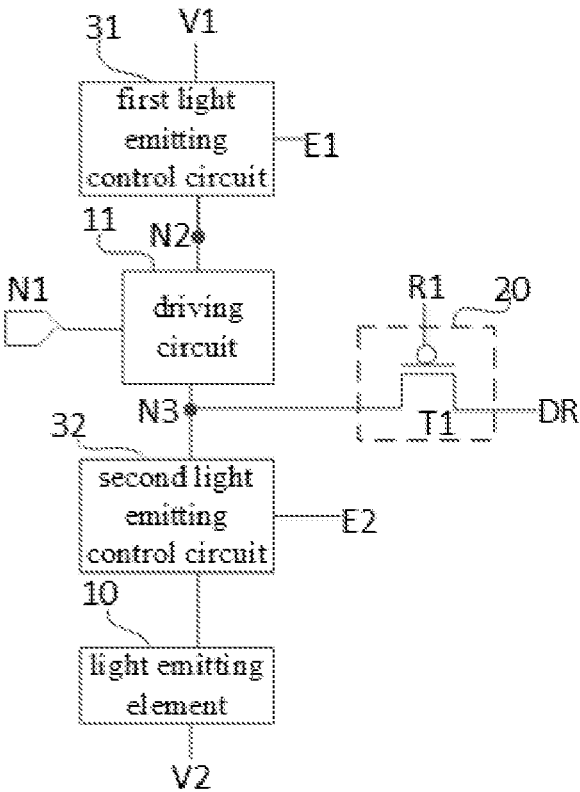
FIG. 8 is a structural diagram of a pixel driving circuit according to at least one embodiment of the present disclosure.

As shown in FIG. 8, on the basis of at least one embodiment of the pixel driving circuit shown in FIG. 3, the reset circuit 20 may include a first transistor T1;

The gate electrode of the first transistor T1 is electrically connected to the reset control line R1, the source electrode of the first transistor T1 is electrically connected to the reset voltage line DR, and the drain electrode of the first transistor T1 is electrically connected to the second terminal of the driving circuit 11.

In FIG. 8, the first node labeled N1 is electrically connected to the control terminal of the driving circuit 11, the second node label N2 is electrically connected to the first terminal of the driving circuit 11, and the third node label N3 is electrically connected to the second terminal of the driving circuit 11.

When at least one embodiment of the pixel driving circuit shown in FIG. 8 of the present disclosure is working, in the initialization phase, R1 provides a low voltage signal, and T1 is turned on, so as to write the reset voltage provided by DR into N3.

In at least one embodiment shown in FIG. 8, T1 may be a low temperature polysilicon thin film transistor, but not limited thereto.

The difference between at least one embodiment of the pixel driving circuit shown in FIG. 8 of the present disclosure and at least one embodiment of the pixel driving circuit shown in FIG. 7 is that the drain electrode of T1 is electrically connected to the second terminal of the driving circuit 11, so that in the initialization phase, the source electrode and the drain electrode of the driving transistors in the driving circuit are interchanged.

At least one embodiment of the pixel driving circuit shown in FIG. 8 of the present disclosure is working, in the initialization phase, R1 provides a low voltage signal, and T1 is turned on to write the reset voltage into N3. When the reset voltage is high voltage, the gate-source voltage of the driving transistor in the driving circuit is less than Vth, and the driving transistor is in the turned-on and biased state, which reduces the hysteresis caused by N2 being floating. When at least one embodiment of the pixel driving circuit shown in FIG. 8 of the present disclosure is in operation, before the data is written, the driving transistor is in a turned-on and biased state to ensure that the driving transistor in each pixel driving circuit is always charged and compensated from the turned-on and biased state, without being affected by the data voltage of the previous frame, which can eliminate the influence of the magnetic hysteresis of the driving transistor, and improve afterimage and response time.

When at least one embodiment of the pixel driving circuit shown in FIG. 8 of the present disclosure is working, in the initialization phase, R1 provides a low voltage signal, and T1 is turned on to write the reset voltage into N3. When the reset voltage is low voltage, the gate-source voltage of the driving transistor in the driving circuit is greater than Vth, and the driving transistor is in a turned-off and biased state, which reduces the hysteresis caused by N2 being floating. When at least one embodiment of the pixel driving circuit shown in FIG. 8 of the present disclosure is in operation, before the data is written, the driving transistor is in the turned-off and biased state to ensure that the driving transistor in each pixel driving circuit is charged and compensated from the turned-off and biased state, without being affected by the data voltage of the previous frame, which can eliminate the influence of the magnetic hysteresis of the driving transistor, and improve afterimage and response time.

Optionally, the reset circuit includes a first transistor;

A control electrode of the first transistor is electrically connected to the reset control line, a first electrode of the first transistor is electrically connected to a first connection point, and a second electrode of the first transistor is electrically connected to a second connection point, the first connection point is a connection point on a first connection line between the first light emitting control circuit and the first terminal of the driving circuit, and the second connection point is another connection point on the first connection line;

or,

The control electrode of the first transistor is electrically connected to the reset control line, the first electrode of the first transistor is electrically connected to a third connection point, and the second electrode of the first transistor is electrically connected to a fourth connection point, the third connection point is a connection point on a second connection line between the second terminal of the driving circuit and the first electrode of the light emitting element, and the fourth connection point is another connection point on the second connection line.

Figure 9:
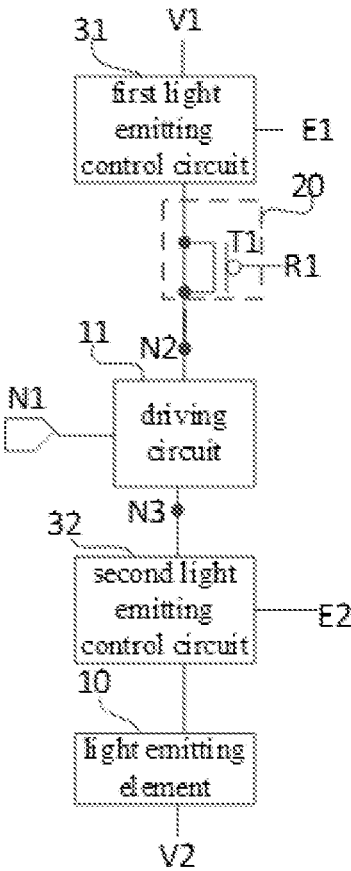
FIG. 9 is a structural diagram of a pixel driving circuit according to at least one embodiment of the present disclosure.

As shown in FIG. 9, on the basis of at least one embodiment of the pixel driving circuit shown in FIG. 3, the reset circuit 20 may include a first transistor T1;

The gate electrode of the first transistor T1 is electrically connected to the reset control line R1, the source electrode of the first transistor T1 is electrically connected to the first connection point, and the drain electrode of the first transistor T1 is electrically connected to the second connection point, the first connection point is a connection point on the first connection line between the first light emitting control circuit 31 and the first terminal of the driving circuit 11, and the second connection point is another connection node on the first connection line.

In FIG. 9, the first node labeled N1 is electrically connected to the control terminal of the driving circuit 11, the second node labeled N2 is electrically connected to the first terminal of the driving circuit 11, and the third node labeled N3 is electrically connected to the second terminal of the driving circuit 11.

When at least one embodiment of the pixel driving circuit shown in FIG. 9 of the present disclosure is working, in the initialization phase, R1 provides a low voltage signal, and T1 is turned on. At this time, T1 is equivalent to a capacitor, which can keep the potential of N2 stable. At this time, the potential of N2 can be the sum of the voltage value of VDD and the potential of the reset control signal provided by R1, so as to improve the hysteresis phenomenon of T0. When R1 provides a high voltage signal, T1 is turned off, which does not affect the pixel driving circuit to drive the light emitting element to emit light.

Figures 10, 11:
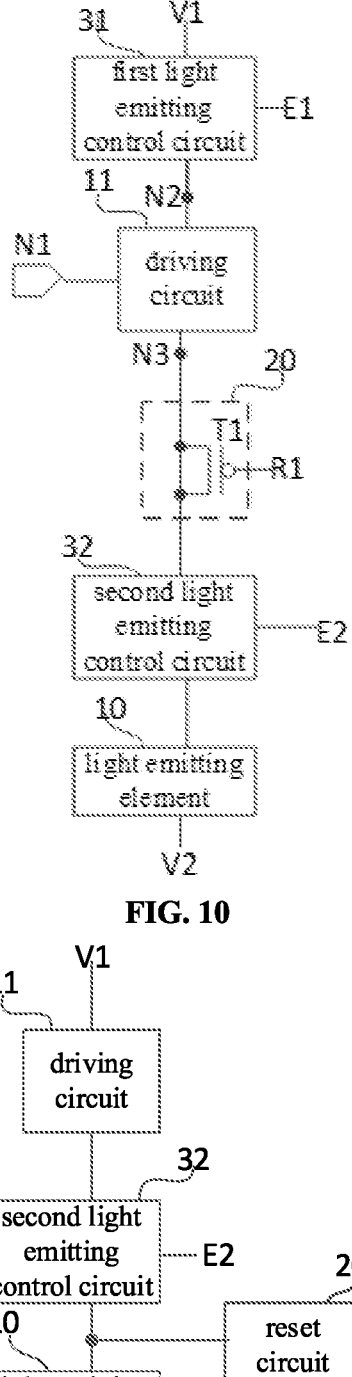
FIG. 10 is a structural diagram of a pixel driving circuit according to at least one embodiment of the present disclosure.
FIG. 11 is a structural diagram of a pixel driving circuit according to at least one embodiment of the present disclosure.

As shown in FIG. 10, on the basis of at least one embodiment of the pixel driving circuit shown in FIG. 3, the reset circuit 20 may include a first transistor T1;

The gate electrode of the first transistor T1 is electrically connected to the reset control line R1, the source electrode of the first transistor T1 is electrically connected to the third connection point, and the drain electrode of the first transistor T1 is electrically connected to the fourth connection point, the third connection point is a connection point on the second connection line between the second terminal of the driving circuit 11 and the first electrode of the light emitting element 10, and the fourth connection point is another connection point on the second connecting line.

In FIG. 10, the first node labeled N1 is electrically connected to the control terminal of the driving circuit 11, the second node labeled N2 is electrically connected to the first terminal of the driving circuit 11, and the third node labeled N3 is electrically connected to the second terminal of the driving circuit 11.

When at least one embodiment of the pixel driving circuit shown in FIG. 10 of the present disclosure is working, in the initialization phase, R1 provides a low voltage signal, and T1 is turned on. At this time, T1 is equivalent to a capacitor, which can keep the potential of N3 stable. At this time, the potential of N3 can be the sum of the voltage value of VDD and the potential of the reset control signal provided by R1, so as to improve the hysteresis phenomenon of T0. When R1 provides a high voltage signal, T1 is turned off, which does not affect the pixel driving circuit to drive the light emitting element to emit light.

As shown in FIG. 11, on the basis of at least one embodiment of the pixel driving circuit shown in FIG. 2, the pixel driving circuit described in at least one embodiment of the present disclosure may further include a light emitting element 10 and a second light emitting control circuit 32;

The first terminal of the driving circuit 11 is electrically connected to the first voltage line V1;

The second light emitting control circuit 32 is electrically connected to the second light emitting control line E2, and the second terminal of the driving circuit 11 is electrically connected to the first electrode of the light emitting element 10, is configured to control the connection between the second terminal of the driving circuit 11 and the first electrode of the light emitting element 10 under the control of the second light emitting control signal provided by the second light emitting control line E2;

The second electrode of the light emitting element 10 is electrically connected to the second voltage line V2;

The reset circuit 20 is electrically connected to the second terminal of the driving circuit 11, and is used for initializing the potential of the second terminal of the driving circuit 11 in an initialization phase.

When at least one embodiment of the pixel driving circuit shown in FIG. 11 is working, in the light emitting phase, the second light emitting control circuit 32 is configured to control to connect the second terminal of the driving circuit and the first electrode of the light emitting element 10 under the control of the second light emitting control signal.

Optionally, the reset circuit includes a first capacitor, a first electrode plate of the first capacitor is electrically connected to the second light emitting control line, and the first capacitor is electrically connected to the second terminal of the driving circuit; or, The reset circuit includes a first transistor, a control electrode of the first transistor is electrically connected to the reset control line, the control electrode of the first transistor is electrically connected to the reset voltage line, and a second electrode of the first transistor is electrically connected to the second terminal of the driving circuit; or, The reset circuit includes a first transistor; the control electrode of the first transistor is electrically connected to the reset control line, the first electrode of the first transistor is electrically connected to the third connection point, and the second electrode of the first transistor is electrically connected to the fourth connection point, the third connection point is a connection point on the second connection line between the second terminal of the driving circuit and the first electrode of the light emitting element, the fourth connection point is another connection point on the second connection line.

Optionally, when the reset circuit includes a first capacitor, the first capacitor is a capacitor formed between the second light emitting control line and a conductive pattern; the second light emitting control line is formed by a metal layer, the conductive pattern is formed by another metal layer included in the pixel driving circuit.

In at least one embodiment of the present disclosure, the pixel driving circuit further includes an energy storage circuit, a data writing-in circuit, a compensation control circuit, an on-off control circuit, a first initialization circuit and a second initialization circuit;

The energy storage circuit is electrically connected to the control terminal of the driving circuit and is configured to store electric energy;

The data writing-in circuit is respectively electrically connected to a second scanning line, a data line and the first terminal of the driving circuit, and is configured to control to write a data voltage on the data line into the first terminal of the driving circuit under the control of a second scanning signal provided by the second scanning line;

The on-off control circuit is electrically connected to the first scanning line, the control terminal of the driving circuit and the connection node, and is configured to control to connect the control terminal of the driving circuit and the connection node under the control of the first scanning signal;

The compensation control circuit is electrically connected to the second scanning line, the connection node and the second terminal of the driving circuit, and is configured to control to connect the connection node and the second terminal of the driving circuit under the control of the second scanning signal provided by the second scanning line;

The first initialization circuit is respectively electrically connected to the reset control line, the first initial voltage line and the connection node, and is configured to write to the first initial voltage provided by the first initial voltage line into the connection node under the control of the reset control signal provided by the reset control line;

The second initialization circuit is electrically connected to the third scanning line, the second initial voltage line and the first electrode of the light emitting element respectively, and is configured to write the second initial voltage provided by the second initial voltage line into the first electrode of the light emitting element under the control of the third scanning signal provided by the third scanning line.

In specific implementation, the pixel driving circuit described in at least one embodiment of the present disclosure may further include an energy storage circuit, a data writing-in circuit, a compensation control circuit, an on-off control circuit, a first initialization circuit and a second initialization circuit, the on-off control circuit and the first initialization circuit cooperate with each other to write the first initial voltage into the control terminal of the driving circuit during the initialization phase, and the second initialization circuit writes the second initial voltage into the first electrode of the light emitting element under the control of the third scanning signal, so that the light emitting element does not emit light, and the residual charge of the first electrode of the light emitting element is cleared.

Optionally, the third scanning line may be a first light emitting control line or a second light emitting control line, and the transistors included in the second initialization circuit may be oxide thin film transistors. Usually, in order to solve the flicker problem, a high-frequency control signal is required to reset the potential of the first electrode of the light emitting element, and the first light emitting control signal provided by the first light emitting control line and the second light emitting control signal provided by the second light emitting control line are high-frequency signals, which can solve the problem of increased power consumption caused by changing the signal controlling the gate electrode of the transistor included in the second initialization circuit into a high-frequency signal.

Optionally, the transistors included in the on-off control circuit are oxide thin film transistors. In order to reduce the current leakage of the control terminal of the driving circuit, it can ensure the stability of the voltage of the control terminal of the driving circuit when working at low frequency, which is beneficial to improve the display quality, improve the display uniformity, and reduce flicker.

Figure 12:
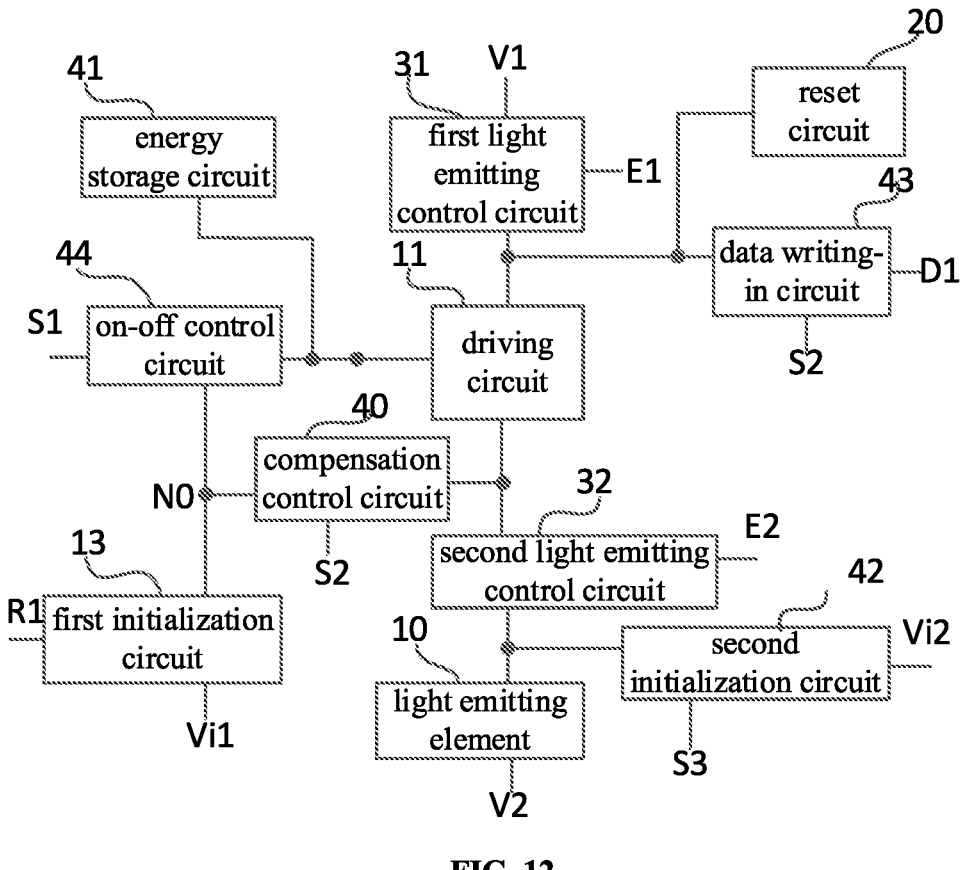
FIG. 12 is a structural diagram of a pixel driving circuit according to at least one embodiment of the present disclosure.

As shown in FIG. 12, on the basis of at least one embodiment of the pixel driving circuit shown in FIG. 3, the pixel driving circuit further includes an energy storage circuit 41, a data writing-in circuit 43, a compensation control circuit 40, an on-off control circuit 44, a first initialization circuit 13 and a second initialization circuit 42;

The energy storage circuit 41 is electrically connected to the control terminal of the driving circuit 11, is used for storing electric energy;

The data writing-in circuit 43 is electrically connected to the second scanning line S2, the data line D1 and the first terminal of the driving circuit 11, and is used to control to write the data voltage on the data line D1 into the first terminal of the driving circuit 11 under the control of the second scanning signal provided by the second scanning line S2;

The on-off control circuit 44 is electrically connected to the first scanning line S1, the control terminal of the driving circuit 11 and the connection node N0, and is used to control to connect the control terminal of the driving circuit 11 and the connection node N0 under the control of the first scanning signal;

The compensation control circuit 40 is electrically connected to the second scanning line S2, the connection node N0 and the second terminal of the driving circuit 11, and is used to control to connect the connection node N0 and the second terminal of the driving circuit 11 under the control of the second scanning signal provided by the second scanning line S2;

The first initialization circuit 13 is electrically connected to the reset control line R1, the first initial voltage line and the connection node N0 respectively, and is used to control to write the first initial voltage Vi1 provided by the first initial voltage line into the connection node N0 under the control of the reset control signal provided by the reset control line R1;

The second initialization circuit 42 is electrically connected to the third scanning line S3, the second initial voltage line and the first electrode of the light emitting element 10, and is used to control to write the second initial voltage Vi2 provided by the second initial voltage line into the first electrode of the light emitting element 10 under the control of the third scanning signal provided by the third scanning line S3.

When at least one embodiment of the pixel driving circuit shown in FIG. 12 of the present disclosure is in operation, the display period may include an initialization phase, a data writing-in phase, and a light emitting phase that are set successively;

In the initialization phase, the on-off control circuit 44 controls the connection between the control terminal of the driving circuit 11 and the connection node N0 under the control of the first scanning signal, and the first initialization circuit 13 writes the first initial voltage Vi1 into the connection node N0 under the control of the reset control signal, so as to write the first initial voltage Vi1 into the control terminal of the driving circuit 11; the second initialization circuit 42 writes the second initial voltage Vi2 provided by the second initial voltage line into the first electrode of the light emitting element 10 under the control of the third scanning signal, so as to control the light emitting element 10 not to emit light, and remove the residual charge of the first electrode of the light emitting element 10;

In the data writing-in phase, the data writing-in circuit 43 controls to write the data voltage on the data line D1 into the first terminal of the driving circuit 11 under the control of the first scanning signal, and the compensation control circuit 40 controls the connection between the connection node N0 and the second terminal of the driving circuit 11 under the control of the second scanning signal;

At the beginning of the data writing-in phase, the driving transistor in the driving circuit 11 is turned on, so as to charge the energy storage circuit with the data voltage, and change the potential of the control terminal of the driving circuit 11 until the driving transistor is turned off;

In the light emitting phase, the first light emitting control circuit 31 controls the connection between the first terminal of the driving circuit 11 and the first voltage line V1 under the control of the first light emitting control signal, and the second light emitting control circuit 32 controls the connection between the second terminal of the driving circuit 11 and the first electrode of the light emitting element 10 under the control of the second light emitting control signal, and the driving circuit 11 drives the light emitting element 10 to emit light.

Figure 13:
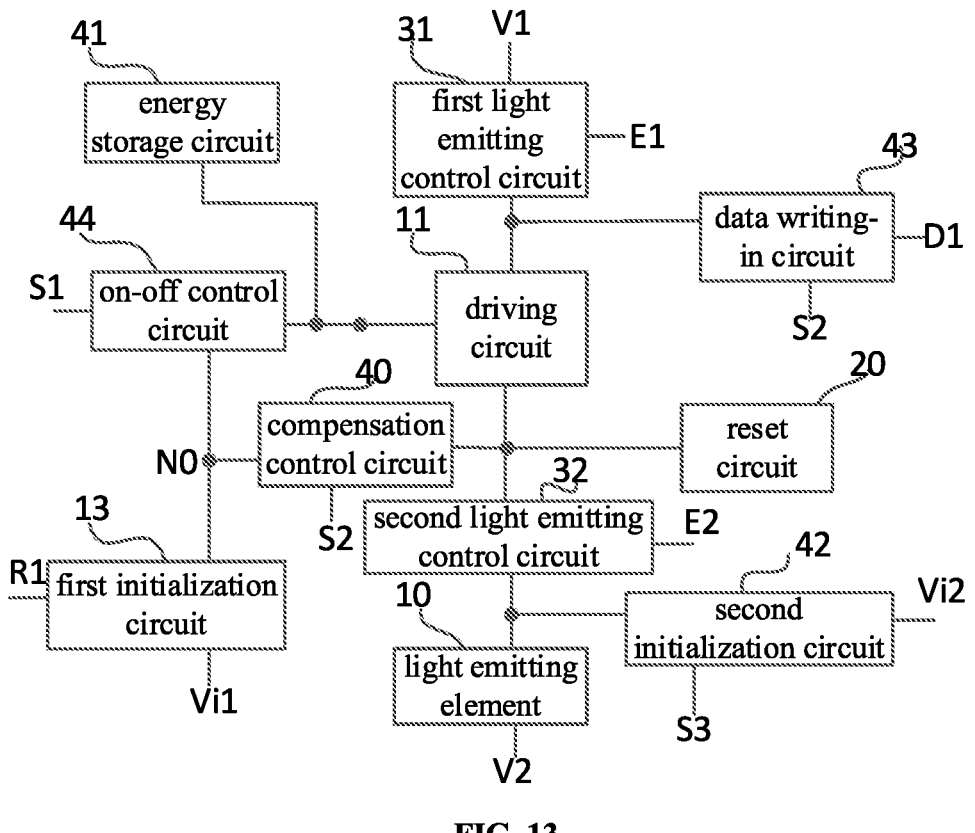
FIG. 13 is a structural diagram of a pixel driving circuit according to at least one embodiment of the present disclosure.

As shown in FIG. 13, on the basis of at least one embodiment of the pixel driving circuit shown in FIG. 4, the pixel driving circuit further includes an energy storage circuit 41, a data writing-in circuit 43, a compensation control circuit 40, an on-off control circuit 44, a first initialization circuit 13 and a second initialization circuit 42;

The energy storage circuit 41 is electrically connected to the control terminal of the driving circuit 11 and is used for storing electric energy;

The data writing-in circuit 43 is electrically connected to the first scanning line S1, the data line D1 and the first terminal of the driving circuit 11, and is used to control to write the data voltage on the data line D1 into the first terminal of the driving circuit 11 under the control of the first scanning signal provided by the first scanning line S1;

The on-off control circuit 44 is electrically connected to the first scanning line S1, the control terminal of the driving circuit 11 and the connection node N0, and is used to control the connection between the control terminal of the driving circuit 11 and the connection node N0 under the control of the first scanning signal;

The compensation control circuit 40 is electrically connected to the second scanning line S2, the connection node N0 and the second terminal of the driving circuit 11, and is used to control to connect the connection node N0 and the second terminal of the driving circuit 11 under the control of the second scanning signal provided by the second scanning line S2;

The first initialization circuit 13 is electrically connected to the reset control line R1, the first initial voltage line and the connection node N0 respectively, and is used to write first initial voltage Vi1 provided by the first initial voltage line into the connection node N0 under the control of the reset control signal provided by the reset control line R1;

The second initialization circuit 42 is electrically connected to the third scanning line S3, the second initial voltage line and the first electrode of the light emitting element 10, and is used to write the second initial voltage Vi2 provided by the second initial voltage line into the first electrode of the light emitting element 10 under the control of the third scanning signal provided by the third scanning line S3.

When at least one embodiment of the pixel driving circuit shown in FIG. 13 of the present disclosure is in operation, the display period may include an initialization phase, a data writing-in phase, and a light emitting phase that are set successively;

In the initialization phase, the on-off control circuit 44 controls the connection between the control terminal of the driving circuit 11 and the connection node N0 under the control of the first scanning signal, and the first initialization circuit 13 writes the first initial voltage Vi1 into the connection node N0 under the control of the reset control signal, so as to write the first initial voltage Vi1 into the control terminal of the driving circuit 11; the second initialization circuit 42 writes the second initial voltage Vi2 provided by the second initial voltage line into the first electrode of the light emitting element 10 under the control of the third scanning signal, so as to control the light emitting element 10 not to emit light, and remove the residual charge of the first electrode of the light emitting element 10;

In the data writing-in phase, the data writing-in circuit 43 controls to write the data voltage on the data line D1 into the first terminal of the driving circuit 11 under the control of the first scanning signal, and the compensation control circuit 40 controls the connection between the connection node N0 and the second terminal of the driving circuit 11 under the control of the second scanning signal;

At the beginning of the data writing-in phase, the driving transistor in the driving circuit 11 is turned on, so as to charge the energy storage circuit with the data voltage, and change the potential of the control terminal of the driving circuit 11 until the driving transistor is turned off;

In the light emitting phase, the first light emitting control circuit 31 controls the connection between the first terminal of the driving circuit 11 and the first voltage line V1 under the control of the first light emitting control signal, and the second light emitting control circuit 32 controls the connection between the second terminal of the driving circuit 11 and the first electrode of the light emitting element 10 under the control of the second light emitting control signal, and the driving circuit 11 drives the light emitting element 10 to emit light.

Figure 14:
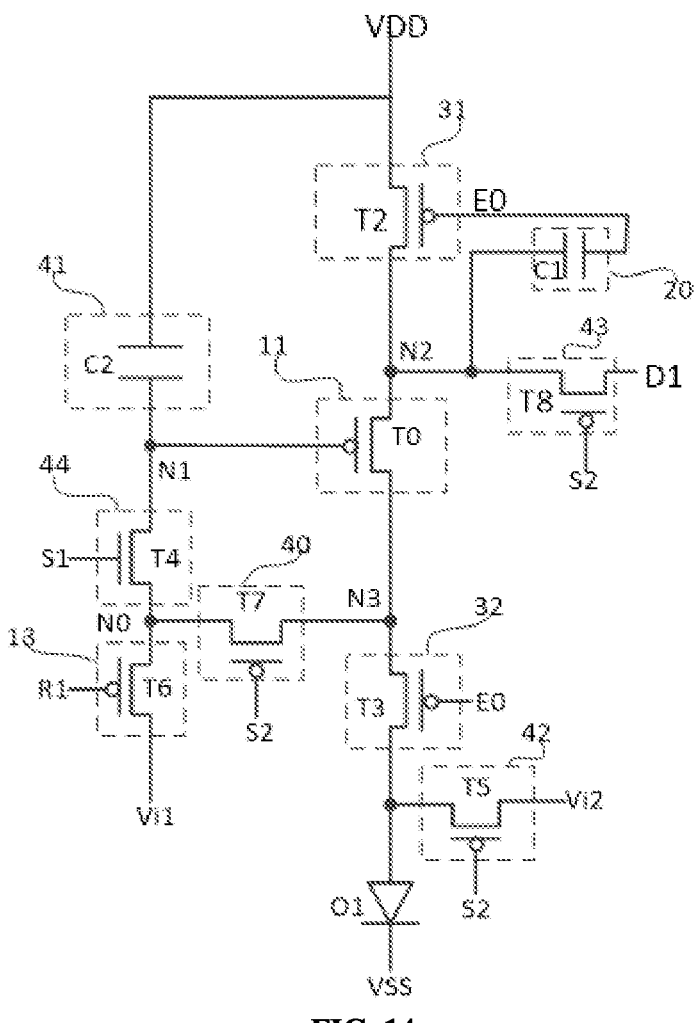
FIG. 14 is a circuit diagram of a pixel driving circuit according to at least one embodiment of the present disclosure.

As shown in FIG. 14, on the basis of the embodiment of the pixel driving circuit shown in FIG. 12, the reset circuit 20 includes a first capacitor C1; the first light emitting control circuit 31 includes a second transistor T2, and the second light emitting control circuit 32 includes a third transistor T3; the on-off control circuit 44 includes a fourth transistor T4; the second initialization circuit 42 includes a fifth transistor T5; the first initialization circuit 13 includes a sixth transistor T6, the compensation control circuit 40 includes a seventh transistor T7, the data writing-in circuit 43 includes an eighth transistor T8, the driving circuit 11 includes a driving transistor T0, and the energy storage circuit 41 includes a second capacitor C2; the light emitting element is an organic light emitting diode O1;

The first light emitting control line and the second light emitting control line are the same light emitting control line E0;

The first electrode plate of C1 is electrically connected to the light emitting control line E0, and the second electrode plate of C1 is electrically connected to the source electrode of T0;

The gate electrode of T2 is electrically connected to the light emitting control line E0, the source electrode of T2 is electrically connected to the high voltage line, and the drain electrode of T2 is electrically connected to the source electrode of T0; the high voltage line is used to provide a high voltage VDD;

The gate electrode of T3 is electrically connected to the light emitting control line E0, the source electrode of T3 is electrically connected to the drain electrode of T0, and the drain electrode of T3 is electrically connected to the anode of O1;

The gate electrode of T4 is electrically connected to the first scanning line S1, the source electrode of T4 is electrically connected to the gate electrode of T0, and the drain electrode of T4 is electrically connected to the connection node N0;

The gate electrode of T5 is electrically connected to the reset control line R1, the source electrode of T5 is electrically connected to the second initial voltage line, and the drain electrode of T5 is electrically connected to the anode of O1; the second initial voltage line is used to provide the second initial voltage Vi2;

The gate electrode of T6 is electrically connected to the reset control line R1, the source electrode of T6 is electrically connected to the first initial voltage line, and the drain electrode of T6 is electrically connected to the connection node N0; the first initial voltage line is used to provide the first initial voltage Vi1;

The gate electrode of T7 is electrically connected to the second scanning line S2, the source electrode of T7 is electrically connected to the connection node N0, and the drain electrode of T7 is electrically connected to the drain electrode of T0;

The gate electrode of T8 is electrically connected to the second scanning line S2, the source electrode of T8 is electrically connected to the data line D1, and the drain electrode of T8 is electrically connected to the source electrode of T0;

The first electrode plate of C is electrically connected to the gate electrode of T0, and the second electrode plate of C is electrically connected to the high voltage line;

The cathode of O1 is electrically connected to a low voltage line and is used for providing a low voltage VSS.

In at least one embodiment of the pixel driving circuit shown in FIG. 14, the third scanning line is a reset control line R1; Vi2 may be the same as Vi1 or different from Vi2.

In at least one embodiment of the pixel driving circuit shown in FIG. 14, T4 is an oxide thin film transistor, and other transistors are low temperature polysilicon thin film transistors; but not limited thereto.

In at least one embodiment of the pixel driving circuit described in the present disclosure, the voltage value of Vi1 may be greater than or equal to −6V and less than or equal to −2V, for example, the voltage value of Vi1 may be −2V, −3V, −4V, −5V or −6V, etc., but not limited to this;

Vth can be greater than or equal to −5V and less than or equal to −0.5V; for example, Vth can be −2.5V or −3V, etc.;

The voltage value of VDD can be greater than or equal to 3V and less than or equal to 6V, for example, the voltage value of VDD can be 4.6V; but not limited thereto;

The absolute value of the voltage value of VDD may be greater than 1.5 times the absolute value of Vth, for example, the absolute value of the voltage value of VDD may be 1.6 times, 1.8 times, or 2 times the absolute value of Vth.

Optionally, the voltage value of VSS may be greater than or equal to −6V and less than or equal to −3V; for example, the voltage value of VSS may be −5V, −4V or −3V.

In at least one embodiment of the present disclosure, the voltage value of Vi2 may be greater than or equal to −7V and less than or equal to 0V. For example, the voltage value of the second initialization voltage may be −6V, −5V, −4V, −3V or −2V; but not limited thereto.

Optionally, the voltage difference between the voltage value of Vi2 and the voltage value of VSS needs to be smaller than the turn-on voltage of the light emitting element, so that when the first electrode of the light emitting element is connected to Vi2, the light emitting element does not emit light.

Figure 15A:
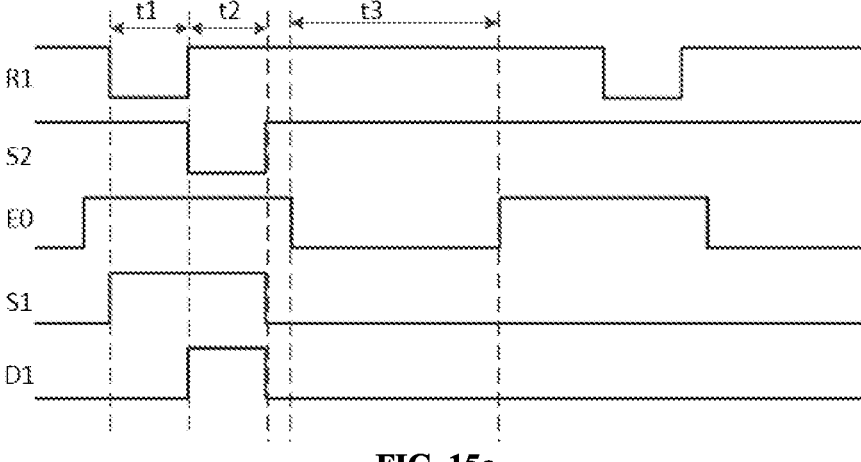
FIG. 15*a* is a working timing diagram of the pixel driving circuit shown in FIG. 14.

As shown in FIG. 15a, when at least one embodiment of the pixel driving circuit shown in FIG. 14 of the present disclosure is in operation, the display period includes an initialization phase t1, a data writing-in phase t2, and a light emitting phase t3 which are set successively;

In the initialization phase t1, the potential of the light emitting control signal provided by E0 is converted from the low voltage Vgl to the high voltage Vgh, R1 provides a low voltage signal, S1 provides a high voltage signal, S2 provides a high voltage signal, T6 and T4 are turned on, and Vi1 is written into N1, the potential of N2 becomes VDD+(Vgh−Vgl), at this time the gate-source voltage of T0 is less than the threshold voltage Vth of T0, TO is in the turned-on and biased state; T5 is turned on, Vi2 is written into the anode of O1, O1 does not emit light, and the residual charge of the anode of O1 is cleared;

In the data writing-in phase t2, R1 provides a high voltage signal, S1 provides a high voltage signal, S2 provides a low voltage signal, E0 provides a high voltage signal, T7 and T8 are turned on, T4 is turned on, and the data voltage Vdata on D1 is written into N2, N1 is connected to N3, and charges C2 through Vdata to change the potential of the gate electrode of T0 until TO is turned off, and the potential of the gate electrode of T0 becomes Vdata+Vth;

In the light emitting phase t3, R1 provides a high-voltage signal, S1 provides a low-voltage signal, S2 provides a high-voltage signal, E0 provides a low-voltage signal, T2 and T3 are turned on, TO is turned on, and TO drives O1 to emit light. At this time, the light emitting current of O1 is 0.5 K(Vdata−VDD)2; K is the current coefficient of T0.

Figure 15B:
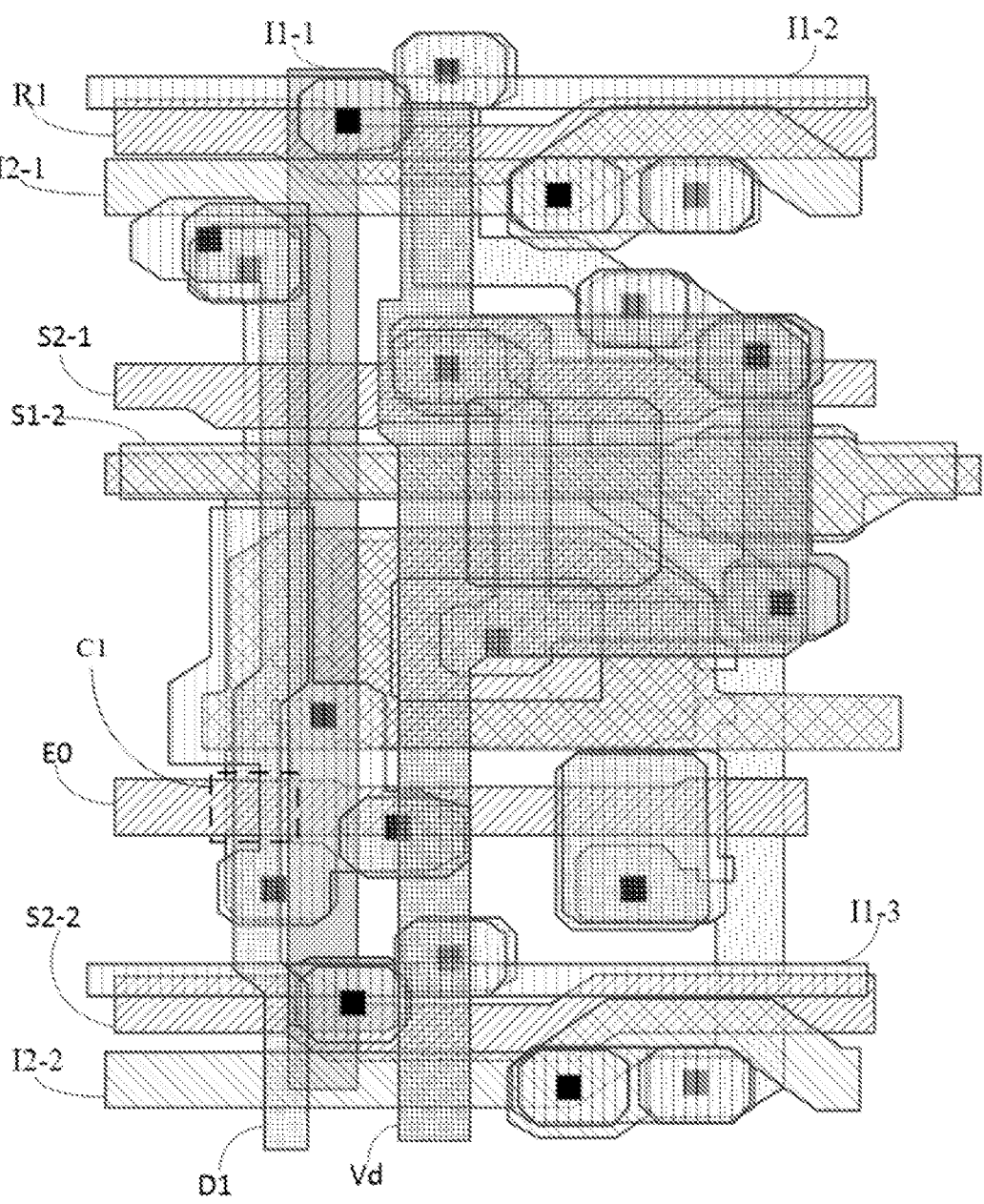
FIG. 15*b* is a schematic diagram of the layout corresponding to FIG. 14.
Figure 15C:
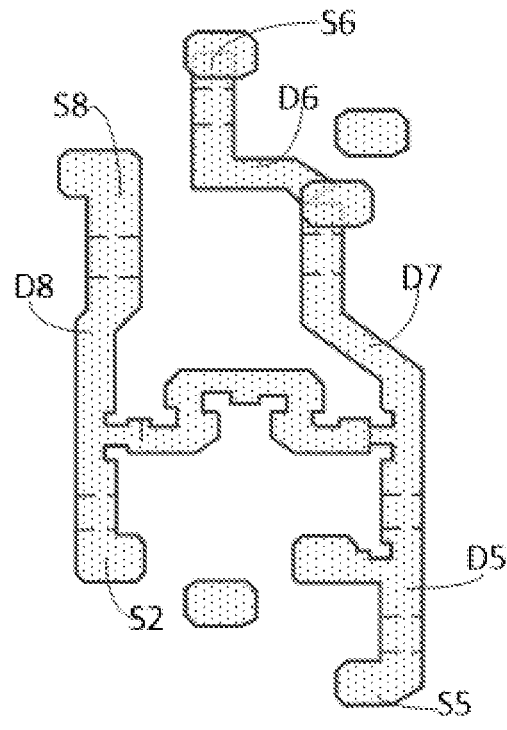
FIG. 15*c* is a schematic layout diagram of the first semiconductor layer in FIG. 15*b*.
Figure 15D:
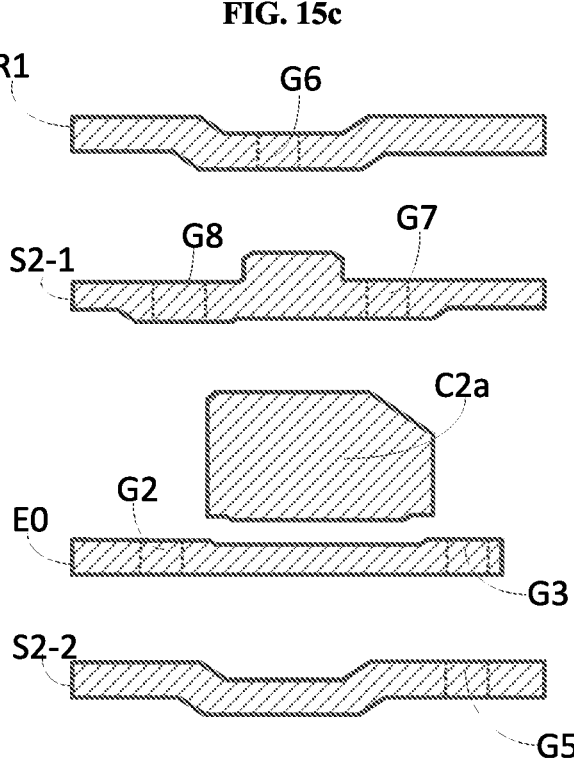
FIG. 15*d* is a schematic layout diagram of the first gate metal layer in FIG. 15*b*.
Figure 15E:
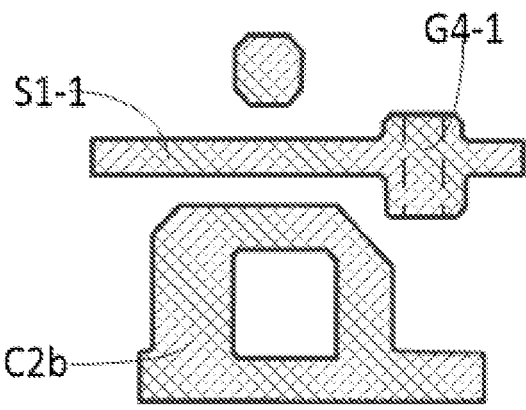
FIG. 15*e* is a schematic layout diagram of the second gate metal layer in FIG. 15*b*.
Figure 15F:
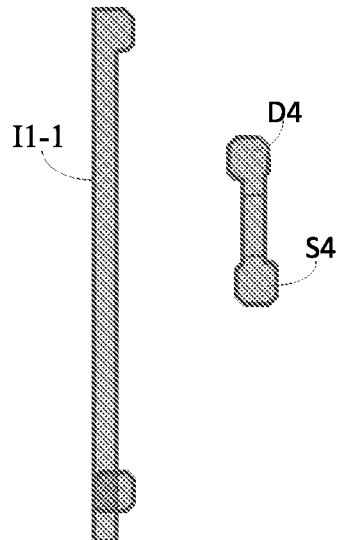
FIG. 15*f* is a schematic layout diagram of the second semiconductor layer in FIG. 15*b*.
Figure 15G:
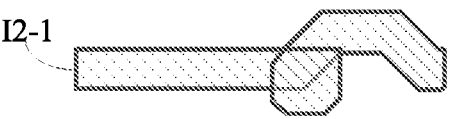
FIG. 15*g* is a schematic diagram of the third gate metal layer in FIG. 15*b*.
Figure 15G:
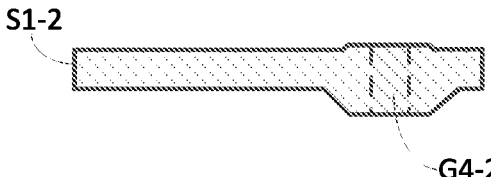
Figure 15G:
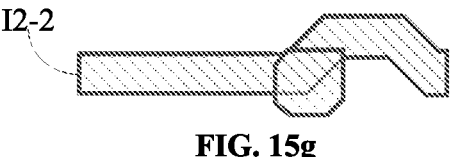
Figure 15H:
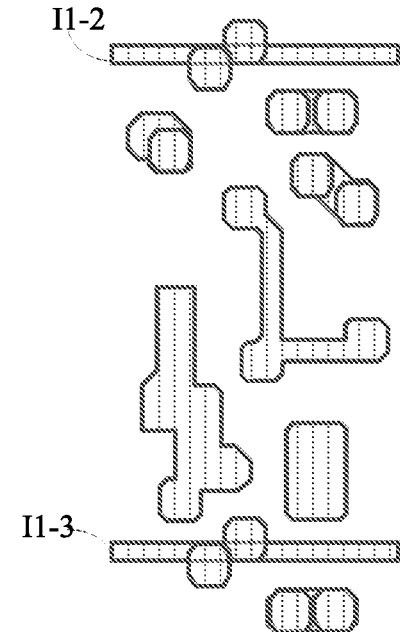
FIG. 15*h* is a schematic layout diagram of the first source-drain metal layer in FIG. 15*b*.
Figure 15I:
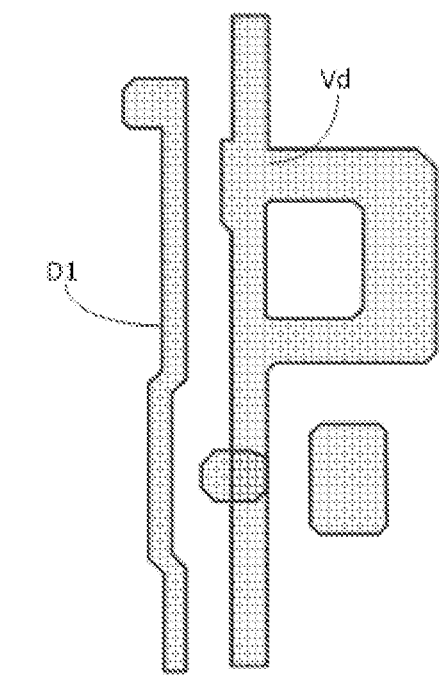
FIG. 15*i* is a schematic layout diagram of the second source-drain metal layer in FIG. 15*b*.
Figure 15J:
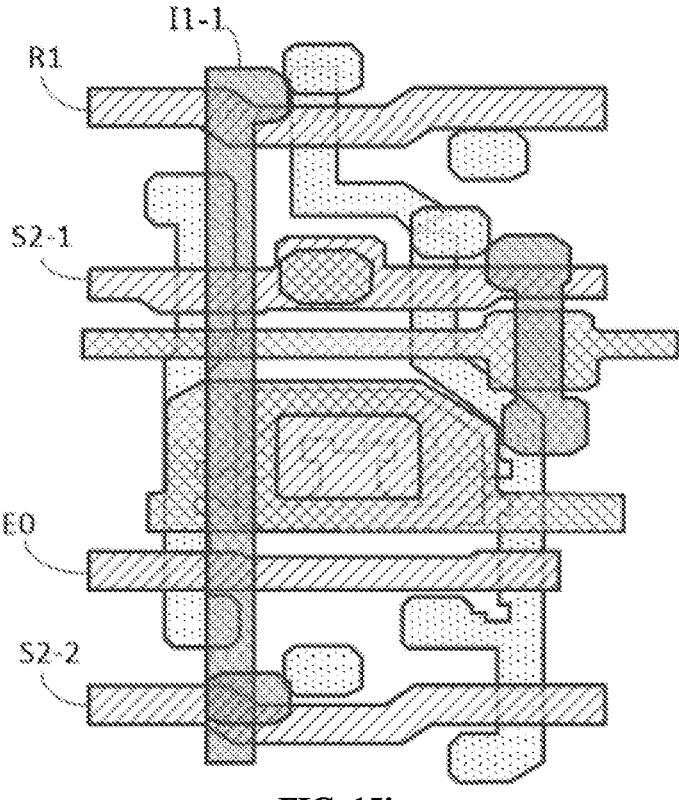
FIG. 15*j* is a superimposed view of the first semiconductor layer, the first gate metal layer, the second gate metal layer and the second semiconductor layer in FIG. 15*b*.
Figure 15K:
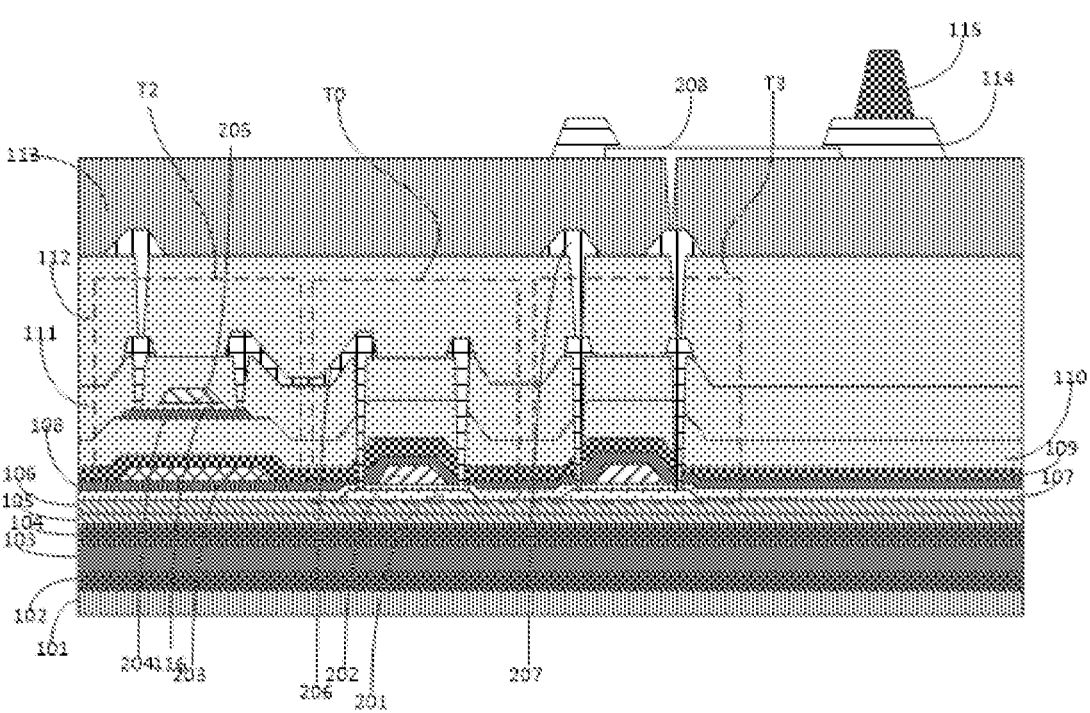
FIGS. 15*k*-15*o* are cross-sectional views of a display panel including the pixel driving circuit shown in FIG. 15*b*.
Figure 15L:
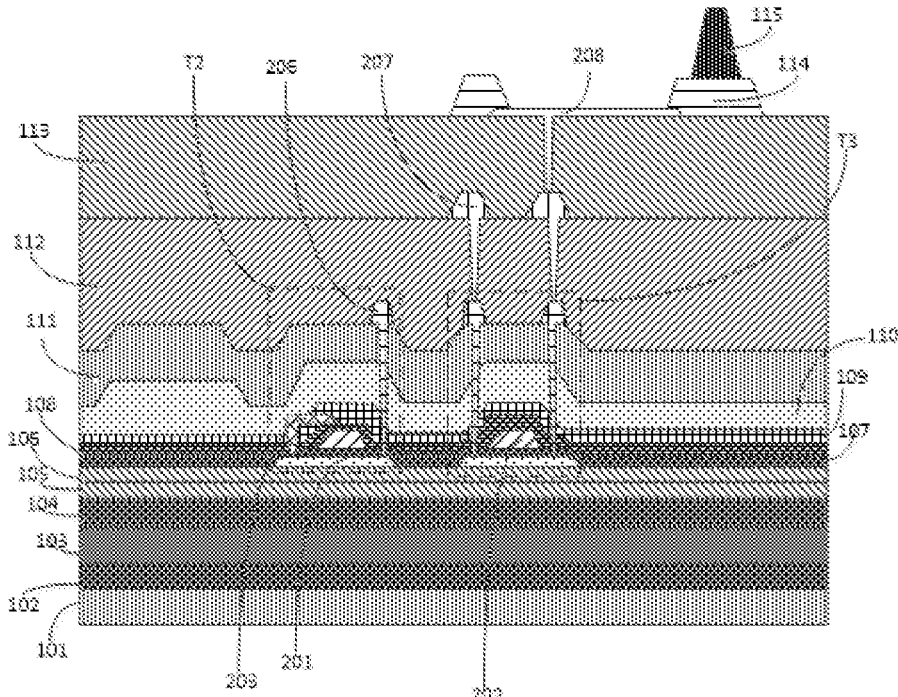
Figure 15M:
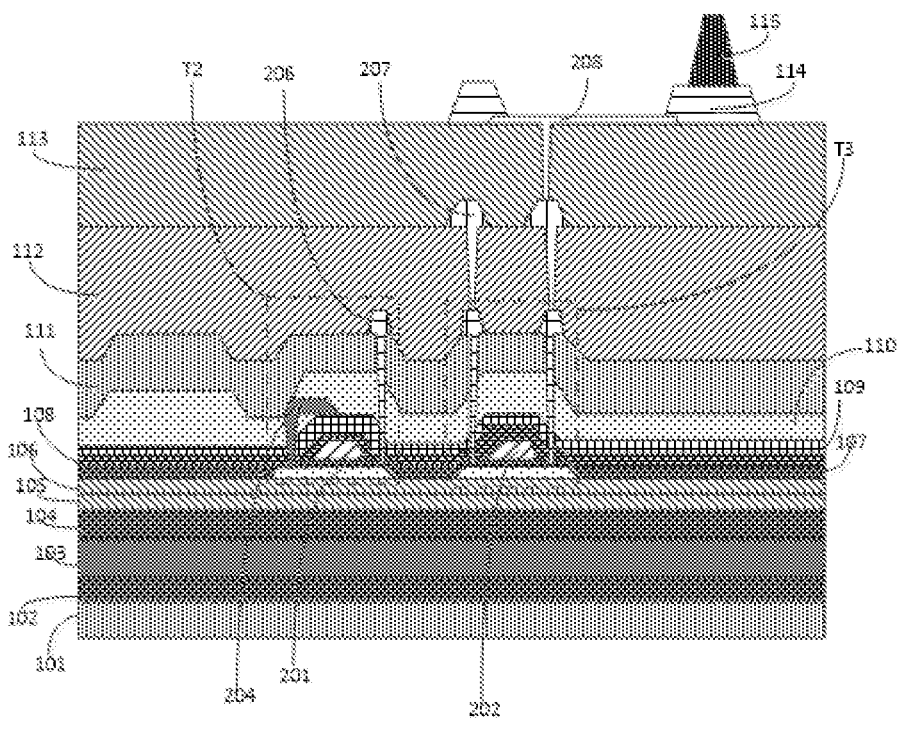
Figure 15N:
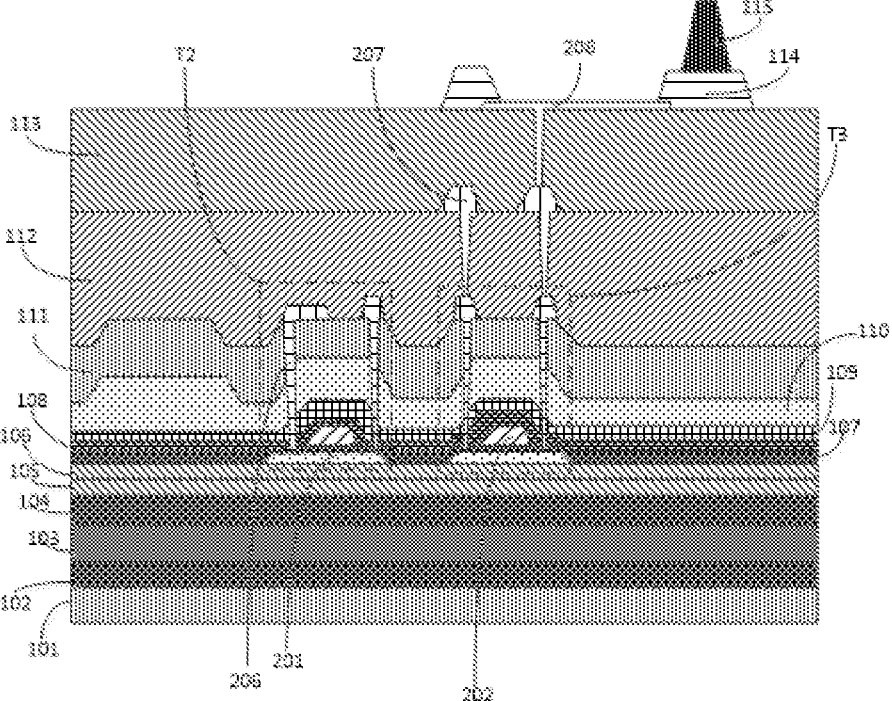
Figure 15O:
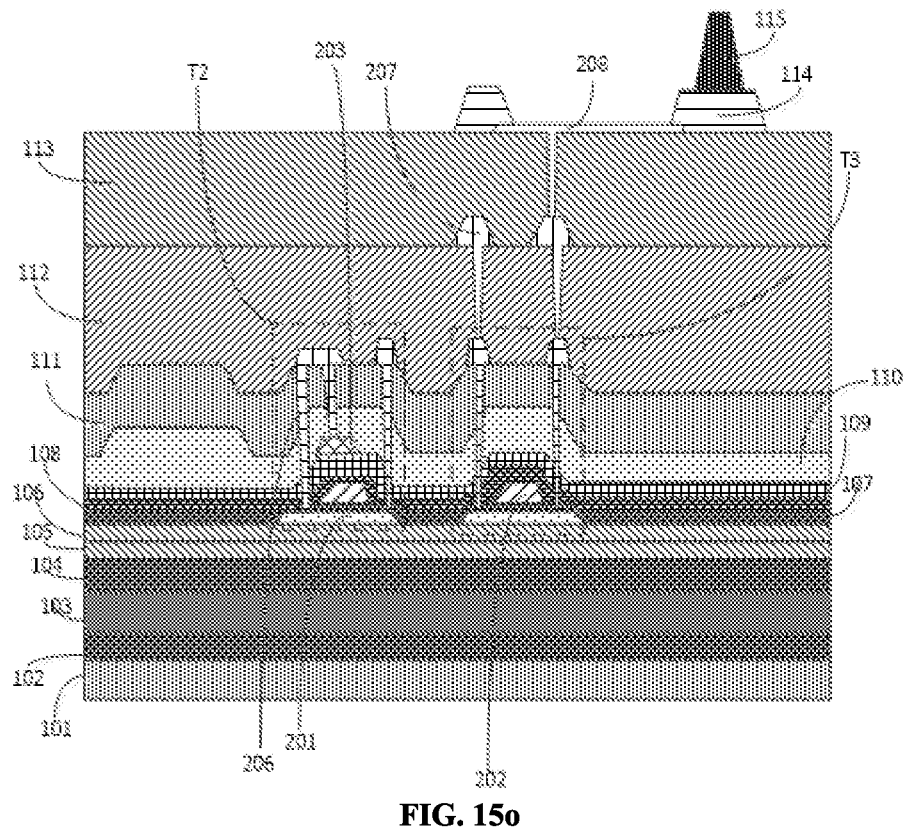
Figure 15P:
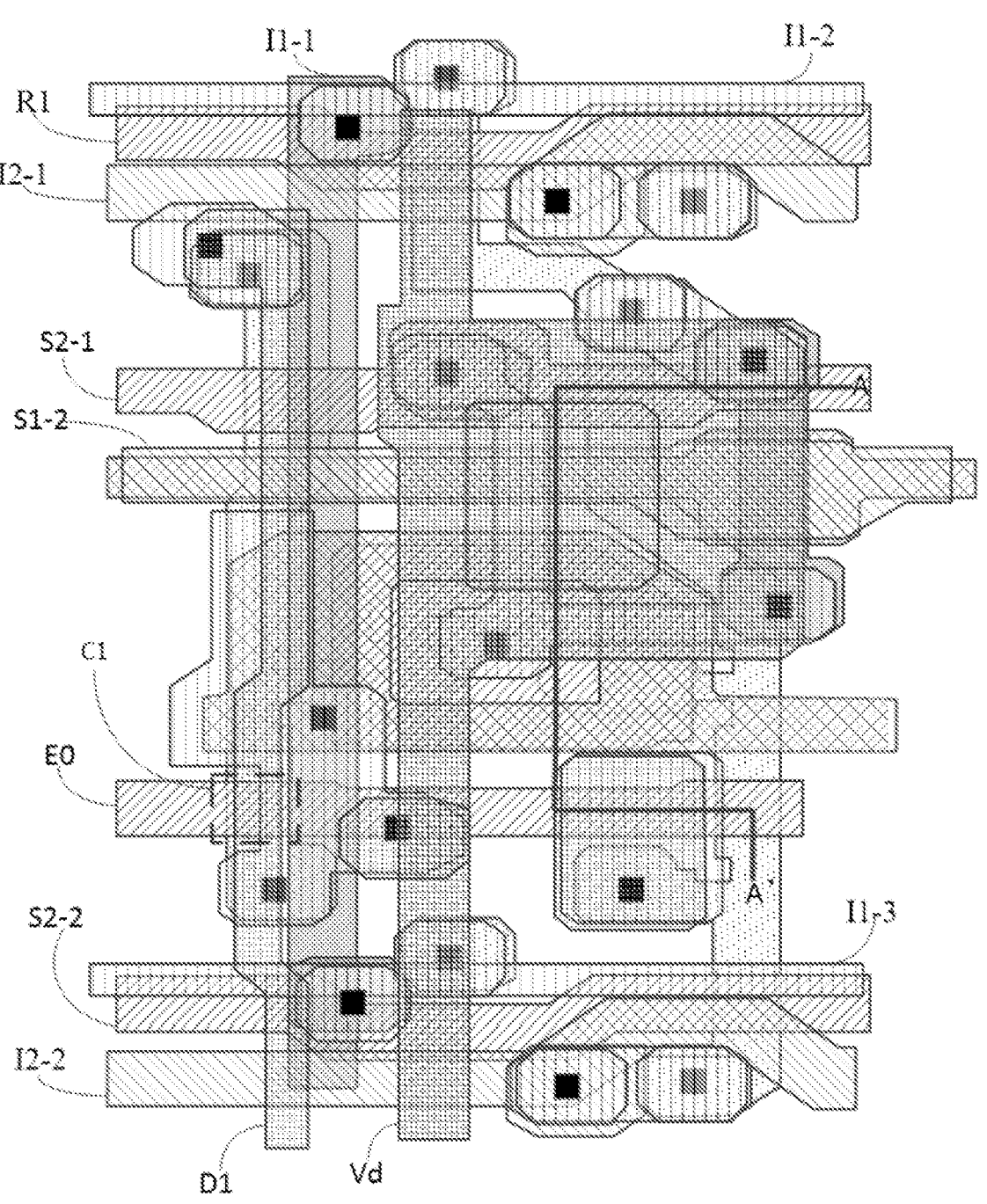
FIG. 15*p* is a schematic diagram of adding the first section line on the basis of FIG. 15*b*.
Figure 15Q:
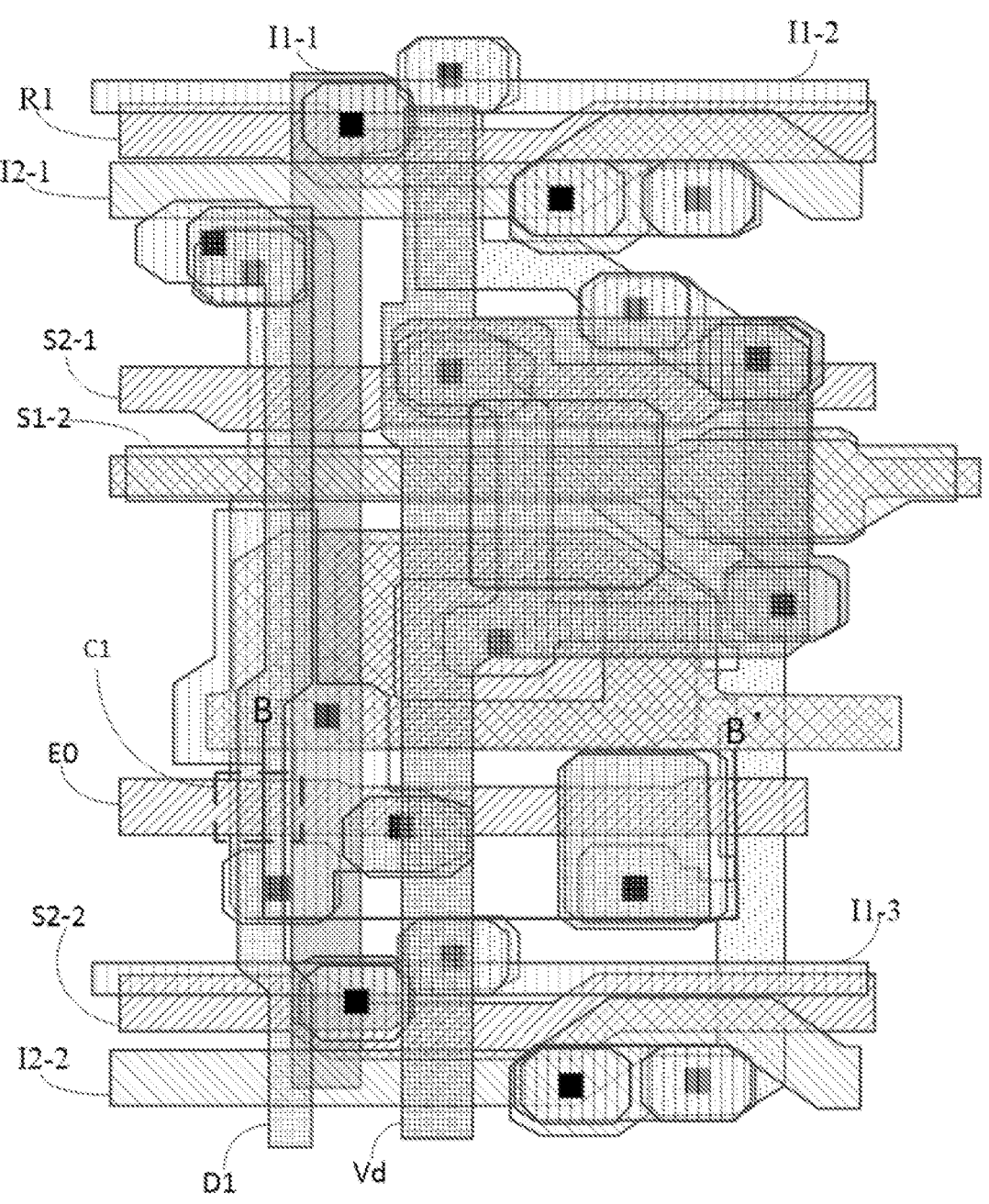
FIG. 15*q* is a schematic diagram of adding a second section line on the basis of FIG. 15*b*.
Figure 15R:
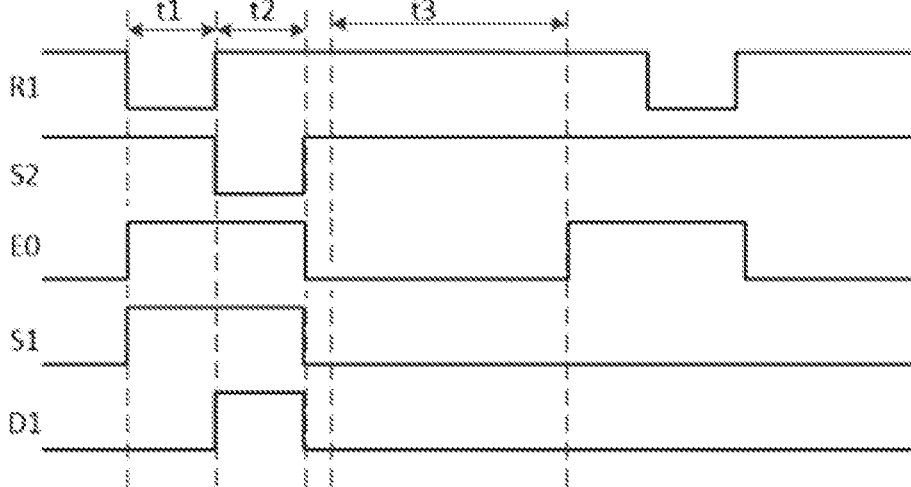
FIG. 15*r* is a working timing diagram of the pixel driving circuit shown in FIG. 14.

During operation of at least one embodiment of the pixel driving circuit shown in FIG. 14 of the present disclosure, as shown in FIG. 15r, the pulse width of the light emitting control signal provided by E0 may be the same as the pulse width of the first scanning signal provided by S1.

By setting the time sequence of the light emitting control signal as shown in FIG. 15r, it may happen that T2 and T3 cannot be turned off correctly during the initialization phase. Based on this, in at least one embodiment of the present disclosure, the pulse width of the light emitting control signal provided by E0 may also be greater than the pulse width of the first scanning signal provided by S1 by a predetermined time, and the predetermined time may be less than or equal to 0.5H, 1H is the scanning time of one row, to ensure that when initialization is performed, under the control of the light emitting control signal, T2 and T3 are turned off, so as to disconnect the high voltage line from the source electrode of T0, and to disconnect the drain electrode of T0 from the anode of O1, so that O1 does not emit light, so as not to affect the light emitting.

Figure 18:
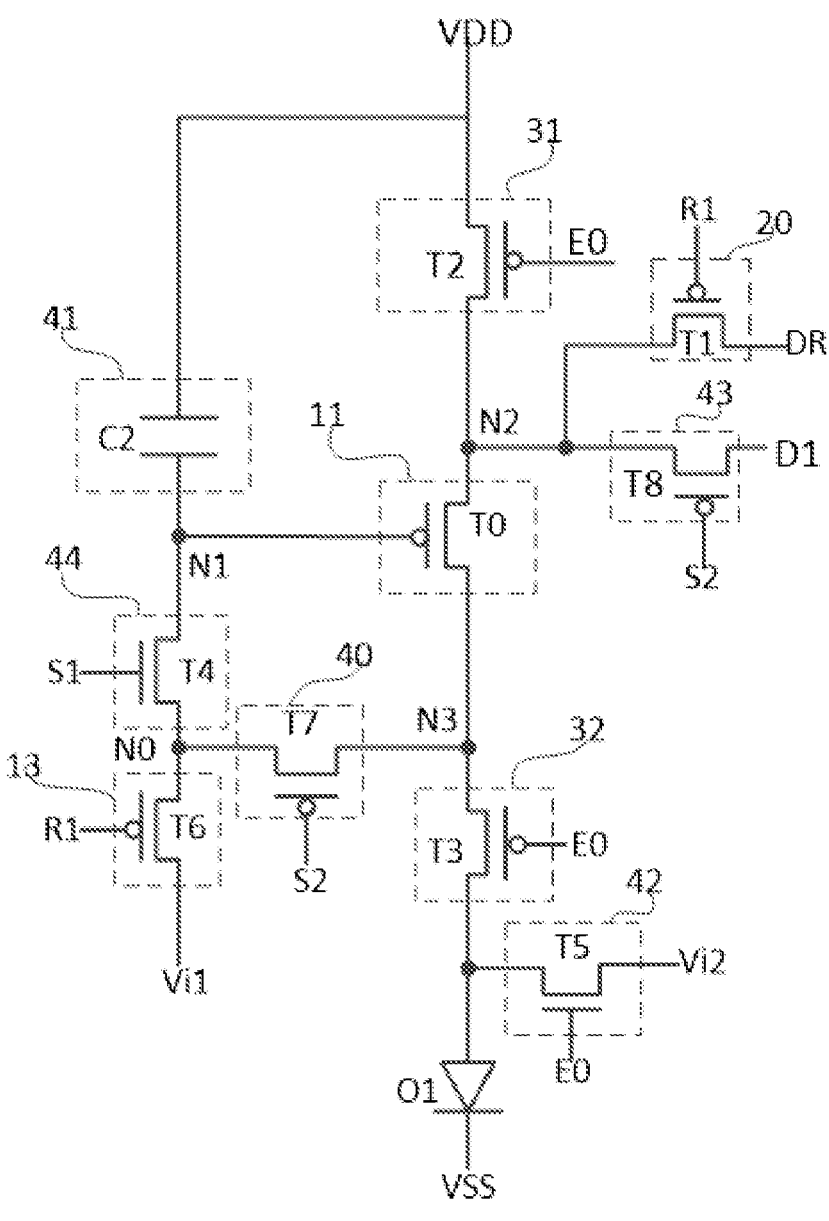
FIG. 18 is a circuit diagram of a pixel driving circuit according to at least one embodiment of the present disclosure.
Figure 20:
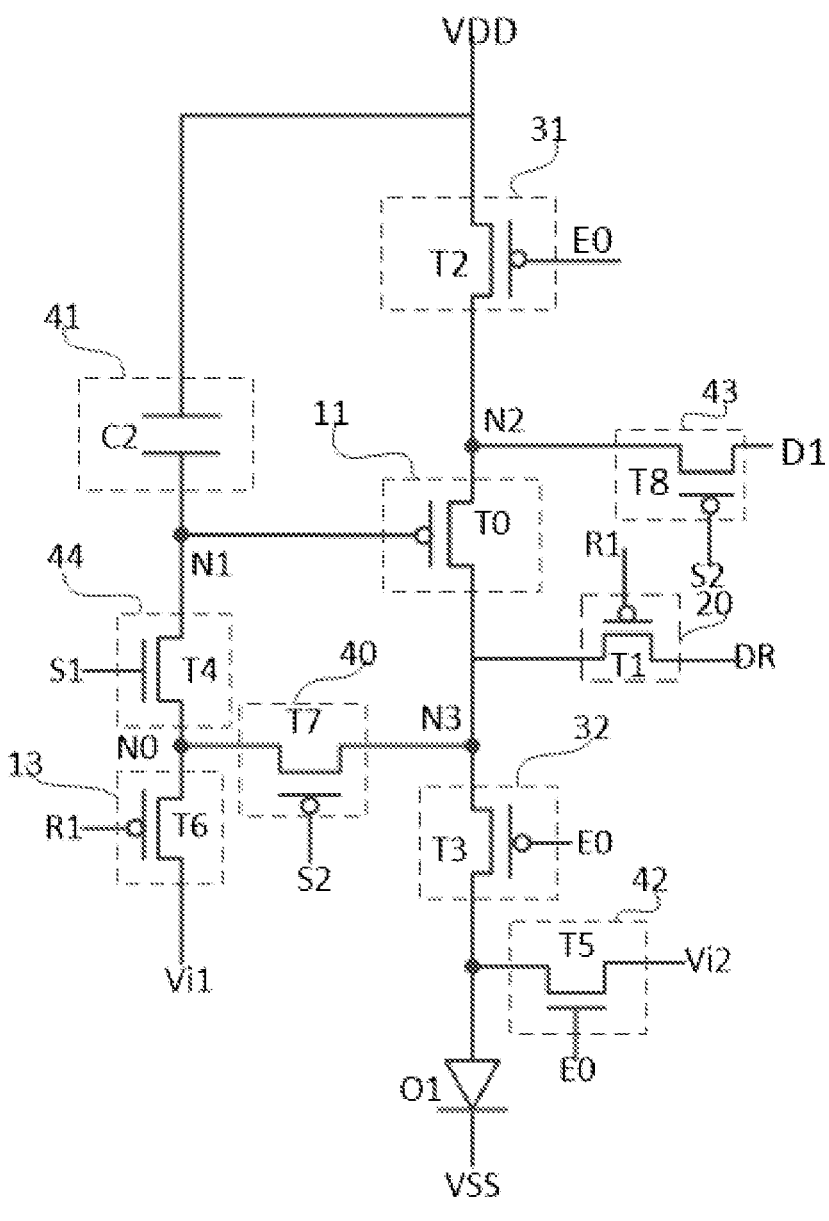
FIG. 20 is a circuit diagram of a pixel driving circuit according to at least one embodiment of the present disclosure.
Figure 22:
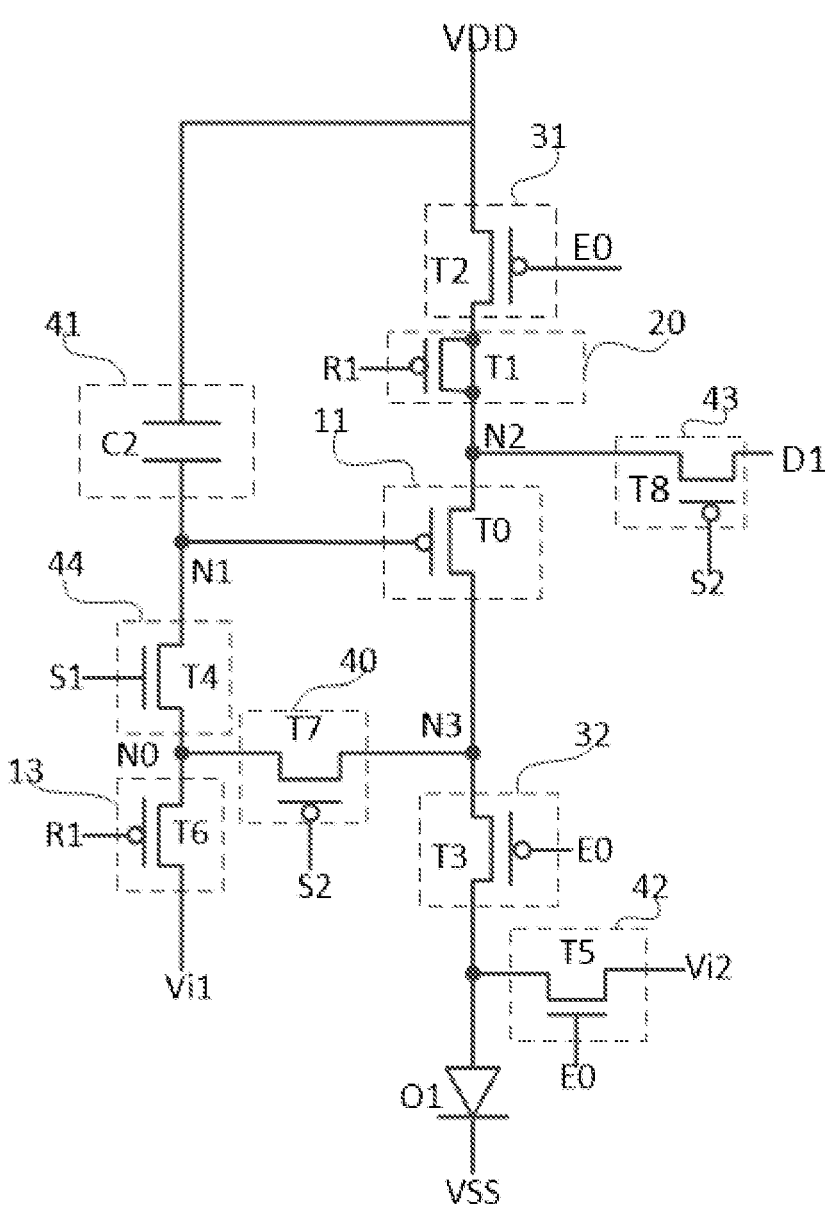
FIG. 22 is a circuit diagram of a pixel driving circuit according to at least one embodiment of the present disclosure.

When at least one embodiment of the pixel circuit shown in FIG. 18, FIG. 20, and FIG. 22 of the present disclosure is working, the pulse width of the light emitting control signal provided by E0 can also be the same as the pulse width of the first scanning signal provided by S1, Alternatively, the pulse width of the light emitting control signal provided by E0 may also be greater than the pulse width of the first scanning signal provided by S1 by a predetermined time. FIG. 15b is a schematic diagram of the layout corresponding to FIG. 14.

FIG. 15c is a schematic layout diagram of the first semiconductor layer in FIG. 15b, FIG. 15d is a schematic layout diagram of the first gate metal layer in FIG. 15b; FIG. 15e is a schematic layout diagram of the second gate metal layer in FIG. 15b; FIG. 15f is a schematic layout diagram of the second semiconductor layer in FIG. 15b; FIG. 15g is a schematic layout diagram of the third gate metal layer in FIG. 15b; FIG. 15h is a schematic layout diagram of the first source-drain metal layer in FIG. 15b; FIG. 15i is a schematic layout diagram of the second source-drain metal layer in FIG. 15b; FIG. 15j is a superposition diagram of the first semiconductor layer, the first gate metal layer, the second gate metal layer and the second semiconductor layer in FIG. 15b.

In FIG. 15c, the one labeled S8 is the source electrode of T8, the one labeled D8 is the drain electrode of T8, the one labeled S2 is the source electrode of T2, the one labeled S6 is the source electrode of T6, and the one labeled D6 is the drain electrode of T6, the one labeled D7 is the drain electrode of T7, the one labeled D5 is the drain electrode of T5, and the one labeled S5 is the source electrode of T5.

In the schematic layout shown in FIG. 15b-FIG. 15j, D8 is multiplexed as the source electrode of T0 and the drain electrode of T2, D6 is multiplexed as the source electrode of T7, and D7 is multiplexed as the drain electrode of T0 and the source electrode of T3, D5 is multiplexed as the drain electrode of T3.

In FIG. 15d, the one labeled G6 is the gate electrode of T6, the one labeled G7 is the gate electrode of T7, the one labeled G8 is the gate electrode of T8, the one labeled G2 is the gate electrode of T2, and the one labeled G3 is the gate electrode of T3, the one labeled G5 is the gate electrode of T5, the one labeled C2a is the first electrode plate of C2, the one labeled R1 is the reset control line, and the one labeled S2-1 is the first second scanning line, the one labeled S2-2 is the second second scanning line, and the one labeled E0 is the light emitting control line.

In FIG. 15e, the one labeled G4-1 is the first gate electrode of T4, the one labeled S1-1 is the first first scanning line, and the one labeled C2b is the second electrode plate of C2.

In FIG. 15f, the one labeled I1-1 is the first first initial voltage line, the one labeled D4 is the drain electrode of T4, and the one labeled S4 is the source electrode of T4.

In FIG. 15g, the one labeled 12-1 is the first second initial voltage line, the one labeled S1-2 is the second first scanning line, and the one labeled 12-2 is the second second initial voltage line.

In FIG. 15h, the one labeled I1-2 is the second first initial voltage line, and the one labeled I1-3 is the third first initial voltage line.

In FIG. 15i, the one labeled D1 is a data line, and the one labeled Vd is a high voltage line.

In FIG. 15b, the one labeled I1-1 is the first first initial voltage line, the one labeled I1-2 is the second first initial voltage line, the one labeled R1 is the reset control line, and the one labeled 12-1 is the first second initial voltage line, the one labeled S2-1 is the first second scanning line, the one labeled S1-2 is the second first scanning line, and the one labeled E0 is the light emitting control line, the one labeled S2-2 is the second second scanning line, the one labeled I1-3 is the third first initial voltage line, and the one labeled 12-2 is the second second initial voltage line.

In FIG. 15j, the one labeled I1-1 is the first first initial voltage line, the one labeled R1 is the reset control line, the one labeled S2-1 is the first second scanning line, and the one labeled E0 is the light emitting control line, the one labeled S2-2 is the second second scanning line.

In FIG. 15b, the position of the dotted box is the position of C1.

In at least one embodiment of the present disclosure, the first semiconductor layer may be made of low temperature polysilicon (P-Si), and the second semiconductor layer may be made of metal oxide, but not limited thereto.

Moreover, in at least one embodiment of manufacturing the pixel driving circuit as shown in FIG. 15b, the first semiconductor layer, the first gate metal layer, the second gate metal layer, the second semiconductor layer, the third gate metal layer, the first source-drain metal layer and the second source-drain metal layer are arranged in sequence along a direction away from the base substrate.

FIGS. 15k-15o are cross-sectional views of a display panel including at least one embodiment of the pixel driving circuit shown in FIG. 15b.

As shown in FIG. 15k, FIG. 15l, FIG. 15m, FIG. 15n and FIG. 15o, the one labeled 101 is the first substrate, the one labeled 102 is the first barrier layer, the one labeled 103 is the second substrate, and the one labeled 104 is the second barrier layer, the one labeled 105 is the first buffer layer, the one labeled 106 is the second buffer layer, the one labeled 107 is the first gate insulating layer, the one labeled 108 is the first interlayer dielectric layer, and the one labeled 108 is the first interlayer dielectric layer, the one labeled 109 is the second interlayer dielectric layer, the one labeled 110 is the third buffer layer, the one labeled 111 is the third interlayer dielectric layer, the one labeled 112 is the first planarization layer, and the one labeled 113 is the second planarization layer, the one labeled 114 is a pixel definition layer, the one labeled 115 is a spacer, and the one labeled 116 is an insulating layer;

The one labeled 201 is the first semiconductor layer, the one labeled 202 is the first gate metal layer, the one labeled 203 is the second gate metal layer, the one labeled 204 is the second semiconductor layer, and the one labeled 205 is the third gate metal layer, the one labeled 206 is the first source-drain metal layer, the one labeled 207 is the second source-drain metal layer, and the one labeled 208 is the anode layer.

As shown in FIG. 15*k*, the second electrode plate of the first capacitor can be formed by the first source-drain metal layer 206.

As shown in FIG. 15*l*, the second electrode plate of the first capacitor can be formed by the second gate metal layer 203.

As shown in FIG. 15*m*, the second electrode plate of the first capacitor may be formed by the second semiconductor layer 204.

As shown in FIG. 15*n*, the second electrode plate of the first capacitor can be formed by the first source-drain metal layer 206.

As shown in FIG. 15*o*, the second electrode plate of the first capacitor can be formed by connection between the first source-drain metal layer 206 and the second gate metal layer.

In FIG. 15*p*, the first section line A-A' is added on the basis of FIG. 15*b*. In FIG. 15*q*, a second section line A-A' is added on the basis of FIG. 15*b*. FIG. 15*k* may be a cross-sectional view along the first section line A-A', and FIGS. 15*l*-15*o* may be cross-sectional views along the second section line B-B'.

Figure 16:
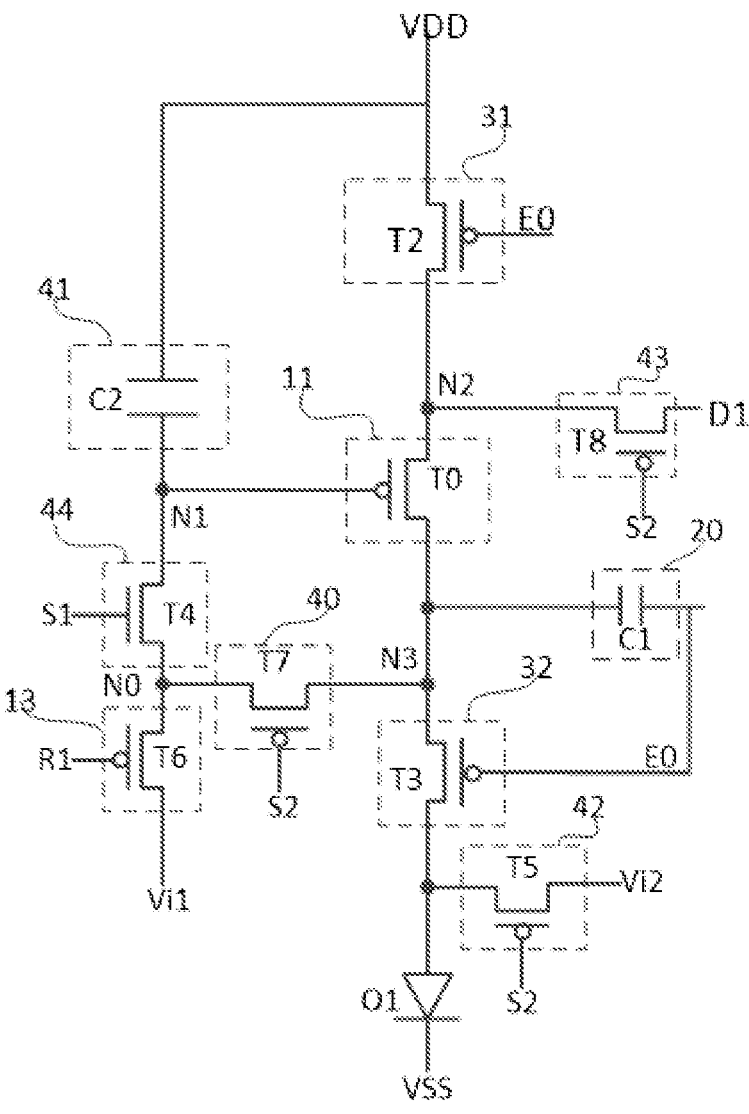
FIG. 16 is a circuit diagram of a pixel driving circuit according to at least one embodiment of the present disclosure.

As shown in FIG. 16, on the basis of the embodiment of the pixel driving circuit shown in FIG. 13, the reset circuit 20 includes a first capacitor C1; the first light emitting control circuit 31 includes a second transistor T2, and the second light emitting control circuit 32 includes a third transistor T3; the on-off control circuit 44 includes a fourth transistor T4; the second initialization circuit 42 includes a fifth transistor T5; the first initialization circuit 13 includes a sixth transistor T6, the compensation control circuit 40 includes a seventh transistor T7, the data writing-in circuit 43 includes an eighth transistor T8, the driving circuit 11 includes a driving transistor T0, and the energy storage circuit 41 includes a second capacitor C2; the light emitting element is an organic light emitting diode O1;

The first light emitting control line and the second light emitting control line are the same light emitting control line E0;

The first electrode plate of C1 is electrically connected to the light emitting control line E0, and the second electrode plate of C1 is electrically connected to the second electrode of TO;

The gate electrode of T2 is electrically connected to the light emitting control line E0, the source electrode of T2 is electrically connected to the high voltage line, and the drain electrode of T2 is electrically connected to the first electrode of T0; the high voltage line is used to provide a high voltage VDD;

The gate electrode of T3 is electrically connected to the light emitting control line E0, the source electrode of T3 is electrically connected to the second electrode of T0, and the drain electrode of T3 is electrically connected to the anode of O1;

The gate electrode of T4 is electrically connected to the first scanning line S1, the source electrode of T4 is electrically connected to the gate electrode of T0, and the drain electrode of T4 is electrically connected to the connection node N0;

The gate electrode of T5 is electrically connected to the reset control line R1, the source electrode of T5 is electrically connected to the second initial voltage line, and the drain electrode of T5 is electrically connected to the anode of O1; the second initial voltage line is used to provide the second initial voltage Vi2;

The gate electrode of T6 is electrically connected to the reset control line R1, the source electrode of T6 is electrically connected to the first initial voltage line, and the drain electrode of T6 is electrically connected to the connection node N0; the first initial voltage line is used to provide the first initial voltage Vi1;

The gate electrode of T7 is electrically connected to the second scanning line S2, the source electrode of T7 is electrically connected to the connection node N0, and the drain electrode of T7 is electrically connected to the second electrode of T0;

The gate electrode of T8 is electrically connected to the second scanning line S2, the source electrode of T8 is electrically connected to the data line D1, and the drain electrode of T8 is electrically connected to the first electrode of T0;

The first electrode plate of C2 is electrically connected to the gate electrode of T0, and the second electrode plate of C2 is electrically connected to the high voltage line;

The cathode of O1 is electrically connected to a low voltage line for providing a low voltage VSS.

In at least one embodiment of the pixel driving circuit shown in FIG. 16, the third scanning line is a reset control line R1; Vi2 may be the same as Vi1 or different from Vi2.

In at least one embodiment of the pixel driving circuit shown in FIG. 16, T4 is an oxide thin film transistor, and other transistors are low temperature polysilicon thin film transistors; but not limited thereto.

The difference between at least one embodiment of the pixel driving circuit shown in FIG. 16 and at least one embodiment of the pixel driving circuit shown in FIG. 14 is that: the second electrode plate of C1 is electrically connected to the second electrode of T0, and in the initialization phase, the potential of N3 is set to VDD+Vgh−Vgl by C1, at this time, the gate-source voltage of T0 is lower than the threshold voltage Vth of T0, and TO is in a turned-on and biased state.

In at least one embodiment of the pixel driving circuit shown in FIG. 16, T5 may be an oxide thin film transistor, and the gate electrode of T5 may be electrically connected to the light emitting control line E0.

Figure 17:
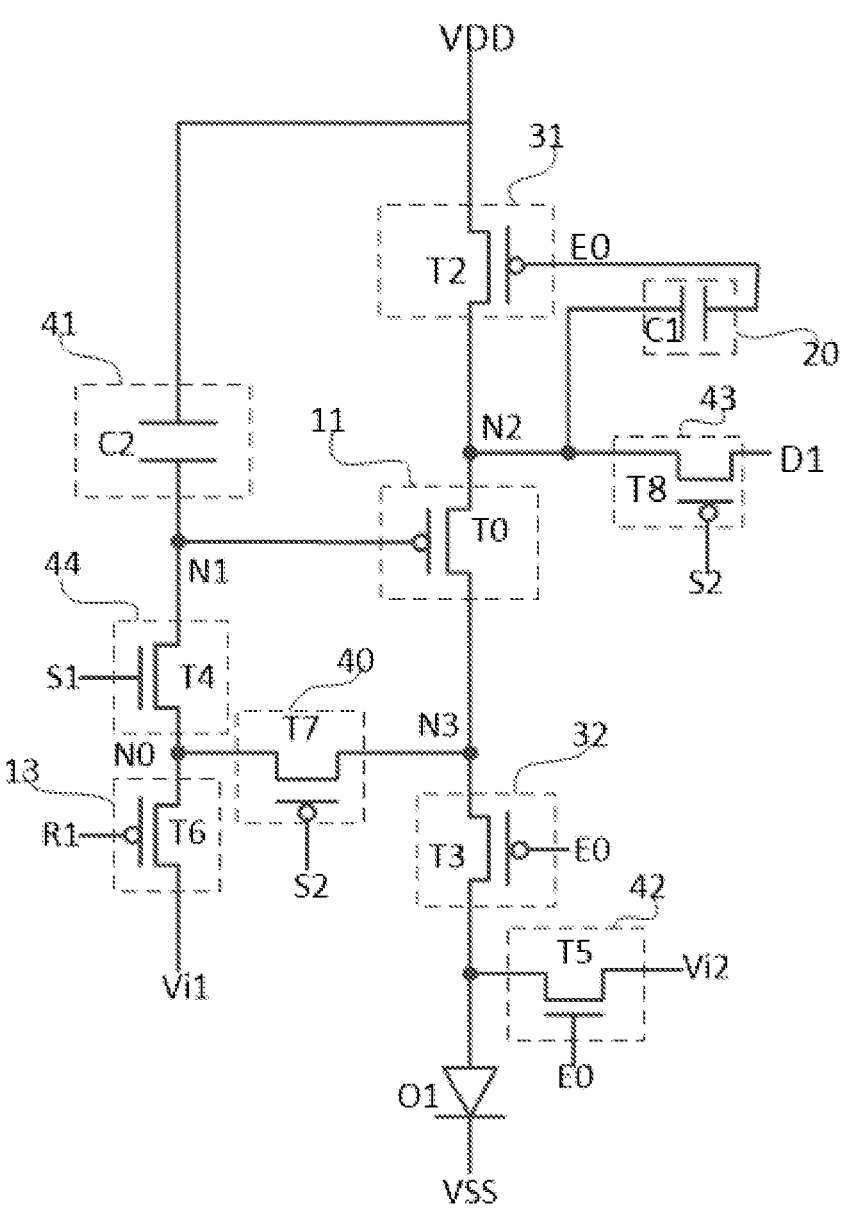
FIG. 17 is a circuit diagram of a pixel driving circuit according to at least one embodiment of the present disclosure.

As shown in FIG. 17, on the basis of the embodiment of the pixel driving circuit shown in FIG. 12, the reset circuit 20 includes a first capacitor C1; the first light emitting control circuit 31 includes a second transistor T2, and the second light emitting control circuit 32 includes a third transistor T3; the on-off control circuit 44 includes a fourth transistor T4; the second initialization circuit 42 includes a fifth transistor T5; the first initialization circuit 13 includes a sixth transistor T6, the compensation control circuit 40 includes a seventh transistor T7, the data writing-in circuit 43 includes an eighth transistor T8, the driving circuit 11 includes a driving transistor T0, and the energy storage circuit 41 includes a second capacitor C2; the light emitting element is an organic light emitting diode O1;

The first light emitting control line and the second light emitting control line are the same light emitting control line E0;

The first electrode plate of C1 is electrically connected to the light emitting control line E0, and the second electrode plate of C1 is electrically connected to the source electrode of T0;

The gate electrode of T2 is electrically connected to the light emitting control line E0, the source electrode of T2 is electrically connected to the high voltage line, and the drain electrode of T2 is electrically connected to the source electrode of T0; the high voltage line is used to provide a high voltage VDD;

The gate electrode of T3 is electrically connected to the light emitting control line E0, the source electrode of T3 is electrically connected to the drain electrode of T0, and the drain electrode of T3 is electrically connected to the anode of O1;

The gate electrode of T4 is electrically connected to the first scanning line S1, the source electrode of T4 is electrically connected to the gate electrode of T0, and the drain electrode of T4 is electrically connected to the connection node N0;

The gate electrode of T5 is electrically connected to the light emitting control line E0, the source electrode of T5 is electrically connected to the second initial voltage line, and the drain electrode of T5 is electrically connected to the anode of O1; the second initial voltage line is used to provide the second initial voltage Vi2;

The gate electrode of T6 is electrically connected to the reset control line R1, the source electrode of T6 is electrically connected to the first initial voltage line, and the drain electrode of T6 is electrically connected to the connection node N0; the first initial voltage line is used to provide the first initial voltage Vi1;

The gate electrode of T7 is electrically connected to the second scanning line S2, the source electrode of T7 is electrically connected to the connection node N0, and the drain electrode of T7 is electrically connected to the drain electrode of T0;

The gate electrode of T8 is electrically connected to the second scanning line S2, the source electrode of T8 is electrically connected to the data line D1, and the drain electrode of T8 is electrically connected to the source electrode of T0;

The first electrode plate of C2 is electrically connected to the gate electrode of T0, and the second electrode plate of C2 is electrically connected to the high voltage line;

The cathode of O1 is electrically connected to a low voltage line for providing a low voltage VSS.

In at least one embodiment of the pixel driving circuit shown in FIG. 17, the third scanning line is the light emitting control line E0; Vi2 may be the same as Vi1 or different from Vi2.

In at least one embodiment of the pixel driving circuit shown in FIGS. 17, T4 and T5 are oxide thin film transistors, and other transistors are low temperature polysilicon thin film transistors; but not limited thereto.

The difference between at least one embodiment of the pixel driving circuit shown in FIG. 17 and at least one embodiment of the pixel driving circuit shown in FIG. 14 is that: T5 is an oxide thin film transistor, and the gate electrode of T5 is electrically connected to E0.

As shown in FIG. 18, on the basis of the embodiment of the pixel driving circuit shown in FIG. 12, the reset voltage 20 includes a first transistor T1; the first light emitting control circuit 31 includes a second transistor T2, and the second light emitting control circuit 32 includes a third transistor T3; the on-off control circuit 44 includes a fourth transistor T4; the second initialization circuit 42 includes a fifth transistor T5; the first initialization circuit 13 includes a sixth transistor T6, the compensation control circuit 40 includes a seventh transistor T7, the data writing-in circuit 43 includes an eighth transistor T8, the driving circuit 11 includes a driving transistor T0, and the energy storage circuit 41 includes a second capacitor C2; the light emitting element is an organic light emitting diode O1;

The first light emitting control line and the second light emitting control line are the same light emitting control line E0;

The gate electrode of T1 is electrically connected to the reset control line R1, the source electrode of T1 is electrically connected to the reset voltage line DR, and the drain electrode of T1 is electrically connected to the source electrode of T0;

The gate electrode of T2 is electrically connected to the light emitting control line E0, the source electrode of T2 is electrically connected to the high voltage line, and the drain electrode of T2 is electrically connected to the source electrode of T0; the high voltage line is used to provide a high voltage VDD;

The gate electrode of T3 is electrically connected to the light emitting control line E0, the source electrode of T3 is electrically connected to the drain electrode of T0, and the drain electrode of T3 is electrically connected to the anode of O1;

The gate electrode of T4 is electrically connected to the first scanning line S1, the source electrode of T4 is electrically connected to the gate electrode of T0, and the drain electrode of T4 is electrically connected to the connection node N0;

The gate electrode of T5 is electrically connected to the reset control line R1, the source electrode of T5 is electrically connected to the second initial voltage line, and the drain electrode of T5 is electrically connected to the anode of O1; the second initial voltage line is used to provide the second initial voltage Vi2;

The gate electrode of T6 is electrically connected to the reset control line R1, the source electrode of T6 is electrically connected to the first initial voltage line, and the drain electrode of T6 is electrically connected to the connection node N0; the first initial voltage line is used to provide the first initial voltage Vi1;

The gate electrode of T7 is electrically connected to the second scanning line S2, the source electrode of T7 is electrically connected to the connection node N0, and the drain electrode of T7 is electrically connected to the drain electrode of T0;

The gate electrode of T8 is electrically connected to the second scanning line S2, the source electrode of T8 is electrically connected to the data line D1, and the drain electrode of T8 is electrically connected to the source electrode of T0;

The first electrode plate of C2 is electrically connected to the gate electrode of T0, and the second electrode plate of C2 is electrically connected to the high voltage line;

The cathode of O1 is electrically connected to a low voltage line for providing a low voltage VSS.

In at least one embodiment of the pixel driving circuit shown in FIG. 18, the third scanning line is a reset control line R1; Vi2 may be the same as Vi1 or different from Vi2.

In at least one embodiment of the pixel driving circuit shown in FIG. 18, T4 is an oxide thin film transistor, and other transistors are low temperature polysilicon thin film transistors; but not limited thereto.

In at least one embodiment of the pixel driving circuit shown in FIG. 18, the reset voltage provided by the DR may be a high voltage.

Figure 19:
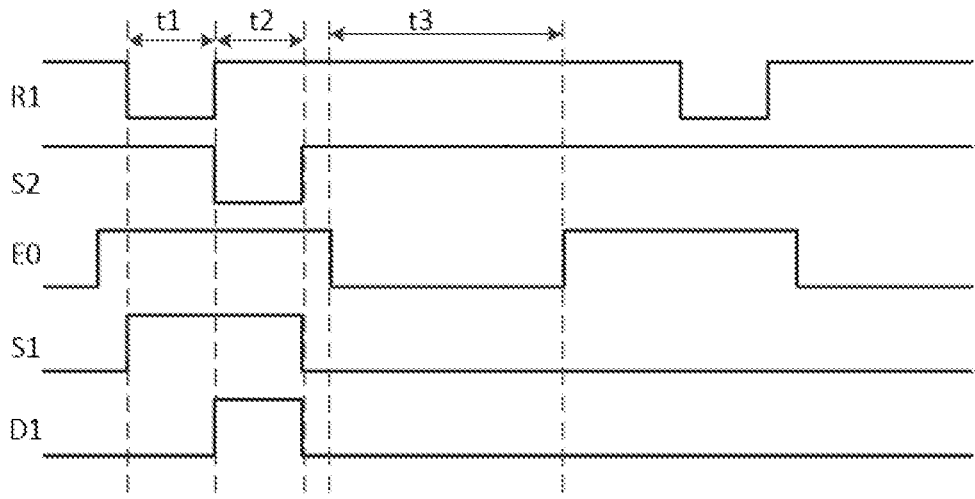
FIG. 19 is a working timing diagram of the pixel driving circuit according to at least one embodiment of the present disclosure shown in FIG. 18.

As shown in FIG. 19, when at least one embodiment of the pixel driving circuit shown in FIG. 20 of the present disclosure is in operation, the display period includes an initialization phase t1, a data writing-in phase t2 and a light emitting phase t3 which are set successively;

In the initialization phase t1, E0 provides a high voltage signal, R1 provides a low voltage signal, S1 provides a high voltage signal, S2 provides a high voltage signal, T6 and T4 are turned on, Vi1 is written into N1, and T1 is turned on to write the reset voltage provided by DR into N2, at this time the gate-source voltage of T0 is less than the threshold voltage Vth of T0, TO is in the turned-on and biased state; T5 is turned on, Vi2 is written into the anode of O1, O1 does not emit light, and the residual charge of the anode of O1 is cleared;

In the data writing-in phase t2, R1 provides a high voltage signal, S1 provides a high voltage signal, S2 provides a low voltage signal, E0 provides a high voltage signal, T7 and T8 are turned on, T4 is turned on, and the data voltage Vdata on D1 is written into N2, N1 is connected to N3, and charges C2 through Vdata to change the potential of the gate electrode of T0 until TO is turned off, and the potential of the gate electrode of T0 becomes Vdata+Vth;

In the light emitting phase t3, R1 provides a high-voltage signal, S1 provides a low-voltage signal, S2 provides a high-voltage signal, E0 provides a low-voltage signal, T2 and T3 are turned on, TO is turned on, and TO drives O1 to emit light. At this time, the light emitting current of O1 is 0.5 K(Vdata−VDD)2; among them, K is the current coefficient of T0.

In at least one embodiment of the pixel driving circuit shown in FIG. 18, the reset voltage provided by the DR can also be Vi1, Vi2 or a low voltage.

In at least one embodiment of the pixel driving circuit shown in FIG. 18, T5 may be an oxide thin film transistor, and the gate electrode of T5 may be electrically connected to the light emitting control line E0.

In at least one embodiment of the pixel driving circuit shown in FIG. 18 and FIG. 19, the reset voltage provided by DR may be a low voltage signal, but not limited thereto; for example, the reset voltage may be Vi1, Vi2 or VSS; at this time, the voltage value of the reset voltage may be greater than or equal to −6V and less than or equal to −2V; for example, the voltage value of the reset voltage may be equal to −6V, −5V, −4V, −3V or −2V; but not limited thereto;

The reset voltage provided by DR can also be a high voltage signal. At this time, the voltage value of the reset voltage can be greater than or equal to 2V and less than or equal to 10V; for example, the voltage value of the reset voltage can be 2V, 3V, 4V, 5V, 6V, 7V, 8V, 9V or 10V, but not limited thereto.

As shown in FIG. 20, on the basis of the embodiment of the pixel driving circuit shown in FIG. 13, the reset circuit 20 includes a first transistor T1; the first light emitting control circuit 31 includes a second transistor T2, and the second light emitting control circuit 32 includes a third transistor T3; the on-off control circuit 44 includes a fourth transistor T4; the second initialization circuit 42 includes a fifth transistor T5; the first initialization circuit 13 includes a sixth transistor T6, the compensation control circuit 40 includes a seventh transistor T7, the data writing-in circuit 43 includes an eighth transistor T8, the driving circuit 11 includes a driving transistor T0, and the energy storage circuit 41 includes a second capacitor C2; the light emitting element is an organic light emitting diode O1;

The first light emitting control line and the second light emitting control line are the same light emitting control line E0;

The gate electrode of T1 is electrically connected to the reset control line R1, the source electrode of T1 is electrically connected to the reset voltage line DR, and the drain electrode of T1 is electrically connected to the second electrode of T0;

The gate electrode of T2 is electrically connected to the light emitting control line E0, the source electrode of T2 is electrically connected to the high voltage line, and the drain electrode of T2 is electrically connected to the first electrode of T0; the high voltage line is used to provide a high voltage VDD;

The gate electrode of T3 is electrically connected to the light emitting control line E0, the source electrode of T3 is electrically connected to the second electrode of T0, and the drain electrode of T3 is electrically connected to the anode of O1;

The gate electrode of T4 is electrically connected to the first scanning line S1, the source electrode of T4 is electrically connected to the gate electrode of T0, and the drain electrode of T4 is electrically connected to the connection node N0;

The gate electrode of T5 is electrically connected to the reset control line R1, the source electrode of T5 is electrically connected to the second initial voltage line, and the drain electrode of T5 is electrically connected to the anode of O1; the second initial voltage line is used to provide the second initial voltage Vi2;

The gate electrode of T6 is electrically connected to the reset control line R1, the source electrode of T6 is electrically connected to the first initial voltage line, and the drain electrode of T6 is electrically connected to the connection node N0; the first initial voltage line is used to provide the first initial voltage Vi1;

The gate electrode of T7 is electrically connected to the second scanning line S2, the source electrode of T7 is electrically connected to the connection node N0, and the drain electrode of T7 is electrically connected to the second electrode of T0;

The gate electrode of T8 is electrically connected to the second scanning line S2, the source electrode of T8 is electrically connected to the data line D1, and the drain electrode of T8 is electrically connected to the first electrode of T0;

The first electrode plate of C2 is electrically connected to the gate electrode of T0, and the second electrode plate of C2 is electrically connected to the high voltage line;

The cathode of O1 is electrically connected to a low voltage line for providing a low voltage VSS.

In at least one embodiment of the pixel driving circuit shown in FIG. 20, the third scanning line is a reset control line R1; Vi2 may be the same as Vi1 or different from Vi1.

In at least one embodiment of the pixel driving circuit shown in FIG. 20, T4 is an oxide thin film transistor, and other transistors are low temperature polysilicon thin film transistors; but not limited thereto.

In at least one embodiment of the pixel driving circuit shown in FIG. 20, the reset voltage provided by the DR may be a high voltage.

Figure 21:
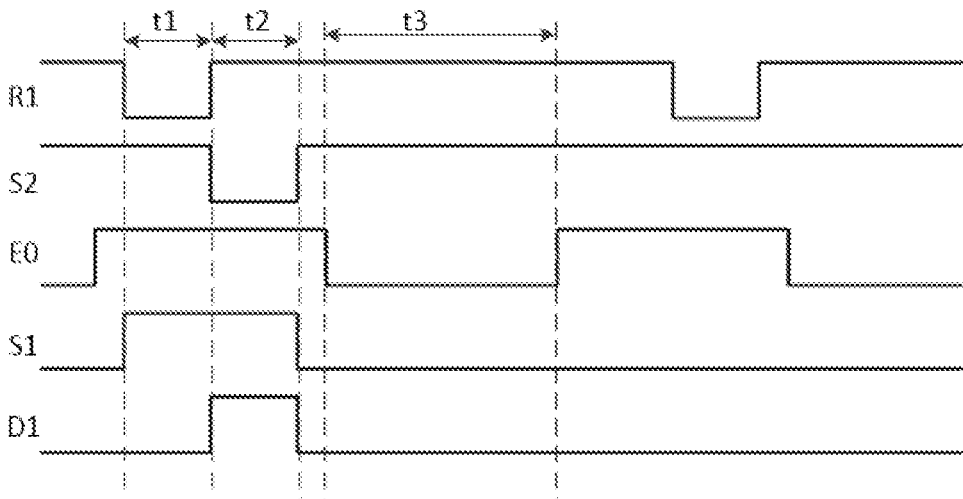
FIG. 21 is a working timing diagram of the pixel driving circuit according to at least one embodiment of the present disclosure shown in FIG. 20.

As shown in FIG. 21, when at least one embodiment of the pixel driving circuit shown in FIG. 20 of the present disclosure is in operation, the display period includes an initialization phase t1, a data writing-in phase t2 and a light emitting phase t3 which are set successively;

In the initialization phase t1, E0 provides a high voltage signal, R1 provides a low voltage signal, S1 provides a high voltage signal, S2 provides a high voltage signal, T6 and T4 are turned on, Vi1 is written into N1, and T1 is turned on to write the reset voltage provided by DR into N3, at this time the gate-source voltage of T0 is less than the threshold voltage Vth of T0, TO is in the turned-on and biased state; T5 is turned on, Vi2 is written into the anode of O1, O1 does not emit light, and the residual charge of the anode of O1 is cleared;

In the data writing-in phase t2, R1 provides a high voltage signal, S1 provides a high voltage signal, S2 provides a low voltage signal, E0 provides a high voltage signal, T7 and T8 are turned on, T4 is turned on, and the data voltage Vdata on D1 is written into N2, N1 is connected to N3, and charges C2 through Vdata to change the potential of the gate electrode of T0 until TO is turned off, and the potential of the gate electrode of T0 becomes Vdata+Vth;

In the light emitting phase t3, R1 provides a high-voltage signal, S1 provides a low-voltage signal, S2 provides a high-voltage signal, E0 provides a low-voltage signal, T2 and T3 are turned on, TO is turned on, and TO drives O1 to emit light. At this time, the light emitting current of O1 is 0.5 K(Vdata−VDD)2; among them, K is the current coefficient of T0.

In at least one embodiment of the pixel driving circuit shown in FIG. 21, the reset voltage provided by the DR can also be Vi1, Vi2 or a low voltage.

In at least one embodiment of the pixel driving circuit shown in FIG. 20, T5 may be an oxide thin film transistor, and the gate electrode of T5 may be electrically connected to the light emitting control line E0.

As shown in FIG. 22, on the basis of the embodiment of the pixel driving circuit shown in FIG. 12, the reset circuit 20 includes a first transistor T1; the first light emitting control circuit 31 includes a second transistor T2, and the second light emitting control circuit 32 includes a third transistor T3; the on-off control circuit 44 includes a fourth transistor T4; the second initialization circuit 42 includes a fifth transistor T5; the first initialization circuit 13 includes a sixth transistor T6, the compensation control circuit 40 includes a seventh transistor T7, the data writing-in circuit 43 includes an eighth transistor T8, the driving circuit 11 includes a driving transistor T0, and the energy storage circuit 41 includes a second capacitor C2; the light emitting element is an organic light emitting diode O1;

The first light emitting control line and the second light emitting control line are the same light emitting control line E0;

The gate electrode of T1 is electrically connected to the reset control line R1, the source electrode of T1 is electrically connected to the drain electrode of T2, and the drain electrode of T1 is electrically connected to the source electrode of T0;

The gate electrode of T2 is electrically connected to the light emitting control line E0, the source electrode of T2 is electrically connected to the high voltage line, and the drain electrode of T2 is electrically connected to the source electrode of T0; the high voltage line is used to provide a high voltage VDD;

The gate electrode of T3 is electrically connected to the light emitting control line E0, the source electrode of T3 is electrically connected to the drain electrode of T0, and the drain electrode of T3 is electrically connected to the anode of O1;

The gate electrode of T4 is electrically connected to the first scanning line S1, the source electrode of T4 is electrically connected to the gate electrode of T0, and the drain electrode of T4 is electrically connected to the connection node N0;

The gate electrode of T5 is electrically connected to the reset control line R1, the source electrode of T5 is electrically connected to the second initial voltage line, and the drain electrode of T5 is electrically connected to the anode of O1; the second initial voltage line is used to provide the second initial voltage Vi2;

The gate electrode of T6 is electrically connected to the reset control line R1, the source electrode of T6 is electrically connected to the first initial voltage line, and the drain electrode of T6 is electrically connected to the connection node N0; the first initial voltage line is used to provide the first initial voltage Vi1;

The gate electrode of T7 is electrically connected to the second scanning line S2, the source electrode of T7 is electrically connected to the connection node N0, and the drain electrode of T7 is electrically connected to the drain electrode of T0;

The gate electrode of T8 is electrically connected to the second scanning line S2, the source electrode of T8 is electrically connected to the data line D1, and the drain electrode of T8 is electrically connected to the source electrode of T0;

The first electrode plate of C2 is electrically connected to the gate electrode of T0, and the second electrode plate of C2 is electrically connected to the high voltage line;

The cathode of O1 is electrically connected to a low voltage line for providing a low voltage VSS.

In at least one embodiment of the pixel driving circuit shown in FIG. 22, the third scanning line is a reset control line R1; Vi2 may be the same as Vi1 or different from Vi1.

In at least one embodiment of the pixel driving circuit shown in FIG. 22, T4 is an oxide thin film transistor, and other transistors are low temperature polysilicon thin film transistors; but not limited thereto.

Figure 23:
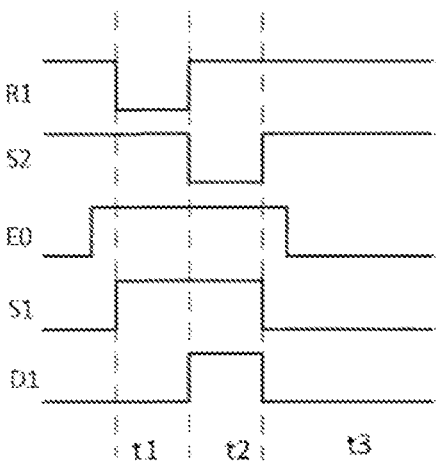
FIG. 23 is a working timing diagram of the pixel driving circuit shown in FIG. 22 according to at least one embodiment of the present disclosure.

As shown in FIG. 23, when at least one embodiment of the pixel driving circuit shown in FIG. 22 of the present disclosure is in operation, the display period includes an initialization phase t1, a data writing-in phase t2, and a light emitting phase t3 which are set successively;

In the initialization phase t1, R1 provides a low-voltage signal, S1 provides a high-voltage signal, S2 provides a high-voltage signal, E0 provides a high-voltage signal, T6 and T4 are turned on to write Vi1 into N1; T1 is turned on, and T1 is equivalent to a capacitor to keep the potential of N2 stable;

In the data writing-in phase t2, R1 provides a high voltage signal, S1 provides a high voltage signal, S2 provides a low voltage signal, E0 provides a high voltage signal, T8 is turned on, T7 is turned on, T4 is turned on, and the data voltage Vdata on D1 is written into N2, N1 is connected to N3;

At the beginning of the data writing-in phase t2, C2 is charged through Vdata to change the potential of the gate electrode of T0 until the potential of the gate electrode of T0 becomes Vdata+Vth, and Vth is the threshold voltage of T0;

In the light emitting phase t3, R1 provides a high-voltage signal, S1 provides a low-voltage signal, S2 provides a high-voltage signal, E0 provides a low-voltage signal, T2 and T3 are turned on, and TO is turned on to drive O1 to emit light.

Figure 24:
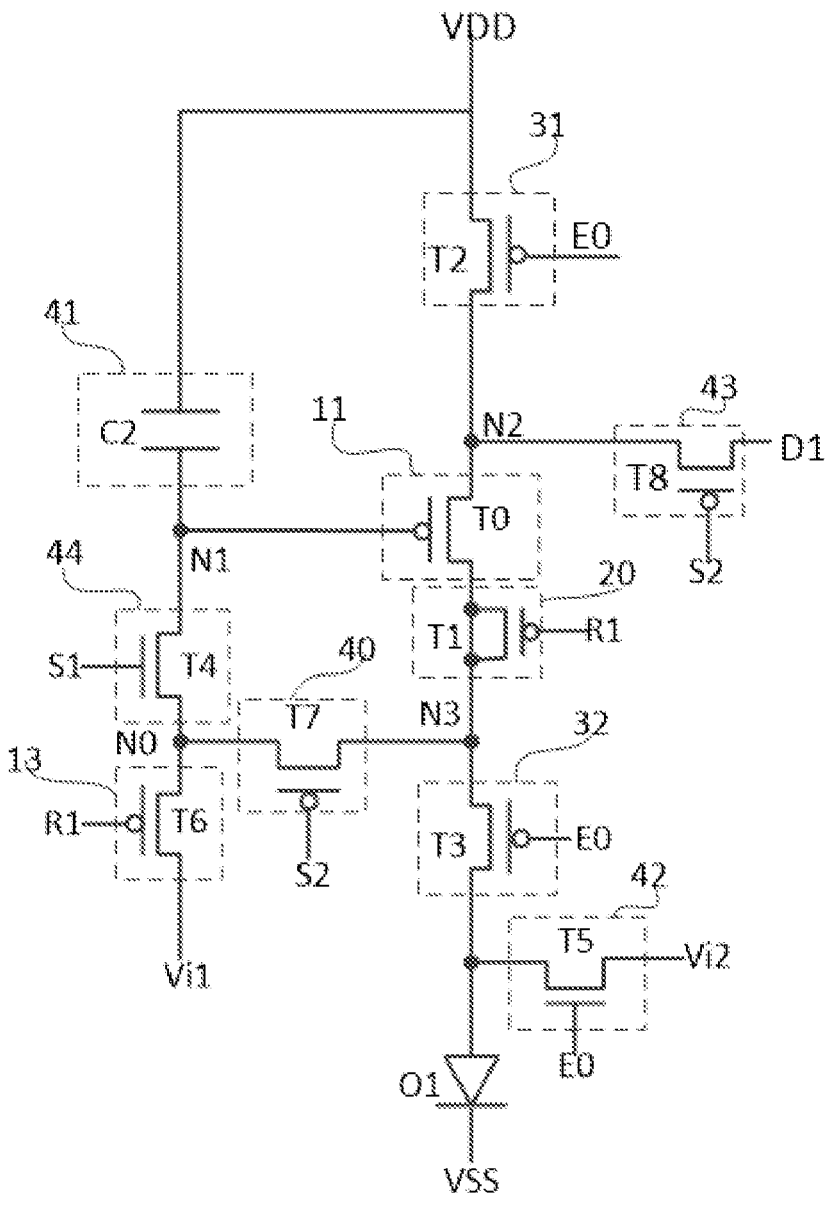
FIG. 24 is a circuit diagram of a pixel driving circuit according to at least one embodiment of the present disclosure.

As shown in FIG. 24, on the basis of the embodiment of the pixel driving circuit shown in FIG. 13, the reset circuit 20 includes a first transistor T1; the first light emitting control circuit 31 includes a second transistor T2, and the second light emitting control circuit 32 includes a third transistor T3; the on-off control circuit 44 includes a fourth transistor T4; the second initialization circuit 42 includes a fifth transistor T5; the first initialization circuit 13 includes a sixth transistor T6, the compensation control circuit 40 includes a seventh transistor T7, the data writing-in circuit 43 includes an eighth transistor T8, the driving circuit 11 includes a driving transistor T0, and the energy storage circuit 41 includes a second capacitor C2; the light emitting element is an organic light emitting diode O1;

The first light emitting control line and the second light emitting control line are the same light emitting control line E0;

The gate electrode of T1 is electrically connected to the reset control line R1, the source electrode of T1 is electrically connected to the drain electrode of T0, and the drain electrode of T1 is electrically connected to the source electrode of T3;

The gate electrode of T2 is electrically connected to the light emitting control line E0, the source electrode of T2 is electrically connected to the high voltage line, and the drain electrode of T2 is electrically connected to the first electrode of T0; the high voltage line is used to provide a high voltage VDD;

The gate electrode of T3 is electrically connected to the light emitting control line E0, the source electrode of T3 is electrically connected to the second electrode of T0, and the drain electrode of T3 is electrically connected to the anode of O1;

The gate electrode of T4 is electrically connected to the first scanning line S1, the source electrode of T4 is electrically connected to the gate electrode of T0, and the drain electrode of T4 is electrically connected to the connection node N0;

The gate electrode of T5 is electrically connected to the reset control line R1, the source electrode of T5 is electrically connected to the second initial voltage line, and the drain electrode of T5 is electrically connected to the anode of O1; the second initial voltage line is used to provide the second initial voltage Vi2;

The gate electrode of T6 is electrically connected to the reset control line R1, the source electrode of T6 is electrically connected to the first initial voltage line, and the drain electrode of T6 is electrically connected to the connection node N0; the first initial voltage line is used to provide the first initial voltage Vi1;

The gate electrode of T7 is electrically connected to the second scanning line S2, the source electrode of T7 is electrically connected to the connection node N0, and the drain electrode of T7 is electrically connected to the second electrode of T0;

The gate electrode of T8 is electrically connected to the second scanning line S2, the source electrode of T8 is electrically connected to the data line D1, and the drain electrode of T8 is electrically connected to the first electrode of T0;

The first electrode plate of C2 is electrically connected to the gate electrode of T0, and the second electrode plate of C2 is electrically connected to the high voltage line;

The cathode of O1 is electrically connected to a low voltage line for providing a low voltage VSS.

In at least one embodiment of the pixel driving circuit shown in FIG. 24, the third scanning line is the reset control line R1; Vi2 may be the same as Vi1 or different from Vi1.

In at least one embodiment of the pixel driving circuit shown in FIG. 24, T4 is an oxide thin film transistor, and other transistors are low temperature polysilicon thin film transistors; but not limited thereto.

As shown in FIG. 23, when at least one embodiment of the pixel driving circuit shown in FIG. 24 of the present disclosure is in operation, the display period includes an initialization phase t1, a data writing-in phase t2 and a light emitting phase t3 which are set successively;

In the initialization phase t1, R1 provides a low-voltage signal, S1 provides a high-voltage signal, S2 provides a high-voltage signal, E0 provides a high-voltage signal, T6 and T4 are turned on to write Vi1 into N1; T1 is turned on, and T1 is equivalent to a capacitor to keep the potential of N3 stable;

In the data writing-in phase t2, R1 provides a high voltage signal, S1 provides a high voltage signal, S2 provides a low voltage signal, E0 provides a high voltage signal, T8 is turned on, T7 is turned on, T4 is turned on, and the data voltage Vdata on D1 is written into N2, N1 is connected to N3;

At the beginning of the data writing-in phase t2, C2 is charged through Vdata to change the potential of the gate electrode of T0 until the potential of the gate electrode of T0 becomes Vdata+Vth, and Vth is the threshold voltage of T0;

In the light emitting phase t3, R1 provides a high-voltage signal, S1 provides a low-voltage signal, S2 provides a high-voltage signal, E0 provides a low-voltage signal, T2 and T3 are turned on, and TO is turned on to drive O1 to emit light.

Figure 25:
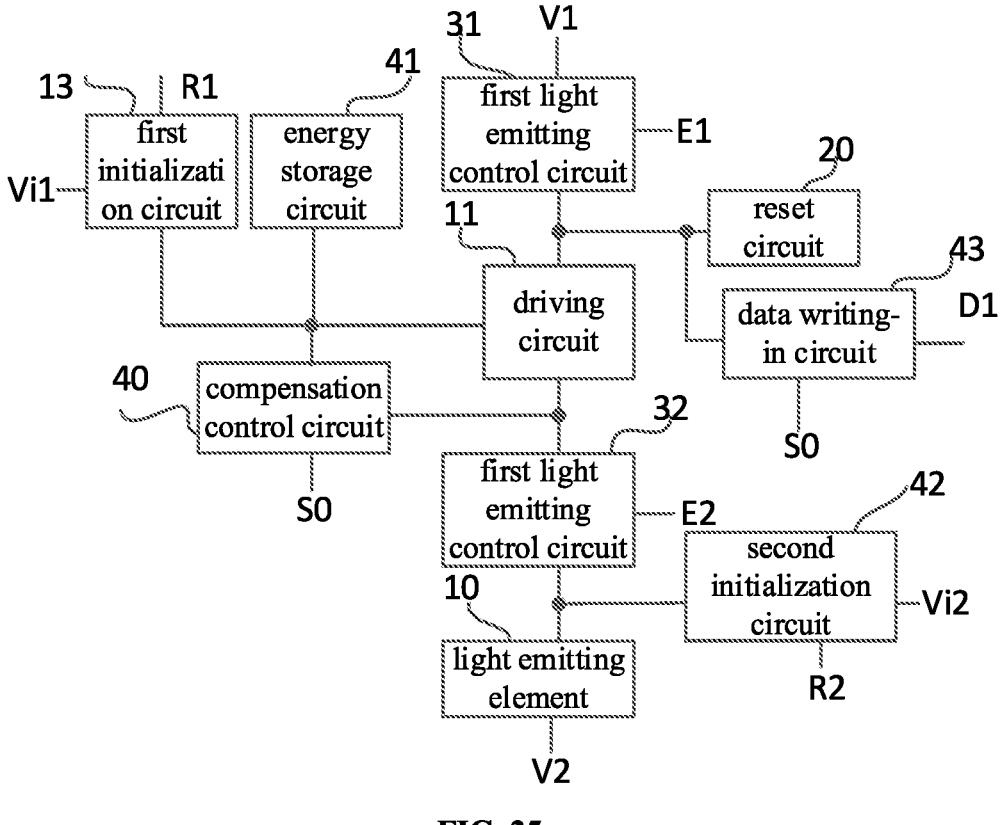
FIG. 25 is a structural diagram of a pixel driving circuit according to at least one embodiment of the present disclosure.

As shown in FIG. 25, on the basis of at least one embodiment of the pixel driving circuit shown in FIG. 3, the pixel driving circuit further includes an energy storage circuit 41, a data writing-in circuit 43, an compensation control circuit 40, a first initialization circuit 13 and a second initialization circuit 42;

The energy storage circuit 41 is electrically connected to the control terminal of the driving circuit 11 and is used for storing electric energy;

The data writing-in circuit 43 is electrically connected to the scanning line S0, the data line D1 and the first terminal of the driving circuit 11, and is used to control to write the data voltage on the data line D1 into the first terminal of the driving circuit 11 under the control of the scanning signal provided by the scanning line S0;

The compensation control circuit 40 is electrically connected to the scanning line S0, the control terminal of the driving circuit 11, and the second terminal of the driving circuit 11, and is used to control to connect the control terminal of the driving circuit 11 and the second terminal of the driving circuit 11 under the control of the scanning signal;

The first initialization circuit 13 is electrically connected to the first initial control line R11, the first initial voltage line, and the control terminal of the driving circuit 11, and is used to write the first initial voltage Vi1 provided by the first initial voltage line into the control terminal of the driving circuit 11 under the control of the first initial control signal provided by the first initial control line R11;

The second initialization circuit 42 is electrically connected to the second initial control line R12, the second initial voltage line and the first electrode of the light emitting element 10 respectively, and is used to write the second initial voltage Vi2 provided by the second initial voltage line into the first electrode of the light emitting element 10 under the control of the second initial control signal provided by the second initial control line R12.

In at least one embodiment of the pixel driving circuit shown in FIG. 25, the reset circuit 20 may also be electrically connected to the second terminal of the driving circuit 11, and is used to initialize the second terminal of the driving circuit 11 during the initialization phase.

Figure 26:
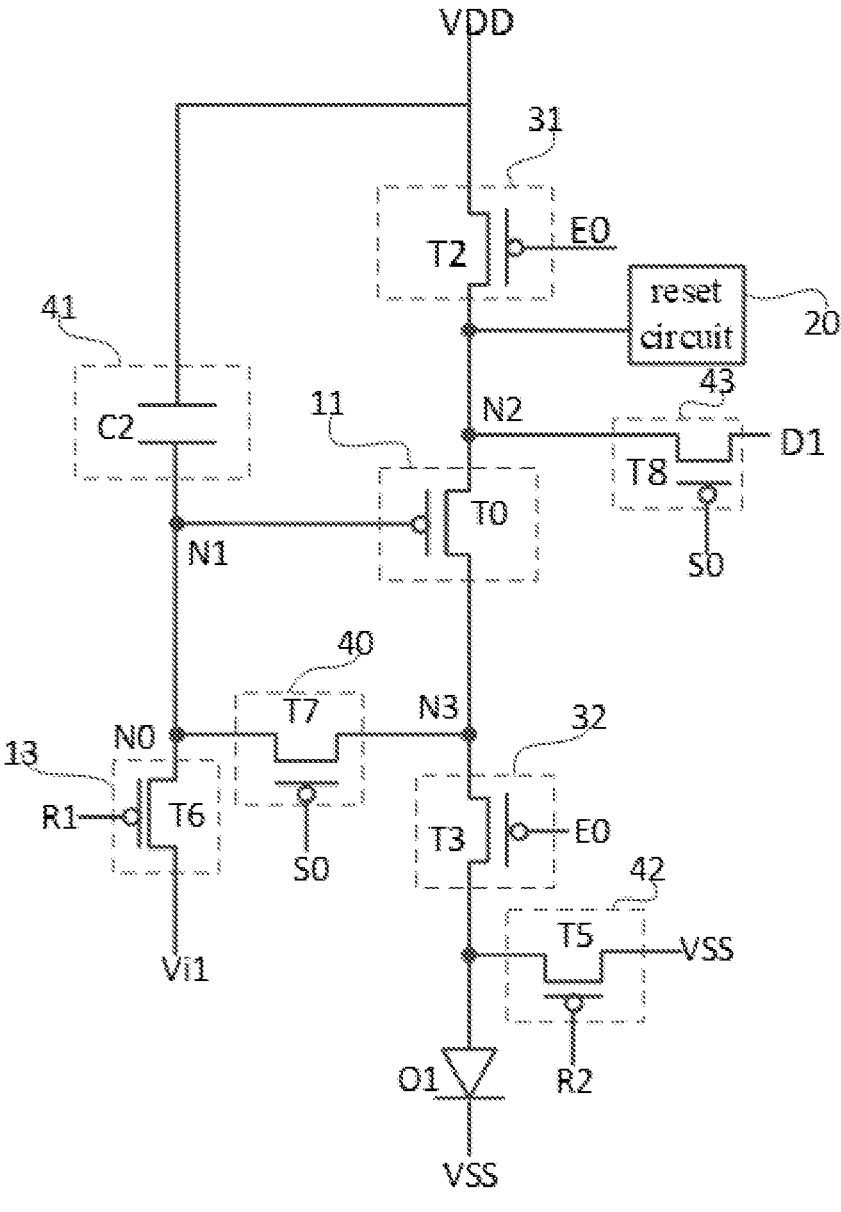
FIG. 26 is a circuit diagram of a pixel driving circuit according to at least one embodiment of the present disclosure.

As shown in FIG. 26, on the basis of at least one embodiment of the pixel driving circuit shown in FIG. 25, the first light emitting control circuit 31 includes a second transistor T2, and the second light emitting control circuit 32 includes a third transistor T3, the driving circuit 11 includes a driving transistor T0; the compensation control circuit 40 includes a seventh transistor T7; the first initialization circuit 13 includes a sixth transistor T6; the data writing-in circuit 43 includes an eighth transistor T8; the second initialization circuit 42 includes a fifth transistor T5, and the light emitting element is an organic light emitting diode O1; the energy storage circuit 41 includes a second capacitor C2;

The first electrode plate of C2 is electrically connected to the gate electrode of T0, and the second electrode plate of C2 is electrically connected to the high voltage line;

The gate electrode of T2 is electrically connected to the light emitting control line E0, the source electrode of T2 is electrically connected to the high voltage line, and the drain electrode of T2 is electrically connected to the source electrode of T0; the high voltage line is used to provide a high voltage VDD;

The gate electrode of T3 is electrically connected to the light emitting control line E0, the source electrode of T3 is electrically connected to the drain electrode of T0, the drain electrode of T3 is electrically connected to the anode of O1; the cathode of O1 is electrically connected to the low-voltage line, and the low-voltage line is used to provide a low voltage VSS;

The gate electrode of T5 is electrically connected to R2, the source electrode of T5 is connected to the low voltage VSS, and the drain electrode of T6 is electrically connected to the anode of O1;

The gate electrode of T6 is electrically connected to R1, the source electrode of T6 is connected to the first initial voltage Vi1, and the drain electrode of T6 is electrically connected to the gate electrode of T0;

The gate electrode of T7 is electrically connected to S0, the source electrode of T7 is electrically connected to the gate electrode of T0, and the drain electrode of T7 is electrically connected to the drain electrode of T0;

The gate electrode of T8 is electrically connected to S0, the source electrode of T8 is electrically connected to the data line D1, and the drain electrode of T8 is electrically connected to the source electrode of T0;

The cathode of O1 is electrically connected to a low voltage line for providing a low voltage VSS.

In at least one embodiment of the pixel driving circuit shown in FIG. 26, the first light emitting control line and the second light emitting control line are the same light emitting control line E0, and the second initial voltage is VSS.

In at least one embodiment of the pixel driving circuit shown in FIG. 26, N1 is the first node electrically connected to the gate electrode of T0, N2 is the second node electrically connected to the source electrode of T0, and N3 is the third node electrically connected to the drain electrode of T0.

In at least one embodiment of the pixel driving circuit shown in FIG. 26, all transistors are low temperature polysilicon thin film transistors, but not limited thereto. In actual operation, T6 and T7 can be oxide thin film transistors, so as to reduce the current leakage of the gate electrode of T0, which is beneficial to maintain the stability of the potential of the gate electrode of T0.

Figure 27:
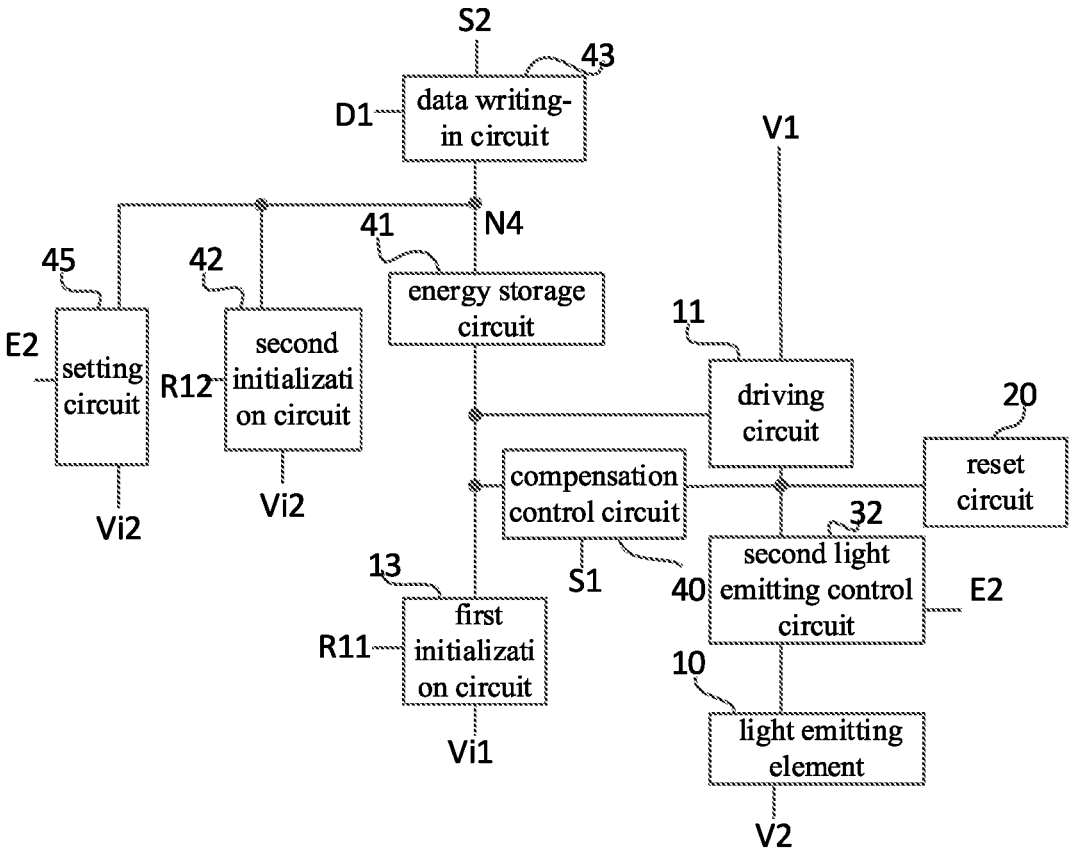
FIG. 27 is a structural diagram of a pixel driving circuit according to at least one embodiment of the present disclosure.

In at least one embodiment of the pixel driving circuit shown in FIG. 26, Vi2 is VSS;

As shown in FIG. 27, on the basis of at least one embodiment of the pixel driving circuit shown in FIG. 11, the pixel driving circuit further includes the data writing-in circuit 43, the energy storage circuit 41, the compensation control circuit 40, the first initialization circuit 13, the second initialization circuit 42 and a setting circuit 45;

The compensation control circuit 43 is electrically connected to the first scanning line S1, the control terminal of the driving circuit 11 and the second terminal of the driving circuit 11 respectively, is configured to control the connection between the control terminal of the driving circuit 11 and the second terminal of the driving circuit 11 under the control of the first scanning signal provided by the first scanning line S1;

The first terminal of the energy storage circuit 41 is electrically connected to the control terminal of the driving circuit 11, the second terminal of the energy storage circuit 41 is electrically connected to the control node N4, and the energy storage circuit 41 is used to store electric energy;

The data writing-in circuit 43 is respectively electrically connected to the second scanning line S2, the data line D1 and the control node N4, and is used to write the data voltage Vdata on the data line D1 into the control node N4 under the control of the second scanning signal provided by the second scanning line S2;

The first initialization circuit 13 is electrically connected to the first initial control line R11, the first initial voltage line, and the control terminal of the driving circuit 11, and is used to write the first initial voltage Vi1 provided by the first initial voltage line into the control terminal of the driving circuit under the control of the first initial control signal provided by the first initial control line R11;

The second initialization circuit 42 is electrically connected to the second initial control line R12, the second initial voltage line and the control node N4 respectively, and is used to write the second initial voltage Vi2 provided by the second initial voltage line into the control node N4 under the control of the second initial control signal provided by the second initial control line R12;

The setting circuit 45 is respectively electrically connected to the second light emitting control line E2, the second initial voltage line and the control node N4, and is used to write the second initial voltage Vi2 into the control node N4 under the control of the second light emitting control signal provided by the second light emitting control line E2.

Optionally, the transistors included in the compensation control circuit 40 and the transistors included in the first initialization circuit 13 are oxide thin film transistors, so as to reduce the current leakage of the control terminal of the driving circuit 11 and facilitate maintaining the stability of the potential of the control terminal of the driving circuit 11.

Figures 28, 29:
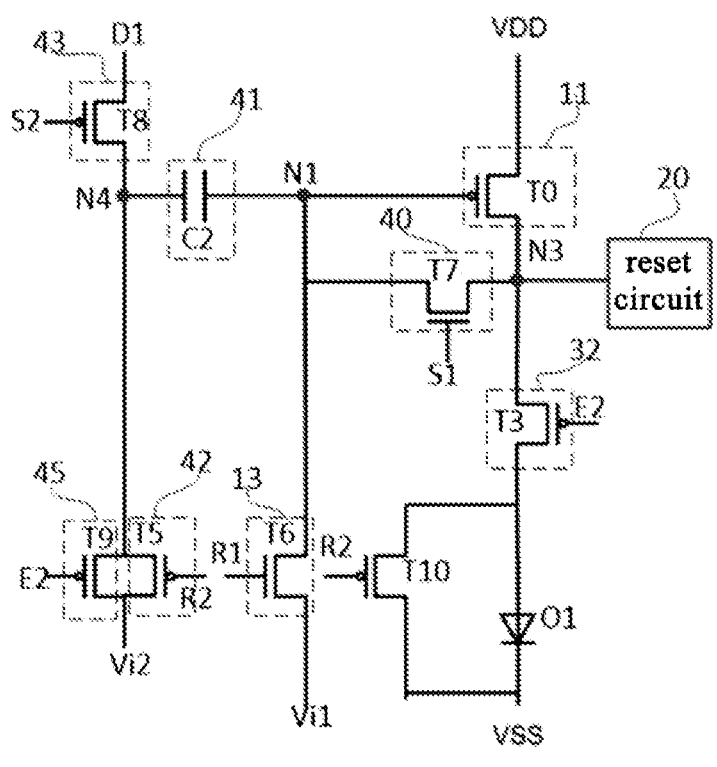
FIG. 28 is a circuit diagram of a pixel driving circuit according to at least one embodiment of the present disclosure.
FIG. 29 is a structural diagram of a pixel driving circuit according to at least one embodiment of the present disclosure.

As shown in FIG. 28, on the basis of at least one embodiment of the pixel driving circuit shown in FIG. 27, the second light emitting control circuit 32 includes a third transistor T3, and the driving circuit 11 includes a driving transistor T0; the compensation control circuit 40 includes a seventh transistor T7; the first initialization circuit 13 includes a sixth transistor T6; the data writing-in circuit 43 includes an eighth transistor T8; the second initialization circuit 42 includes a fifth transistor T5, the setting circuit 45 includes a ninth transistor T9; the light emitting element is an organic light emitting diode O1; the energy storage circuit 41 includes a second capacitor C2; at least one embodiment of the pixel driving circuit further includes a tenth transistor T10;

The first electrode plate of C2 is electrically connected to the control node N4, and the second electrode plate of C2 is electrically connected to the gate electrode of T0;

The source electrode of T0 is electrically connected to a high voltage line, and the high voltage line is used to provide a high voltage VDD;

The gate electrode of T3 is electrically connected to the second light emitting control line E2, the source electrode of T3 is electrically connected to the drain electrode of T0, and the drain electrode of T3 is electrically connected to the anode of O1;

The gate electrode of T7 is electrically connected to S1, the source electrode of T7 is electrically connected to the gate electrode of T0, and the drain electrode of T7 is electrically connected to the drain electrode of T0;

The gate electrode of T6 is electrically connected to R1, the source electrode of T6 is connected to the first initial voltage Vi1, and the drain electrode of T6 is electrically connected to the gate electrode of T0;

The gate electrode of T8 is electrically connected to S2, the source electrode of T8 is electrically connected to the data line D1, and the drain electrode of T8 is electrically connected to the control node N4;

The gate electrode of T5 is electrically connected to R2, the source electrode of T5 is connected to the second initial voltage Vi2, and the drain electrode of T5 is electrically connected to the control node N4;

The gate electrode of T9 is electrically connected to the second light emitting control line E2, the source electrode of T5 is connected to the second initial voltage Vi2, and the drain electrode of T5 is electrically connected to the control node N4;

The gate electrode of T10 is electrically connected to R2, the source electrode of T10 is electrically connected to the anode of O1, and the drain electrode of T10 is electrically connected to the cathode of O1;

The cathode of O1 is electrically connected to a low voltage line for providing a low voltage VSS.

In at least one embodiment of the pixel driving circuit shown in FIG. 28, both T6 and T7 are oxide thin film transistors, and other transistors may all be low temperature polysilicon thin film transistors.

In at least one embodiment of the pixel driving circuit shown in FIG. 28, N1 is a first node electrically connected to the gate electrode of T0, and N3 is a third node electrically connected to the drain electrode of T0.

In at least one embodiment of the pixel driving circuit shown in FIG. 28, under the control of the signal provided by R2, T10 controls the connection between the anode of O1 and the cathode of O1, so as to control O1 not to emit light, and clear the residual charge of O1.

As shown in FIG. 29, on the basis of at least one embodiment of the pixel driving circuit shown in FIG. 3, the pixel driving circuit further includes the data writing-in circuit 43, the energy storage circuit 41, the compensation control circuit 40, the first initialization circuit 13 and the second initialization circuit 42;

The compensation control circuit 40 is electrically connected to the first scanning line S1, the control terminal of the driving circuit 11, and the second terminal of the driving circuit 11, and is used to control the connection between the control terminal of the driving circuit 11 and the second terminal of the driving circuit 11 under the control of the first scanning signal provided by the first scanning line S1;

The energy storage circuit 41 is electrically connected to the control terminal of the driving circuit 11 and is used for storing electric energy;

The data writing-in circuit 43 is electrically connected to the second scanning line S2, the data line D1 and the first terminal of the driving circuit 11, and is used to write the data voltage on the data line D1 into the first terminal of the driving circuit 11 under the control of the second scanning signal provided by the second scanning line S2;

The first initialization circuit 13 is electrically connected to the first initial control line R11, the initial voltage line, and the control terminal of the driving circuit 11, and is used to write the initial voltage Vi provided by the initial voltage line into the control terminal of the driving circuit 11 under the control of the first initial control signal provided by the first initial control line R11;

The second initialization circuit 42 is electrically connected to the second initial control line R12, the initial voltage line and the first electrode of the light emitting element 10 respectively, and is used to write the initial voltage Vi into the first electrode of the light emitting element 10 under the control of the second initial control signal provided by the second initial control line R12.

In at least one embodiment of the pixel driving circuit shown in FIG. 29, the reset circuit 20 may also be electrically connected to the second terminal of the driving circuit 11, and is used to initialize the second terminal of the driving circuit 11 during the initialization phase. Optionally, both the transistors included in the compensation control circuit 40 and the transistors included in the first initialization circuit 13 are oxide thin film transistors, so as to reduce the current leakage of the control terminal of the driving circuit 11 and facilitate the stability of the potential of the control terminal of the driving circuit 11.

Figure 30:
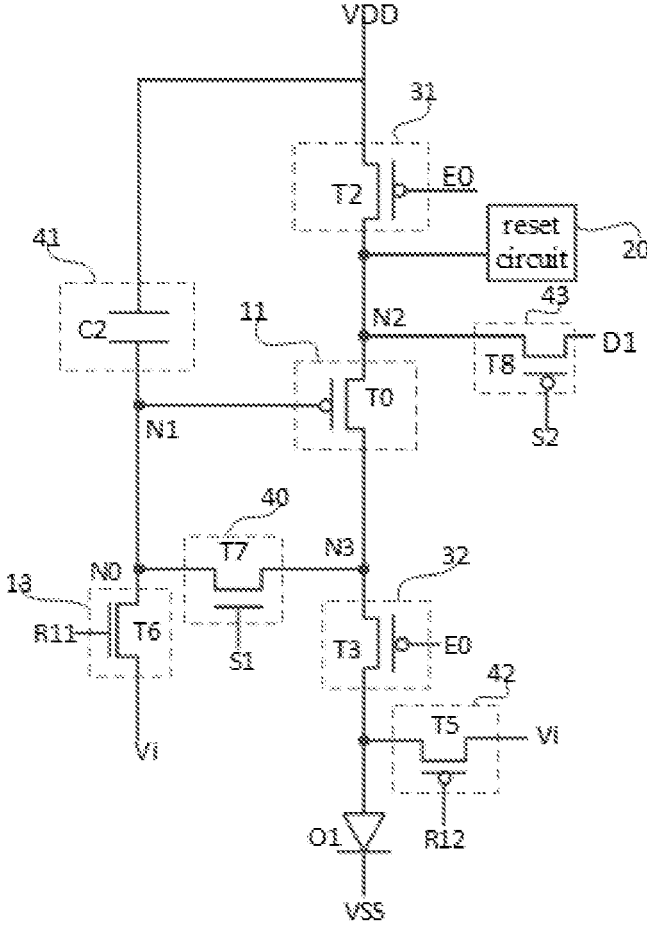
FIG. 30 is a circuit diagram of a pixel driving circuit according to at least one embodiment of the present disclosure.

As shown in FIG. 30, on the basis of at least one embodiment of the pixel driving circuit shown in FIG. 29, the first light emitting control circuit 31 includes a second transistor T2; the second light emitting control circuit 32 includes a third transistor T3, the driving circuit 11 includes a driving transistor T0; the compensation control circuit 40 includes a seventh transistor T7; the first initialization circuit 13 includes a sixth transistor T6; the data writing-in circuit 43 includes an eighth transistor T8; the second initialization circuit 42 includes a fifth transistor T5; the light emitting element is an organic light emitting diode O1; the energy storage circuit 41 includes a second capacitor C2;

The first electrode plate of C2 is electrically connected to the gate electrode of T0, and the second electrode plate of C2 is electrically connected to the high voltage line;

The gate electrode of T2 is electrically connected to the light emitting control line E0, the source electrode of T2 is electrically connected to the high voltage line, and the drain electrode of T0 is electrically connected to the source electrode of T0; the high voltage line is used to provide a high voltage VDD;

The gate electrode of T3 is electrically connected to the light emitting control line E0, the source electrode of T3 is electrically connected to the drain electrode of T0, and the drain electrode of T3 is electrically connected to the anode of O1;

The gate electrode of T7 is electrically connected to S1, the source electrode of T7 is electrically connected to the gate electrode of T0, and the drain electrode of T7 is electrically connected to the source electrode of T0;

The gate electrode of T6 is electrically connected to R11, the source electrode of T6 is connected to the initial voltage Vi, and the drain electrode of T6 is electrically connected to the gate electrode of T0;

The gate electrode of T8 is electrically connected to S2, the source electrode of T8 is electrically connected to the data line D1, and the drain electrode of T8 is electrically connected to the source electrode of T0;

The gate electrode of T5 is electrically connected to R12, the source electrode of T5 is connected to the initial voltage Vi, and the drain electrode of T5 is electrically connected to the anode of O1;

The cathode of O1 is electrically connected to a low voltage line for providing a low voltage VSS.

In at least one embodiment of the pixel driving circuit shown in FIG. 30, the first light emitting control line and the second light emitting control line may be the same light emitting control line E0.

In at least one embodiment of the pixel driving circuit shown in FIGS. 30, T6 and T7 are oxide thin film transistors, and other transistors are low temperature polysilicon thin film transistors, but not limited thereto.

In at least one embodiment of the pixel driving circuit shown in FIGS. 30, T6 and T7 are oxide thin film transistors, so as to reduce the current leakage of the gate electrode of T0 and stabilize the potential of the gate electrode of T0.

In at least one embodiment of the pixel driving circuit shown in FIG. 30, N1 is the first node electrically connected to the gate electrode of T0, N2 is the second node electrically connected to the source electrode of T0, and N3 is the third node electrically connected to the drain electrode of T0.

Figure 31:
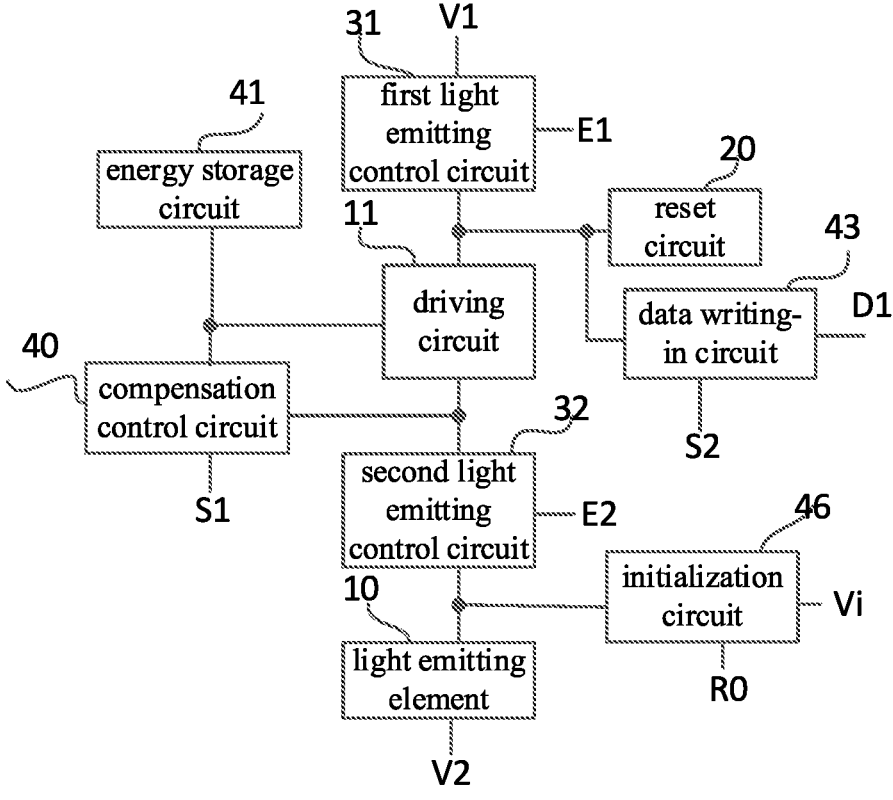
FIG. 31 is a structural diagram of a pixel driving circuit according to at least one embodiment of the present disclosure.

As shown in FIG. 31, on the basis of at least one embodiment of the pixel driving circuit shown in FIG. 3, the pixel driving circuit further includes the data writing-in circuit 43, the energy storage circuit 41, the compensation control circuit 40 and the initialization circuit 46;

The compensation control circuit 40 is electrically connected to the first scanning line S1, the control terminal of the driving circuit 11, and the second terminal of the driving circuit 11, and is used to control the connection between the control terminal of the driving circuit 11 and the second terminal of the driving circuit 11 under the control of the first scanning signal provided by the first scanning line S1;

The data writing-in circuit 43 is electrically connected to the second scanning line S2, the data line D1 and the first terminal of the driving circuit 11, and is used to write the data voltage on the data line D1 into the first terminal of the driving circuit 11 under the control of the second scanning signal provided by the second scanning line S2;

The energy storage circuit 41 is electrically connected to the control terminal of the driving circuit 11 and is used for storing electric energy;

The initialization circuit 46 is electrically connected to the initial control line R0, the initial voltage line, and the first electrode of the light emitting element 10, and is used to provide the initial voltage Vi provided by the initial voltage line to the first electrode of the light emitting element 10.

In at least one embodiment of the pixel driving circuit shown in FIG. 31, the reset circuit 20 may also be electrically connected to the second terminal of the driving circuit 11, and is used to initialize the potential of the second terminal of the driving circuit 11 during the initialization phase.

Figure 32:
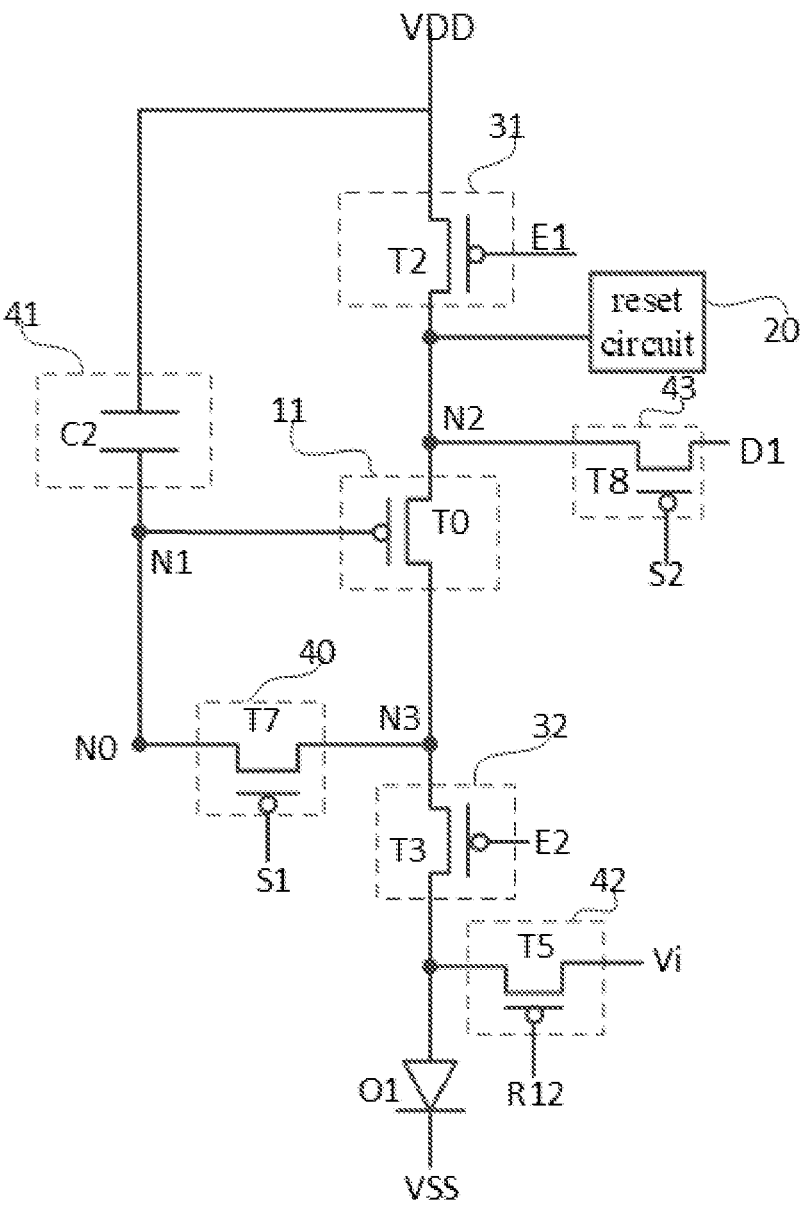
FIG. 32 is a circuit diagram of a pixel driving circuit according to at least one embodiment of the present disclosure.

As shown in FIG. 32, on the basis of at least one embodiment of the pixel driving circuit shown in FIG. 31, the first light emitting control circuit 31 includes a second transistor T2; the second light emitting control circuit 32 includes a third transistor T3, the driving circuit 11 includes a driving transistor T0; the compensation control circuit 40 includes a seventh transistor T7; the data writing-in circuit 43 includes an eighth transistor T8; the initialization circuit 46 includes a fifth transistor T5; the light emitting element is an organic light emitting diode O1; the energy storage circuit 41 includes a second capacitor C2;

The first electrode plate of C2 is electrically connected to the gate electrode of T0, and the second electrode plate of C2 is electrically connected to the high voltage line;

The gate electrode of T2 is electrically connected to the first light emitting control line E1, the source electrode of T2 is electrically connected to the high voltage line, and the drain electrode of T2 is electrically connected to the source electrode of T0; the high voltage line is used to provide a high voltage VDD;

The gate electrode of T3 is electrically connected to the second light emitting control line E2, the source electrode of T3 is electrically connected to the drain electrode of T0, and the drain electrode of T3 is electrically connected to the anode of O1;

The gate electrode of T7 is electrically connected to S1, the source electrode of T7 is electrically connected to the gate electrode of T0, and the drain electrode of T7 is electrically connected to the drain electrode of T0;

The gate electrode of T8 is electrically connected to S2, the source electrode of T8 is electrically connected to the data line D1, and the drain electrode of T8 is electrically connected to the source electrode of T0;

The gate electrode of T5 is electrically connected to R0, the source electrode of T5 is connected to Vi, and the drain electrode of T5 is electrically connected to the anode of O1;

The cathode of O1 is electrically connected to a low voltage line for providing a low voltage VSS.

In at least one embodiment of the pixel driving circuit shown in FIG. 32, N1 is the first node electrically connected to the gate electrode of T0, N2 is the second node electrically connected to the source electrode of T0, and N3 is the third node electrically connected to the drain electrode of T0.

Figure 33:
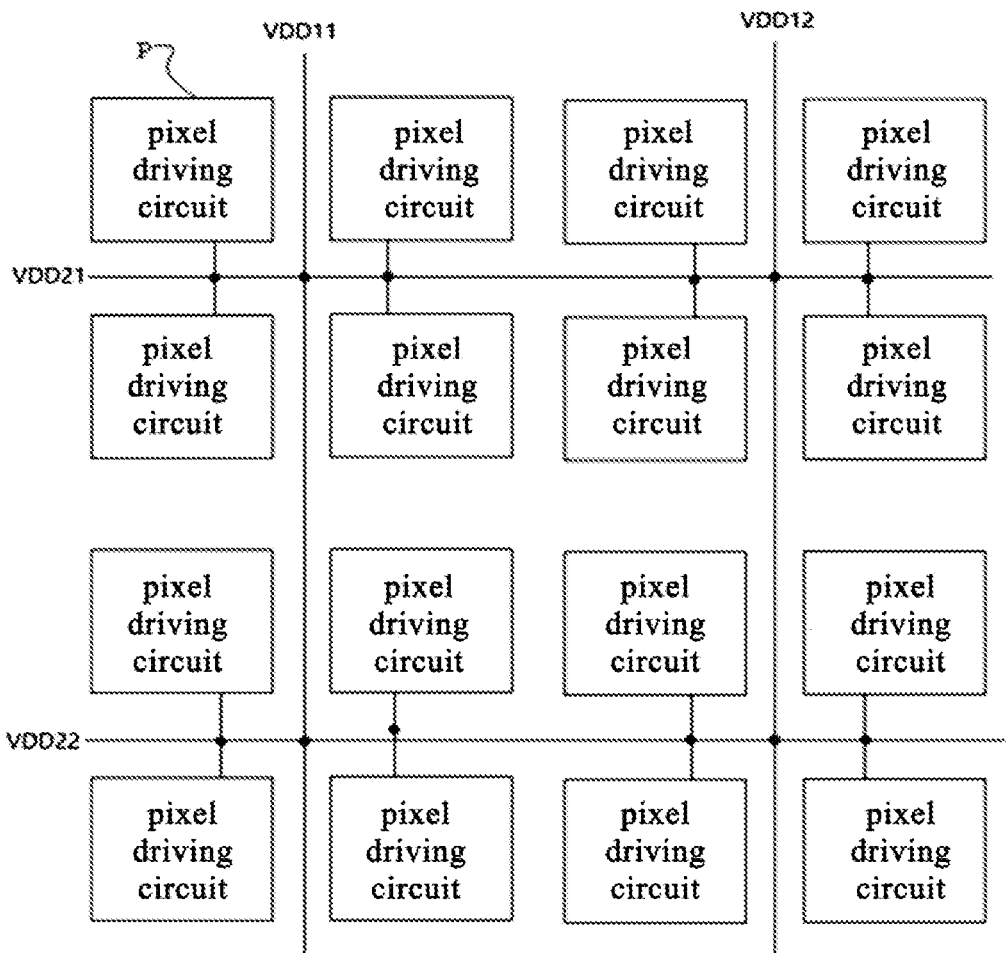
FIG. 33 is a distribution diagram of a pixel driving circuit in a display device according to at least one embodiment of the present disclosure.

As shown in FIG. 33, it is an arrangement diagram of a pixel driving circuit in a display device according to at least one embodiment of the present disclosure. The display device may include a plurality of pixel driving circuits P arranged in an array, a first high voltage line VDD11, a second high voltage line VDD12, a third high voltage line VDD21 and a fourth high voltage line VDD22. VDD11, VDD12, VDD21, VDD22 can all be used to provide high voltage. As shown in FIG. 22, VDD11 and VDD12 extends along the column direction, and VDD21 and VDD22 extends along the row direction. The pixel driving circuits in two adjacent rows can be connected to the high voltage line extending in the same row direction. The high voltage line can be located between the adjacent two rows of pixel driving circuits, the high voltage lines extending along the column direction can be connected to multiple high voltage lines intersecting and extending along the row direction, so that the multiple high voltage lines can form a grid structure. Wherein, the high voltage line extending along the column direction may be located in the area where the red pixel driving circuit is located. In addition, in the same pixel row, two pixel driving circuits in adjacent columns can be arranged in mirror to facilitate wiring.

The pixel driving method described in the embodiment of the present disclosure is applied to the above-mentioned pixel driving circuit, and the pixel driving method includes:

In an initialization phase, initializing, by the reset circuit, the potential of the first terminal of the driving circuit or the potential of the second terminal of the driving circuit.

In the pixel driving method described in the embodiment of the present disclosure, before the data voltage is written into the driving circuit, in the initialization phase, the reset circuit performs initialization on the potential of the first terminal of the driving circuit or the potential of the second terminal of the driving circuit, to improve the hysteresis phenomenon of the driving transistor, and solve phenomena such as afterimage and flicker caused by the hysteresis of the driving transistor in a low-frequency state.

Optionally, the pixel driving circuit further includes a first light emitting control circuit and a second light emitting control circuit; the reset circuit includes a first capacitor; the first light emitting control line and the second light emitting control line are a same light emitting control line; a first electrode plate of the first capacitor is electrically connected to the light emitting control line, and a second electrode plate of the first capacitor is connected to a first terminal of the driving circuit or a second terminal of the driving circuit electrical connection;

In the initialization phase, initializing, by the reset circuit, the potential of the first terminal of the driving circuit or the potential of the second terminal of the driving circuit includes:

In the initialization phase, the second electrode plate of the first capacitor being in a floating state, and the potential of the second electrode plate of the first capacitor changing with the potential of the light emitting control signal on the light emitting control line to initialize the potential of the first terminal of the driving circuit or the potential of the second terminal of the driving circuit.

In a specific implementation, the reset circuit may include a first capacitor. In the initialization phase, the first capacitor initializes the potential of the first terminal of the driving circuit or the potential of the second terminal of the driving circuit according to the change of the potential of the light emitting control signal.

Optionally, the pixel driving circuit further includes a first light emitting control circuit and a second light emitting control circuit; the reset circuit includes a first transistor; a control electrode of the first transistor is electrically connected to a reset control line, and a first electrode of the first transistor is electrically connected to the reset voltage line, and a second electrode of the first transistor is electrically connected to the first terminal of the driving circuit or the second terminal of the driving circuit;

In the initialization phase, the initializing, by the reset circuit, the potential of the first terminal of the driving circuit or the potential of the second terminal of the driving circuit includes:

In the initialization phase, under the control of the reset control signal provided by the reset control line, the first transistor being turned on, so as to write the reset voltage provided by the reset voltage line into the first terminal of the driving circuit or the second terminal of the driving circuit.

In a specific implementation, the reset circuit may include a first transistor, which is turned on during the initialization phase to write a reset voltage into the first terminal of the driving circuit or the second terminal of the driving circuit, and initialize the potential of the first terminal of the driving circuit or the potential of the second terminal of the driving circuit.

Optionally, the pixel driving circuit further includes a first light emitting control circuit and a second light emitting control circuit; the reset circuit includes a first transistor; a control electrode of the first transistor is electrically connected to a reset control line, and a first electrode of the first transistor is electrically connected to a first connection point, a second electrode of the first transistor is electrically connected to a second connection point, and the first connection point is a connection point on a first connection line between the first light emitting control circuit and the first terminal of the driving circuit, the second connection point is another connection point on the first connection line;

In the initialization phase, the initializing, by the reset circuit, the potential of the first terminal of the driving circuit or the potential of the second terminal of the driving circuit includes: in the initialization phase, under the control of the reset control signal provided by the reset control line, the first transistor being turned on to serve as a capacitor, so as to control the potential of the first terminal of the driving circuit.

In a specific implementation, the reset circuit may include a first transistor, the first transistor is connected to the first connection line between the first light emitting control circuit and the driving circuit, so as to control the potential of the first terminal of the driving circuit stable during the initialization phase.

Optionally, the pixel driving circuit further includes a first light emitting control circuit and a second light emitting control circuit; the reset circuit includes a first transistor; a control electrode of the first transistor is electrically connected to a reset control line, and a first electrode of the first transistor is electrically connected to the third connection point, a second electrode of the first transistor is electrically connected to a fourth connection point, and the third connection point is a connection point on a second connection line between the second terminal of the driving circuit and the first electrode of the light emitting element, the fourth connection point is another connection point on the second connection line In the initialization phase, the initializing, by the reset circuit, the potential of the first terminal of the driving circuit or the potential of the second terminal of the driving circuit includes: in the initialization phase, under the control of the reset control signal provided by the reset control line, the first transistor being turned on to serve as a capacitor, so as to control the potential of the second terminal of the driving circuit.

In a specific implementation, the reset circuit may include a first transistor, the first transistor is connected to the second connection line between the second light emitting control circuit and the driving circuit, so as to control the potential of the second terminal of the driving circuit stable during the initialization phase.

In at least one embodiment of the present disclosure, the display period may further include a data writing-in phase and a light emitting phase set after the initialization phase; the pixel driving method further includes:

In the data writing-in phase and the light emitting phase, under the control of the reset control signal provided by the reset control line, the first transistor being turned off so as not to affect the light emitting element.

The display device described in the embodiment of the present disclosure includes the above-mentioned pixel driving circuit.

The display device provided by the embodiments of the present disclosure may be any product or component with a display function, such as a mobile phone, a tablet computer, a television, a monitor, a notebook computer, a digital photo frame, a navigator, and the like.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A pixel driving circuit for driving a light emitting element, wherein the pixel driving circuit comprises a driving circuit and a reset circuit;

the reset circuit is electrically connected to a first terminal of the driving circuit or a second terminal of the driving circuit, and is configured to initialize a potential of the first terminal of the driving circuit or a potential of the second terminal of the driving circuit in an initialization phase;

the driving circuit is configured to control connection between the first terminal of the driving circuit and the second terminal of the driving circuit under the control of a potential of a control terminal of the driving circuit;

wherein the pixel driving circuit further comprises an energy storage circuit, a data writing-in circuit, a compensation control circuit, an on-off control circuit, a first initialization circuit and a second initialization circuit;

the energy storage circuit is electrically connected to the control terminal of the driving circuit and is configured to store electric energy;

the data writing-in circuit is respectively electrically connected to a second scanning line, a data line and the first terminal of the driving circuit, and is configured to control to write a data voltage on the data line into the first terminal of the driving circuit under the control of a second scanning signal provided by the second scanning line;

the on-off control circuit is electrically connected to a first scanning line, the control terminal of the driving circuit and a connection node, and is configured to control to connect the control terminal of the driving circuit and the connection node under the control of a first scanning signal;

the compensation control circuit is electrically connected to the second scanning line, the connection node and the second terminal of the driving circuit, and is configured to control to connect the connection node and the second terminal of the driving circuit under the control of the second scanning signal provided by the second scanning line;

the first initialization circuit is respectively electrically connected to a reset control line, a first initial voltage line and the connection node, and is configured to write a first initial voltage provided by the first initial voltage line into the connection node under the control of a reset control signal provided by the reset control line;

the second initialization circuit is electrically connected to a third scanning line, a second initial voltage line and a first electrode of the light emitting element respectively, and is configured to write a second initial voltage provided by the second initial voltage line into the first electrode of the light emitting element under the control of a third scanning signal provided by the third scanning line.

2. The pixel driving circuit according to claim 1, further comprising a first light emitting control circuit and a second light emitting control circuit; wherein the first light emitting control circuit is electrically connected to a first light emitting control line, the first terminal of the driving circuit and a first voltage line respectively, and is configured to control to connect the first terminal of the driving circuit and the first voltage line under the control of a first light emitting control signal provided by the first light emitting control line;

the second light emitting control circuit is electrically connected to a second light emitting control line, the second terminal of the driving circuit and a first electrode of the light emitting element, is configured to control to connect the second terminal of the driving circuit and the first electrode of the light emitting element under the control of a second light emitting control signal provided by the second light emitting control line;

a second electrode of the light emitting element is electrically connected to a second voltage line.

3. The pixel driving circuit according to claim 2, wherein the reset circuit comprises a first capacitor; the first light emitting control line and the second light emitting control line are a same light emitting control line;

a first electrode plate of the first capacitor is electrically connected to the light emitting control line, and a second electrode plate of the first capacitor is electrically connected to the first terminal of the driving circuit or the second terminal of the driving circuit.

4. The pixel driving circuit according to claim 3, wherein the first capacitor is a capacitor formed between the light emitting control line and a conductive pattern; the light emitting control line is formed by a metal layer, and the conductive pattern is formed by another metal layer included in the pixel driving circuit; the conductive pattern is electrically connected to the first terminal of the driving circuit or the second terminal of the driving circuit.

5. The pixel driving circuit according to claim 2, wherein the reset circuit comprises a first transistor;

a control electrode of the first transistor is electrically connected to a reset control line, a first electrode of the first transistor is electrically connected to a reset voltage line, and a second electrode of the first transistor is connected to the first terminal of the driving circuit or the second terminal of the driving circuit.

6. The pixel driving circuit according to claim 2, wherein the reset circuit comprises a first transistor;

a control electrode of the first transistor is electrically connected to a reset control line, a first electrode of the first transistor is electrically connected to a first connection point, and a second electrode of the first transistor is electrically connected to a second connection point, the first connection point is a connection point on a first connection line between the first light emitting control circuit and the first terminal of the driving circuit, and the second connection point is another connection point on the first connection line;

or, the control electrode of the first transistor is electrically connected to the reset control line, the first electrode of the first transistor is electrically connected to a third connection point, and the second electrode of the first transistor is electrically connected to a fourth connection point, the third connection point is a connection point on a second connection line between the second terminal of the driving circuit and the first electrode of the light emitting element, and the fourth connection point is another connection point on the second connection line.

7. The pixel driving circuit according to claim 1, further comprising a light emitting element and a second light emitting control circuit; wherein the first terminal of the driving circuit is electrically connected to a first voltage line;

the second light emitting control circuit is electrically connected to a second light emitting control line, and the second terminal of the driving circuit is electrically connected to a first electrode of the light emitting element, is configured to control the connection between the second terminal of the driving circuit and the first electrode of the light emitting element under the control of a second light emitting control signal provided by the second light emitting control line;

a second electrode of the light emitting element is electrically connected to a second voltage line;

the reset circuit is electrically connected to the second terminal of the driving circuit, and is configured to initialize the potential of the second terminal of the driving circuit in the initialization phase.

8. The pixel driving circuit according to claim 7, wherein the reset circuit includes a first capacitor, a first electrode plate of the first capacitor is electrically connected to the second light emitting control line, and the first capacitor is electrically connected to the second terminal of the driving circuit; or, the reset circuit includes a first transistor, a control electrode of the first transistor is electrically connected to a reset control line, the control electrode of the first transistor is electrically connected to a reset voltage line, and a second electrode of the first transistor is electrically connected to the second terminal of the driving circuit; or, the reset circuit includes the first transistor; the control electrode of the first transistor is electrically connected to the reset control line, the first electrode of the first transistor is electrically connected to a third connection point, and the second electrode of the first transistor is electrically connected to a fourth connection point, the third connection point is a connection point on a second connection line between the second terminal of the driving circuit and the first electrode of the light emitting element, the fourth connection point is another connection point on the second connection line;

wherein the reset circuit comprises a first capacitor;

the first capacitor is a capacitor formed between the second light emitting control line and a conductive pattern; the second light emitting control line is formed by a metal layer, the conductive pattern is formed by another metal layer included in the pixel driving circuit.

9. A pixel driving method, applied to the pixel driving circuit according to claim 1, comprising:

initializing, by the reset circuit, the potential of the first terminal of the driving circuit or the potential of the second terminal of the driving circuit in the initialization phase.

10. The pixel driving method according to claim 9, wherein the pixel driving circuit further includes a first light emitting control circuit and a second light emitting control circuit; the reset circuit includes a first capacitor; the first light emitting control line and the second light emitting control line are a same light emitting control line; a first electrode plate of the first capacitor is electrically connected to the light emitting control line, and a second electrode plate of the first capacitor is connected to the first terminal of the driving circuit or the second terminal of the driving circuit electrical connection;

the step of initializing, by the reset circuit, the potential of the first terminal of the driving circuit or the potential of the second terminal of the driving circuit in the initialization phase includes:

in the initialization phase, the second electrode plate of the first capacitor being in a floating state, and a potential of the second electrode plate of the first capacitor changing with a potential of the light emitting control signal on the light emitting control line to initialize the potential of the first terminal of the driving circuit or the potential of the second terminal of the driving circuit.

11. The pixel driving method according to claim 9, wherein the pixel driving circuit further includes a first light emitting control circuit and a second light emitting control circuit; the reset circuit includes a first transistor; a control electrode of the first transistor is electrically connected to a reset control line, and a first electrode of the first transistor is electrically connected to a reset voltage line, and a second electrode of the first transistor is electrically connected to the first terminal of the driving circuit or the second terminal of the driving circuit;

the step of initializing, by the reset circuit, the potential of the first terminal of the driving circuit or the potential of the second terminal of the driving circuit in the initialization phase includes:

in the initialization phase, under the control of a reset control signal provided by the reset control line, the first transistor being turned on, to write a reset voltage provided by the reset voltage line into the first terminal of the driving circuit or the second terminal of the driving circuit.

12. The pixel driving method according to claim 9, wherein the pixel driving circuit further includes a first light emitting control circuit and a second light emitting control circuit; the reset circuit includes a first transistor; a control electrode of the first transistor is electrically connected to a reset control line, and a first electrode of the first transistor is electrically connected to a first connection point, a second electrode of the first transistor is electrically connected to a second connection point, and the first connection point is a connection point on a first connection line between the first light emitting control circuit and the first terminal of the driving circuit, the second connection point is another connection point on the first connection line;

the step of initializing, by the reset circuit, the potential of the first terminal of the driving circuit or the potential of the second terminal of the driving circuit in the initialization phase includes:

in the initialization phase, under the control of a reset control signal provided by the reset control line, the first transistor being turned on to serve as a capacitor, so as to control the potential of the first terminal of the driving circuit.

13. The pixel driving method according to claim 9, wherein the pixel driving circuit further includes a first light emitting control circuit and a second light emitting control circuit; the reset circuit includes a first transistor; a control electrode of the first transistor is electrically connected to a reset control line, and a first electrode of the first transistor is electrically connected to a third connection point, a second electrode of the first transistor is electrically connected to a fourth connection point, and the third connection point is a connection point on a second connection line between the second terminal of the driving circuit and a first electrode of the light emitting element, the fourth connection point is another connection point on the second connection line;

the step of initializing, by the reset circuit, the potential of the first terminal of the driving circuit or the potential of the second terminal of the driving circuit in the initialization phase includes:

in the initialization phase, under the control of a reset control signal provided by the reset control line, the first transistor being turned on to serve as a capacitor, so as to control the potential of the second terminal of the driving circuit.

14. The pixel driving method according to claim 12, wherein the display period further includes a data writing-in phase and a light emitting phase set after the initialization phase; the pixel driving method further includes:

in the data writing-in phase and the light emitting phase, under the control of the reset control signal provided by the reset control line, the first transistor being turned off.

15. A display device, comprising the pixel driving circuit according to claim 1.

16. A pixel driving circuit for driving a light emitting element, wherein the pixel driving circuit comprises a driving circuit and a reset circuit;

the reset circuit is electrically connected to a first terminal of the driving circuit or a second terminal of the driving circuit, and is configured to initialize a potential of the first terminal of the driving circuit or a potential of the second terminal of the driving circuit in an initialization phase;

the driving circuit is configured to control connection between the first terminal of the driving circuit and the second terminal of the driving circuit under the control of a potential of a control terminal of the driving circuit;

wherein the pixel driving circuit further comprises an energy storage circuit, a data writing-in circuit, a compensation control circuit, a first initialization circuit and a second initialization circuit; wherein the energy storage circuit is electrically connected to the control terminal of the driving circuit and is configured to store electric energy;

the data writing-in circuit is electrically connected to a scanning line, a data line and the first terminal of the driving circuit, and is configured to control to write a data voltage on the data line into the first terminal of the driving circuit under the control of a scanning signal provided by the scanning line;

the compensation control circuit is electrically connected to the scanning line, the control terminal of the driving circuit, and the second terminal of the driving circuit, and is configured to control to connect the control terminal of the driving circuit and the second terminal of the driving circuit under the control of the scanning signal;

the first initialization circuit is electrically connected to a first initial control line, a first initial voltage line, and the control terminal of the driving circuit, and is configured to write a first initial voltage provided by the first initial voltage line into the control terminal of the driving circuit under the control of a first initial control signal provided by the first initial control line;

the second initialization circuit is electrically connected to a second initial control line, a second initial voltage line and the first electrode of the light emitting element respectively, and is configured to write a second initial voltage provided by the second initial voltage line into the first electrode of the light emitting element under the control of a second initial control signal provided by the second initial control line.

17. A pixel driving circuit for driving a light emitting element, wherein the pixel driving circuit comprises a driving circuit and a reset circuit;

the reset circuit is electrically connected to a first terminal of the driving circuit or a second terminal of the driving circuit, and is configured to initialize a potential of the first terminal of the driving circuit or a potential of the second terminal of the driving circuit in an initialization phase;

the driving circuit is configured to control connection between the first terminal of the driving circuit and the second terminal of the driving circuit under the control of a potential of a control terminal of the driving circuit;

wherein the pixel driving circuit further comprises a data writing-in circuit, an energy storage circuit, a compensation control circuit, a first initialization circuit, a second initialization circuit and a setting circuit; wherein the compensation control circuit is electrically connected to a first scanning line, the control terminal of the driving circuit and the second terminal of the driving circuit respectively, is configured to control to connect the control terminal of the driving circuit and the second terminal of the driving circuit under the control of a first scanning signal provided by the first scanning line;

a first terminal of the energy storage circuit is electrically connected to the control terminal of the driving circuit, a second terminal of the energy storage circuit is electrically connected to a control node, and the energy storage circuit is configured to store electric energy;

the data writing-in circuit is respectively electrically connected to a second scanning line, a data line and the control node, and is configured to write a data voltage on the data line into the control node under the control of a second scanning signal provided by the second scanning line;

the first initialization circuit is electrically connected to a first initial control line, a first initial voltage line, and the control terminal of the driving circuit, and is configured to write a first initial voltage provided by the first initial voltage line into the control terminal of the driving circuit under the control of a first initial control signal provided by the first initial control line;

the second initialization circuit is electrically connected to a second initial control line, a second initial voltage line and the control node respectively, and is configured to write a second initial voltage provided by the second initial voltage line into the control node under the control of a second initial control signal provided by the second initial control line;

the setting circuit is respectively electrically connected to a second light emitting control line, the second initial voltage line and the control node, and is configured to write a second initial voltage into the control node under the control of a second light emitting control signal provided by the second light emitting control line.

* * * * *